United States Patent
Aoki

(10) Patent No.: US 10,499,000 B2
(45) Date of Patent: *Dec. 3, 2019

(54) IMAGE SENSOR, ELECTRONIC DEVICE, CONTROL DEVICE, CONTROL METHOD, AND PROGRAM

(71) Applicant: Sony Corporation, Tokyo (JP)

(72) Inventor: Takeshi Aoki, Kanagawa (JP)

(73) Assignee: Sony Corporation, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 16/285,794

(22) Filed: Feb. 26, 2019

(65) Prior Publication Data

US 2019/0191118 A1 Jun. 20, 2019

Related U.S. Application Data

(63) Continuation of application No. 15/852,145, filed on Dec. 22, 2017, now Pat. No. 10,264,203, which is a
(Continued)

(30) Foreign Application Priority Data

Dec. 22, 2015 (JP) ................ 2015-249785

(51) Int. Cl.
| | |
|---|---|
| H04N 5/378 | (2011.01) |
| H04N 5/357 | (2011.01) |
| H04N 5/374 | (2011.01) |
| H01L 27/146 | (2006.01) |
| H01L 27/02 | (2006.01) |
| H01L 29/423 | (2006.01) |

(Continued)

(52) U.S. Cl.
CPC ......... *H04N 5/378* (2013.01); *H01L 27/0207* (2013.01); *H01L 27/088* (2013.01);
(Continued)

(58) Field of Classification Search
CPC ........ H04N 5/378; H04N 5/357; H04N 5/374; H01L 27/14636; H01L 27/0207;
(Continued)

(56) References Cited

U.S. PATENT DOCUMENTS

| | | |
|---|---|---|
| 6,788,237 B1 | 9/2004 | Bidermann et al. |
| 2008/0284885 A1 | 11/2008 | Taura |

(Continued)

FOREIGN PATENT DOCUMENTS

| | | |
|---|---|---|
| JP | 2008-288953 A | 11/2008 |
| JP | 2014-023065 A | 2/2014 |
| WO | WO 2011/030391 A1 | 3/2011 |

OTHER PUBLICATIONS

U.S. Appl. No. 15/578,344, filed Nov. 30, 2017, Aoki.
(Continued)

*Primary Examiner* — Nhan T Tran

(74) *Attorney, Agent, or Firm* — Wolf, Greenfield & Sacks, P.C.

(57) ABSTRACT

The present technology relates to an image sensor capable of achieving both higher S/N and higher frame rate, an electronic device, a control device, a control method, and a program.

An AD converter has a comparator in which differential pairs are provided at an input stage. The differential pairs have a plurality of transistors as first transistors and second transistors paired to configure the differential pairs. The AD converter compares a level-changing reference signal with an electric signal output by a shooting unit for performing photoelectric conversion and outputting the electric signal, thereby performing AD conversion on the electric signal. The comparator is controlled such that a transistor to be operated is selected as active transistor from among the transistors depending on the amount of light incident in the shooting unit and the active transistor operates. The present technology is applicable to an image sensor for shooting an image, and the like, for example.

41 Claims, 30 Drawing Sheets

Related U.S. Application Data continuation of application No. 15/578,344, filed as application No. PCT/JP2016/086481 on Dec. 8, 2016.

(51) Int. Cl.
| | |
|---|---|
| *H01L 27/088* | (2006.01) |
| *H03M 1/56* | (2006.01) |
| *H01L 29/06* | (2006.01) |
| *H01L 29/49* | (2006.01) |
| *H03M 1/12* | (2006.01) |

(52) U.S. Cl.
CPC .. *H01L 27/14614* (2013.01); *H01L 27/14636* (2013.01); *H01L 27/14643* (2013.01); *H01L 29/42364* (2013.01); *H04N 5/357* (2013.01); *H04N 5/374* (2013.01); *H01L 29/0649* (2013.01); *H01L 29/4916* (2013.01); *H03M 1/123* (2013.01); *H03M 1/56* (2013.01)

(58) Field of Classification Search
CPC ......... H01L 29/42364; H01L 27/14643; H01L 27/14614; H01L 29/0649; H01L 29/4916; H03M 1/56; H03M 1/123
See application file for complete search history.

(56) References Cited

U.S. PATENT DOCUMENTS

| | | | | |
|---|---|---|---|---|
| 2009/0128676 | A1* | 5/2009 | Tanaka | H04N 5/335 348/300 |
| 2011/0254986 | A1* | 10/2011 | Nishimura | H01L 27/146 348/302 |
| 2012/0194716 | A1* | 8/2012 | Hagihara | H04N 5/3658 348/300 |
| 2013/0154705 | A1* | 6/2013 | Sakurai | H03K 3/86 327/179 |
| 2014/0022430 | A1 | 1/2014 | Ueno et al. | |
| 2014/0293104 | A1* | 10/2014 | Tanaka | H04N 5/3745 348/301 |
| 2015/0138411 | A1* | 5/2015 | Nakamura | H03K 5/249 348/300 |
| 2015/0249797 | A1* | 9/2015 | Yui | H04N 5/3575 250/208.1 |
| 2016/0006969 | A1* | 1/2016 | Matsumoto | H04N 5/357 348/308 |
| 2016/0301886 | A1 | 10/2016 | Muto et al. | |
| 2018/0124345 | A1 | 5/2018 | Aoki | |
| 2018/0160065 | A1 | 6/2018 | Aoki | |

OTHER PUBLICATIONS

U.S. Appl. No. 15/852,145, filed Dec. 22, 2017, Aoki.
International Search Report and English translation thereof dated Feb. 21, 2017 in connection with International Application No. PCT/JP2016/086481.
Written Opinion and English translation thereof dated Feb. 21, 2017 in connection with International Application No. PCT/JP2016/086481.
International Preliminary Report on Patentability and English translation thereof dated Jul. 5, 2018 in connection with International Application No. PCT/JP2016/086481.

* cited by examiner

| Tr SIZE | WL LARGE | WL SMALL |
|---|---|---|
| Vth VARIATION ($\sigma$Vth) | LOW | HIGH |
| TIME CONSTANT ($\tau$) | HIGH | LOW |

FIG. 18

| TECHNICAL NODE | 180 nm | 130 nm | 100 nm |
|---|---|---|---|
| OXIDE FILM'S CONVERTED FILM THICKNESS (nm) OF LOGIC GATE INSULATIVE FILM ±3σ PROCESS PERMITTED VARIATION RANGE | 1.9~2.5 ±4% | 1.5~1.9 ±4% | 1.0~1.5 ±4% |

FIG. 19

| AMOUNT OF LIGHT | SMALL-FILM-THICKNESS Tr | | | | | | MIDDLE-FILM-THICKNESS Tr | | | | | | LARGE-FILM-THICKNESS Tr | | | | | |
|---|---|---|---|---|---|---|---|---|---|---|---|---|---|---|---|---|---|---|
| | Tox1 | Tr1 | Tox1 | Tr2 | Tox1 | Tr3 | Tox2 | Tr1 | Tox2 | Tr2 | Tox2 | Tr3 | Tox3 | Tr1 | Tox3 | Tr2 | Tox3 | Tr3 |
| 0 | ON | ON | ON | OFF | OFF | OFF | OFF | OFF | OFF | OFF | OFF | OFF |
| 1 | ON | ON | ON | OFF | OFF | OFF | OFF | OFF | OFF | OFF | OFF | OFF |
| 2 | ON | ON | OFF | OFF | OFF | OFF | OFF | OFF | OFF | OFF | OFF | OFF |
| ... | ... | ... | ... | ... | ... | ... | ... | ... | ... | ... | ... | ... |
| 50 | OFF | OFF | OFF | ON | ON | ON | OFF | OFF | OFF | OFF | OFF | OFF |
| 51 | OFF | OFF | OFF | ON | ON | ON | OFF | OFF | OFF | OFF | OFF | OFF |
| 52 | OFF | OFF | OFF | ON | ON | ON | OFF | OFF | OFF | OFF | OFF | OFF |
| ... | ... | ... | ... | ... | ... | ... | ... | ... | ... | ... | ... | ... |
| 99 | OFF | OFF | OFF | OFF | OFF | OFF | OFF | OFF | OFF | ON | ON | OFF |
| 100 | OFF | OFF | OFF | OFF | OFF | OFF | OFF | OFF | OFF | ON | ON | OFF |

SELECTION LUT

IMAGE SENSOR, ELECTRONIC DEVICE, CONTROL DEVICE, CONTROL METHOD, AND PROGRAM

CROSS REFERENCE TO RELATED APPLICATIONS

This application is a continuation of and claims the benefit under 35 U.S.C. § 120 of U.S. patent application Ser. No. 15/852,145, titled "IMAGE SENSOR, ELECTRONIC DEVICE, CONTROL DEVICE, CONTROL METHOD, AND PROGRAM," filed on Dec. 22, 2017, now U.S. Pat. No. 10,264,203, which is a continuation of and claims the benefit under 35 U.S.C. § 120 of U.S. patent application Ser. No. 15/578,344, titled "IMAGE SENSOR, ELECTRONIC DEVICE, CONTROL DEVICE, CONTROL METHOD, AND PROGRAM," filed on Nov. 30, 2017, now U.S. Pat. No. 10,334,198, which is the National Stage of International Application No. PCT/JP2016/086481, filed in the Japanese Patent Office as a Receiving Office on Dec. 8, 2016, which claims the priority benefit of Japanese Patent Application Number JP 2015-249785, filed in the Japanese Patent Office on Dec. 22, 2015. Each of these applications is hereby incorporated by reference in its entirety.

TECHNICAL FIELD

The present technology relates to an image sensor, an electronic device, a control device, a control method, and a program, and particularly to an image sensor capable of achieving both higher S/N and higher frame rate, for example, an electronic device, a control device, a control method, and a program.

BACKGROUND ART

A complementary metal oxide semiconductor (CMOS) image sensor is paid attention to as image sensor for shooting images at the request of downsizing and the like.

A CMOS image sensor has an AD converter for performing analog to digital (AD) conversion on an analog electric signal output by a pixel for performing photoelectric conversion. The AD converter has a comparator and a counter, and compares a predetermined reference signal with an electric signal output by a pixel thereby to AD-convert the electric signal.

A plurality of AD converters, each of which corresponds to each column or the like of pixels, for example, are arranged in line, and the electric signals output by one row of pixels are AD-converted in parallel (at the same time) in the CMOS image sensor.

In a case where a plurality of AD converters are arranged in line, a deterioration in crosstalk characteristics between a comparator configuring an AD converter and a comparator of its adjacent AD converter may cause a deterioration in image quality of an image obtained by the CMOS image sensor.

There is thus proposed a CMOS image sensor in which a first transistor and a second transistor, which are a pair of transistors configuring a differential pair of an input stage of a comparator, are divided into an equal number of divided transistors, respectively, and a plurality of divided transistors configuring a predetermined column of comparators and a plurality of divided transistors configuring a column of comparators adjacent to the predetermined column are arranged in different arrangement patterns thereby improving crosstalk characteristics without any adverse effect (see Patent Document 1, for example).

CITATION LIST

Patent Document

Patent Document 1: Japanese Patent Application Laid-Open No. 2014-023065

SUMMARY OF THE INVENTION

Problems to be Solved by the Invention

Incidentally, higher S/N and higher frame rate are in a tradeoff relationship in the CMOS image sensor described in Patent Document 1 and the like, and thus both higher S/N and higher frame rate are difficult to achieve.

The present technology has been made in terms of the situation, and is directed for achieving higher S/N and higher frame rate.

Solutions to Problems

An image sensor of the present technology includes: an AD converter having a comparator in which differential pairs having a plurality of transistors as first transistors and second transistors paired to configure the differential pairs are provided at an input stage, for performing analog to digital (AD) conversion on an electric signal by comparing a level-changing reference signal with the electric signal output by a shooting unit for performing photoelectric conversion and outputting the electric signal; and a control unit for performing control such that a transistor to be operated is selected as active transistor from among the transistors depending on the amount of light incident in the shooting unit, and the active transistor is operated.

An electronic device of the present technology includes: an optical system for focusing light; and an image sensor for receiving a light and shooting an image, in which the image sensor includes: an AD converter having a comparator in which differential pairs having a plurality of transistors as first transistors and second transistors paired to configure the differential pairs are provided at an input stage, for performing analog to digital (AD) conversion on an electric signal by comparing a level-changing reference signal with the electric signal output by a shooting unit for performing photoelectric conversion and outputting the electric signal; and a control unit for performing control such that a transistor to be operated is selected as active transistor from among the transistors depending on the amount of light incident in the shooting unit, and the active transistor is operated.

A control device or a program according to the present technology is a control device for performing control such that a transistor to be operated is selected as active transistor from among a plurality of transistors depending on the amount of light incident in a shooting unit and the active transistor is operated, for an image sensor including an AD converter having a comparator in which differential pairs having the transistors as first transistors and second transistors paired to configure the differential pairs are provided at an input stage, and directed for performing analog to digital (AD) conversion on an electric signal by comparing a level-changing reference signal with the electric signal output by the shooting unit for performing photoelectric conversion and outputting the electric signal, or a program for causing a computer to function as the control device.

A control method of the present technology is a control method including performing control such that a transistor to be operated is selected as active transistor from among the transistors depending on the amount of light incident in a shooting unit and the active transistor is operated, for an image sensor including an AD converter having a comparator in which differential pairs having a plurality of transistors as first transistors and second transistors paired to configure the differential pairs are provided at an input stage, for performing analog to digital (AD) conversion on an electric signal by comparing a level-changing reference signal with the electric signal output by the shooting unit for performing photoelectric conversion and outputting the electric signal.

In the image sensor, the electronic device, the control device, the control method, and the program according to the present technology, a transistor to be operated is selected as active transistor from among the transistors as first transistors and second transistors paired to configure differential pairs provided at the input stage of the comparator in the AD converter depending on the amount of light incident in the shooting unit, and the active transistor is controlled to operate.

Additionally, the image sensor or the control device may be an independent device or may be an internal block configuring one device.

Further, the program can be provided by being transmitted via a transmission medium or being recorded in a recording medium.

Effects of the Invention

According to the present technology, it is possible to achieve both higher S/N and higher frame rate.

Additionally, the effects described herein are not necessarily restrictive, and any of the effects described in the present disclosure may be obtained.

BRIEF DESCRIPTION OF DRAWINGS

FIG. 18 is a diagram for explaining accuracy of the gate oxide film thicknesses Tox.

FIG. 19 is a diagram illustrating an exemplary selection LUT stored in a LUT storage unit 312.

MODE FOR CARRYING OUT THE INVENTION

<One Embodiment of Camera Module to which Present Technology is Applied>

Figure 1:
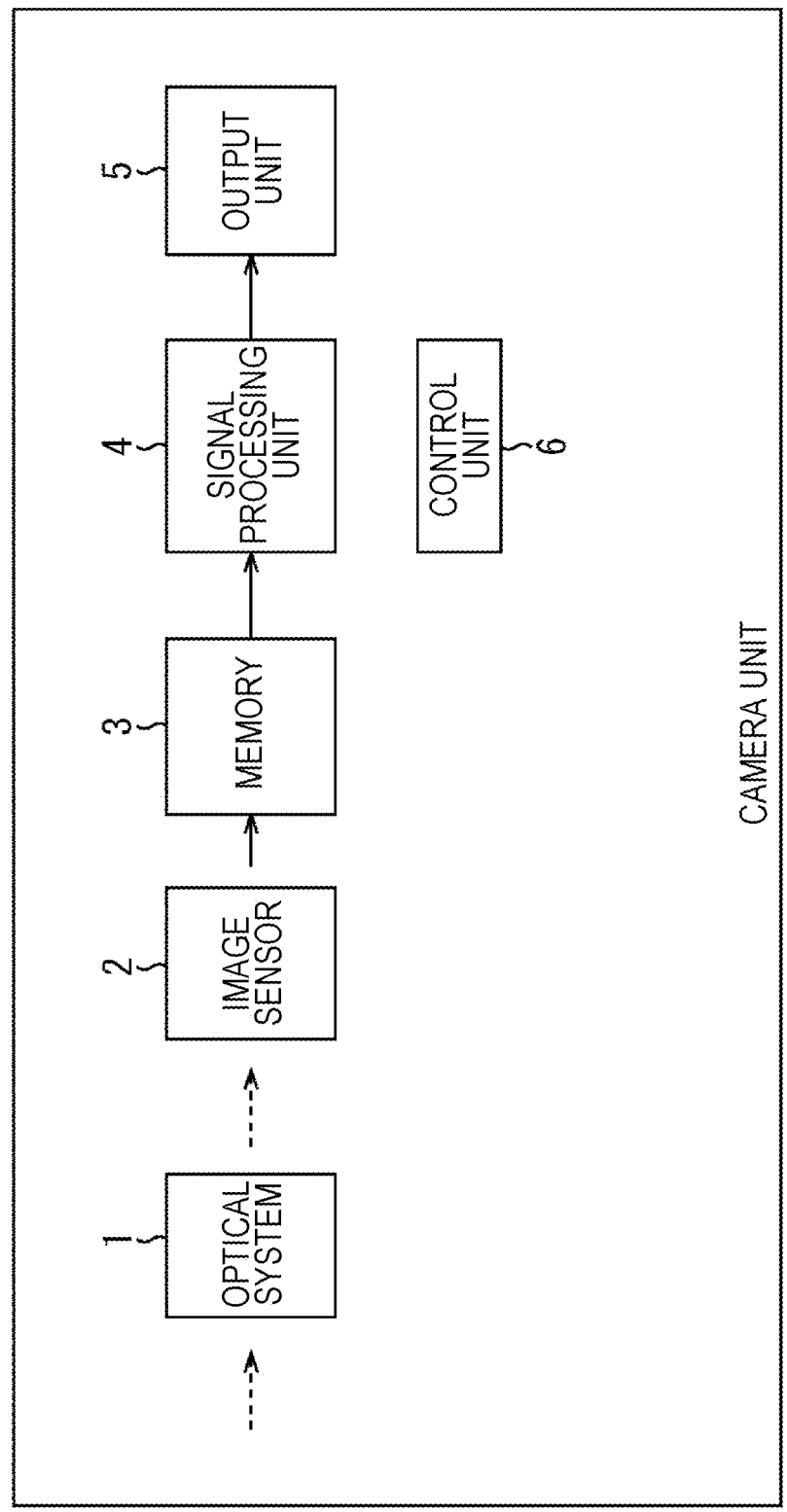
FIG. 1 is a block diagram illustrating an exemplary configuration of one embodiment of a camera module to which the present technology is applied.

FIG. 1 is a block diagram illustrating an exemplary configuration of one embodiment of a camera module to which the present technology is applied.

Additionally, the camera module can shoot both still images and moving images.

In FIG. 1, the camera module has an optical system 1, an image sensor 2, a memory 3, a signal processing unit 4, an output unit 5, and a control unit 6.

The optical system 1 has a zoom lens, focus lens, diaphragm, and the like (not illustrated), for example, and takes an external light into the image sensor 2.

The image sensor 2 is a CMOS image sensor, for example, receives an incident light from the optical system 1, performs photoelectric conversion, and outputs image data corresponding to the incident light from the optical system 1.

The memory 3 temporarily stores the image data output by the image sensor 2.

The signal processing unit 4 performs a processing such as noise cancellation or white balance adjustment as a signal processing using the image data stored in the memory 3, and supplies the image data to the output unit 5.

The output unit 5 outputs the image data from the signal processing unit 4.

That is, the output unit 5 has a display (not illustrated) made of liquid crystal or the like, for example, and displays an image corresponding to the image data from the signal processing unit 4 as through image.

Further, the output unit 5 has a driver (not illustrated) for driving a recording medium such as semiconductor memory, magnetic disc or optical disc, and records the image data from the signal processing unit 4 into the recording medium.

Furthermore, the output unit 5 has a communication interface for making predetermined communication, and transmits the image data from the signal processing unit 4 in a wired or wireless manner.

The control unit 6 controls each block configuring the camera module in response to a user operation or external instruction.

In the thus-configured camera module, the image sensor 2 receives an incident light from the optical system 1 and outputs image data depending on the incident light.

The image data output by the image sensor 2 is supplied and stored into the memory 3. The image data stored in the memory 3 is subjected to signal processing by the signal processing unit 4, and the resultant image data is supplied and output to the output unit 5.

<Exemplary Configuration of Image Sensor 2>

Figure 2:
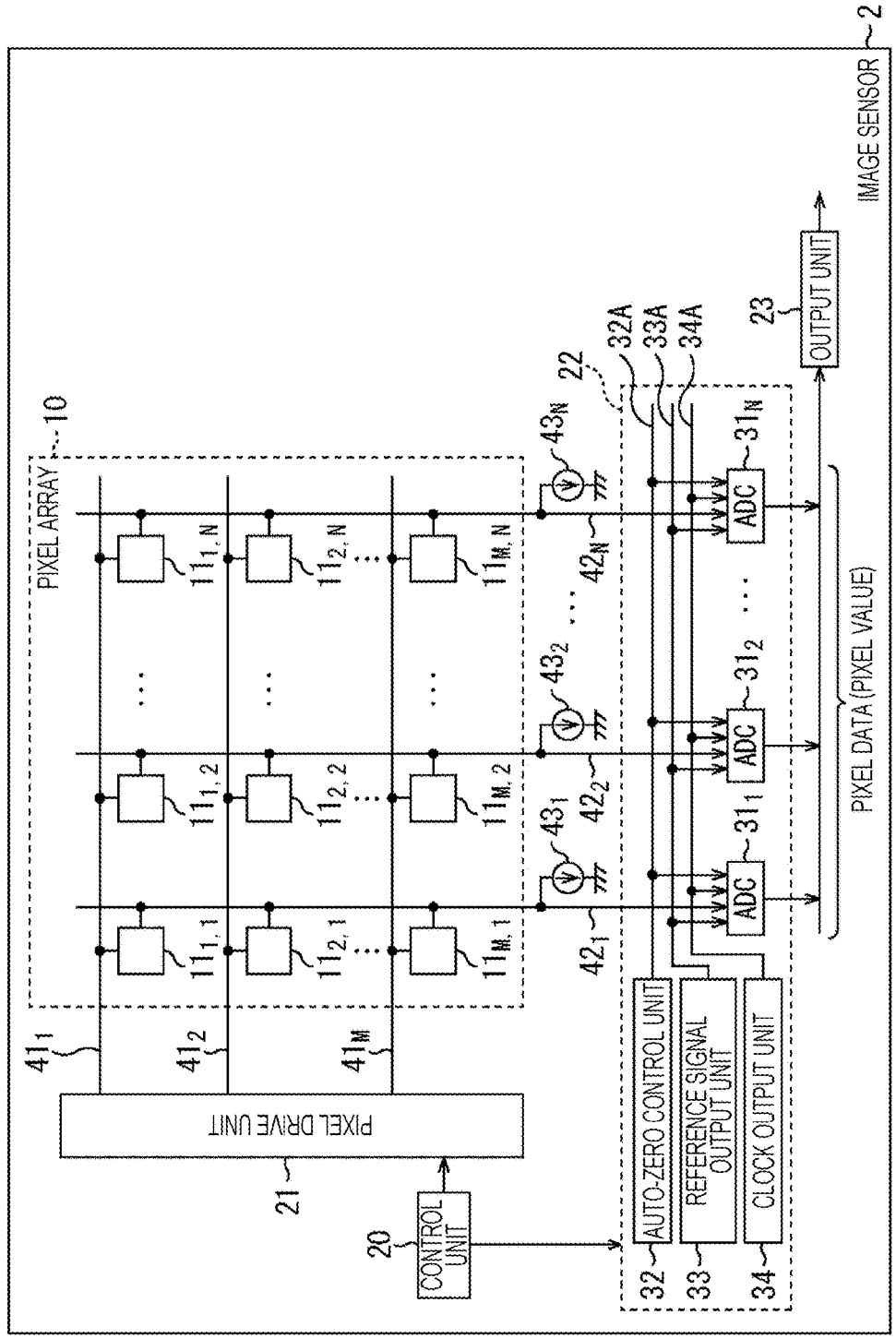
FIG. 2 is a block diagram illustrating an exemplary configuration of an image sensor 2.

FIG. 2 is a block diagram illustrating an exemplary configuration of the image sensor 2 of FIG. 1.

In FIG. 2, the image sensor 2 has a pixel array 10, a control unit 20, a pixel drive unit 21, a column parallel AD converter 22, and an output unit 23.

The pixel array 10 has M×N (M and N are integers of 1 or more) pixel units $11_{1,1}$, $11_{1,2}$, ..., $11_{1,N}$, $11_{2,1}$, $11_{2,2}$, ..., $11_{2,N}$, ..., $11_{M,1}$, $11_{M,2}$, ..., $11_{M,N}$ for performing photoelectric conversion, and functions as a shooting unit for shooting an image.

The M×N pixel units $11_{1,1}$ to $11_{M,N}$ are arranged in a matrix (lattice) shape of M rows by N columns on a 2D plane.

N pixel units $11_{m,1}$ to $11_{m,N}$ arranged in the row direction (horizontal direction) at the m-th row (m=1, 2, ..., M) (from the top) in the pixel array 10 are connected with a pixel control line $41_m$ extending in the row direction.

Further, M pixel units $11_{1,n}$ to $11_{m,n}$ arranged in the column direction (vertical direction) at the n-th column (n=1, 2, ..., N) (from the left) are connected with a vertical signal line (VSL) $42_n$ extending in the column direction.

A light from the optical system 1 is incident in a pixel unit $11_{m,n}$. The pixel unit $11_{m,n}$ performs photoelectric conversion on the incident light. Further, the pixel unit $11_{m,n}$ outputs a voltage (electric signal) corresponding to the charges obtained by photoelectric conversion onto the VSL $42_n$ connected with a current source $43_n$ under control via the pixel control line $41_m$ from the pixel drive unit 21.

Additionally, the pixel unit $11_{m,n}$ can perform photoelectric conversion on a light of predetermined color incident via a color filter (not illustrated) such as Bayer array.

The control unit 20 controls the pixel drive unit 21, (an auto-zero control unit 32, a reference signal output unit 33, and the like configuring) the column parallel AD converter 22, and other necessary blocks according to a predetermined logic or the like.

The pixel drive unit 21 controls (drives) the pixel units $11_{m,1}$ to $11_{m,N}$ connected to the pixel control line $41_m$ via the pixel control line $41_m$ under control of the control unit 20.

The column parallel AD converter 22 is connected to the pixel units $11_{m,1}$ to $11_{m,N}$ arranged in each row via the VSLs $42_1$ to $42_N$, respectively, and thus an electric signal (voltage) (which will be also called VSL voltage below) output onto the VSL $42_n$ by the pixel unit $11_{m,n}$ is supplied to the column parallel AD converter 22.

The column parallel AD converter 22 performs AD conversion on the VSL voltages supplied from the pixel units $11_{m,1}$ to $11_{m,N}$ arranged in a row via the VSLs $42_1$ to $42_N$ in parallel, and supplies the digital data obtained by the AD conversion as pixel values (pixel data) of the pixel units $11_{m,1}$ to $11_{m,N}$ to the output unit 23.

Here, the column parallel AD converter 22 can perform AD conversion on the electric signal of all the N pixel units $11_{m,1}$ to $11_{m,N}$ arranged in a row in parallel, and additionally can perform AD conversion on the electric signals of one or more and less than N pixel units among the N pixel units $11_{m,1}$ to $11_{m,N}$.

However, for simple description, the column parallel AD converter 22 is assumed below to perform AD conversion on the VSL voltage of all the N pixel units $11_{m,1}$ to $11_{m,N}$ arranged in a row in parallel.

The column parallel AD converter 22 has N analog to digital converters (ADC) (AD converters) $31_1$ to $31_N$ for performing AD conversion on the VSL voltage of all the N pixel units $11_{m,1}$ to $11_{m,N}$ arranged in a row in parallel.

Further, the column parallel AD converter 22 has the auto-zero control unit 32, the reference signal output unit 33, and a clock output unit 34.

The auto-zero control unit 32 supplies (outputs) an auto-zero pulse (auto-zero signal) as signal for controlling an auto-zero processing of the comparator $61_n$ in the ADC $31_n$ to the ADCs $31_1$ to $31_N$ via an auto-zero signal line 32A.

The reference signal output unit 33 is configured of a digital to analog converter (DAC), for example, and supplies (outputs) a reference signal having a period in which the level (voltage) changes from a predetermined initial value to a predetermined final value at a constant tilt like a ramp signal to the ADCs $31_1$ to $31_N$ via a reference signal line 33A.

The clock output unit 34 supplies (outputs) clocks with a predetermined frequency to the ADCs $31_1$ to $31_N$ via a clock signal line 34A.

The ADC $31_n$ is connected to the VSL $41_n$, and thus the ADC $31_n$ is supplied with the VSL voltage (electric signal) output from the pixel unit $1m, n$ onto the VSL $41_n$.

The ADC $31_n$ performs AD conversion on the VSL voltage output by the pixel unit $11_{m, n}$ by use of the reference signal from the reference signal output unit 33 and the clock from the clock output unit 34, and further performs correlated double sampling (CDS) thereby to find digital data as a pixel value.

Here, the ADC $31_n$ compares the VSL voltage of the pixel unit $11_{m, n}$ with the level-changing reference signal from the reference signal output unit 33, and counts a time required for the level change of the reference signal until the VSL voltage of the pixel unit $11_{m, n}$ matches with the level of the reference signal (until a magnitude relationship between the VSL voltage and the reference signal is reversed), thereby performing AD conversion on the VSL voltage of the pixel unit $11_{m, n}$.

The ADC $31_n$ counts the time required for the level change of the reference signal until the VSL voltage of the pixel unit $11_{m, n}$ matches with the level of the reference signal by counting clocks from the clock output unit 34.

Further, the N ADCs $31_1$ to $31_N$ are supplied with the VSL voltage of the N pixel units $11_{m, 1}$ to $11_{m, N}$ in the first to M-th rows in the pixel array 10 sequentially from the first row, for example, and perform AD conversion and CDS on the VSL voltage in units of row.

The output unit 23 selects a column n from which pixel values are to be read, and reads and outputs a result of the AD conversion (and CDS) of the pixel units $11_{m, n}$ found by the ADC $31_n$ from the ADC $31_n$ in the column n to the outside (the memory 3 (FIG. 1) in the present embodiment).

Additionally, the ADC $31_n$ is assumed herein to perform AD conversion and CDS, but it can be assumed that the ADC $31_n$ performs only AD conversion and the output unit 23 performs CDS.

Further, the description of CDS will be omitted below as needed.

<Exemplary Configuration of Pixel Unit $11_{m, n}$>

Figure 3:
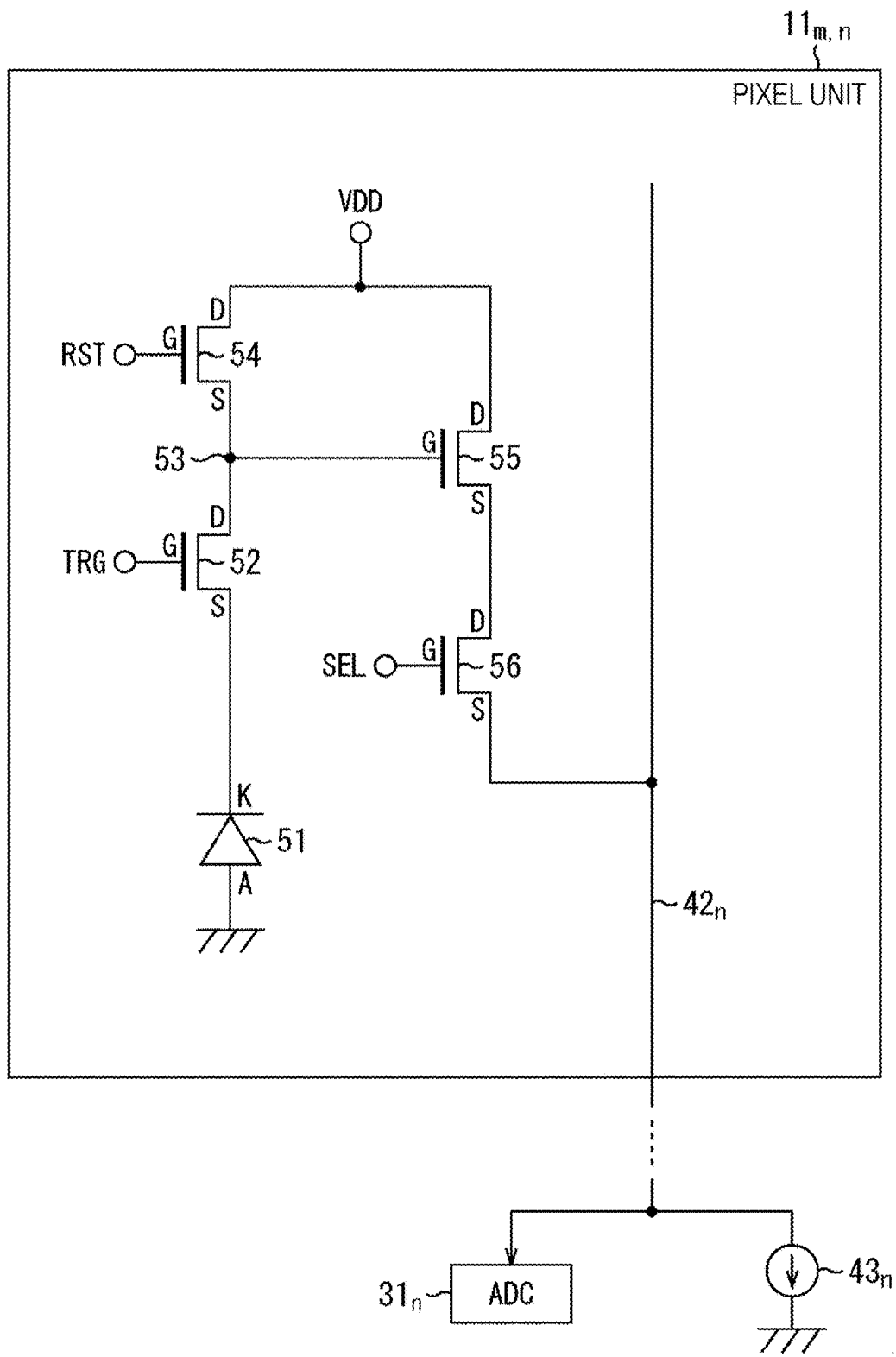
FIG. 3 is a circuit diagram illustrating an exemplary configuration of a pixel unit $11_{m,n}$.

FIG. 3 is a circuit diagram illustrating an exemplary configuration of a pixel unit $11_{m, n}$ of FIG. 2.

In FIG. 3, a pixel unit $11_{m, n}$ has a PD 51, and four negative channel (N-channel) MOS field effect transistors (FETs) 52, 54, 55, and 56.

Further, in the pixel unit $11_{m, n}$, floating diffusion (FD) (capacitance) 53 for converting a charge into a voltage is formed at a connection point where a drain of the FET 52, a source of the FET 54, and a gate of the FET 55 are connected.

The PD 51 is an exemplary photoelectric conversion device for performing photoelectric conversion and configures a pixel. The PD 51 as pixel receives an incident light and injects charges corresponding to the incident light thereby to perform photoelectric conversion.

The anode (A) of the PD 51 is connected to the ground (grounded), and the cathode (K) of the PD 51 is connected to a source of the FET 52.

The FET 52 is directed for transferring the charges injected by the PD 51 from the PD 51 to the FD 53, and will be also called transfer Tr 52 below.

The source of the transfer Tr 52 is connected to the cathode of the PD 51, and the drain of the transfer Tr 52 is connected to the source of the FET 54 via the FD 53.

Further, a gate of the transfer Tr 52 is connected to the pixel control line $41_m$, and the gate of the transfer Tr 52 is supplied with a transfer pulse TRG via the pixel control line $41_m$.

Here, the pixel drive unit 21 (FIG. 2) flows control signals such as reset pulse RST and selection pulse SEL described below in addition to transfer pulse TRG to the pixel control lines $41_m$ in order to drive (control) the pixel units $11_{m, n}$ via the pixel control lines $41_m$.

The FD 53 is a region for converting a charge into a voltage like a capacitor, which is formed at the connection point of the drain of the transfer Tr 52, the source of the FET 54, and the gate of the FET 55.

The FET 54 is directed for resetting the charges (voltage (potential)) injected in the FD 53, and will be also called reset Tr 54 below.

A drain of the reset Tr 54 is connected to a power supply VDD.

Further, a gate of the reset Tr 54 is connected to the pixel control line $41_m$, and the gate of the reset Tr 54 is supplied with the reset pulse RST via the pixel control line $41_m$.

The FET 55 is directed for buffering the voltage of the FD 53, and will be also called amplification Tr 55 below.

The gate of the amplification Tr 55 is connected to the FD 53, and a drain of the amplification Tr 55 is connected to the power supply VDD. Further, a source of the amplification Tr 55 is connected to a drain of the FET 56.

The FET 56 is directed for selecting the output of the electric signal (VSL voltage) to the VSL $42_n$, and will be also called selection Tr 56 below.

A source of the selection Tr 56 is connected to the VSL $42_n$.

Further, a gate of the selection Tr 56 is connected to the pixel control line $41m$, and the gate of the selection Tr 56 is supplied with the selection pulse SEL via the pixel control line $41_m$.

Here, the source of the amplification Tr 55 is connected to the current source $43_n$ via the selection Tr 56 and the VSL $42_n$ so that (a circuit of) a source follower (SF) is configured of the amplification Tr 55 and the current source $43_n$ and thus the voltage of the FD 53 is to be the VSL voltage of the VSL $42_n$ via the SF.

Additionally, the pixel unit $11_{m, n}$ can be configured without the selection Tr 56.

Further, the pixel unit $11_{m, n}$ can be in a sharing pixel configuration in which the FD 53 and the reset Tr 54 to the selection Tr 56 are shared by a plurality of PDs 51 as pixels and transfer Tr 52.

In the thus-configured pixel unit $11_{m, n}$, the PD 51 receives a light incident therein (incident light) and performs photoelectric conversion thereby to start injecting the charges dependingon the amount of receivedincident light. Additionally, for simple description, the selection pulse SEL is assumed at H level and the selection Tr 56 is assumed in ON state.

When a predetermined time (exposure time) elapses after the charges start being injected by the PD 51, the pixel drive unit 21 (FIG. 2) temporarily sets the transfer pulse TRG (from Low (L) level) to High (H) level.

The transfer pulse TRG is temporarily set at H level, and thus the transfer Tr 52 temporarily enters ON state.

When the transfer Tr 52 enters ON state, the charges injected by the PD 51 are transferred and injected to the FD 53 via the transfer Tr 52.

The pixel drive unit 21 temporarily sets the reset pulse RST at H level before temporarily setting the transfer pulse TRG at H level, thereby temporarily setting the reset Tr 54 in ON state.

The reset Tr 54 enters ON state so that the FD 53 is connected to the power supply VDD via the reset Tr 54 and the charges in the FD 53 are swept to the power supply VDD via the reset Tr 54.

Here, resetting the pixel unit $11_{m,n}$ means that the FD 53 is connected to the power supply VDD and the charges in the FD 53 are reset as described above.

After the charges in the FD 53 are reset, the pixel drive unit 21 temporarily sets the transfer pulse TRG at H level as described above, and thus the transfer Tr 52 temporarily enters ON state.

The transfer Tr 52 enters ON state so that the charges injected by the PD 51 are transferred and injected to the reset FD 53 via the transfer Tr 52.

A voltage (potential) corresponding to the charges injected in the FD 53 is output as VSL voltage onto the VSL $42_n$ via the amplification Tr 55 and the selection Tr 56.

The ADC $31_n$ (FIG. 2) connected to the VSL $42_n$ performs AD conversion on the reset level of the VSL voltage immediately after the pixel unit $11_{m,n}$ is reset.

Further, the ADC $31_n$ performs AD conversion on the signal levels (including the reset level and the level for pixel value) of the VSL voltage (voltage corresponding to the charges injected by the PD 51 and transferred to the FD 53) after the transfer Tr 52 temporarily enters ON state.

The ADC $31_n$ then performs CDS for finding a difference between the reset level AD conversion result (which will be also called reset level AD value below) and the signal level AD conversion result (which will be also called signal level AD value below) as pixel value.

<Exemplary configuration of ADC $31_n$>

Figure 4:
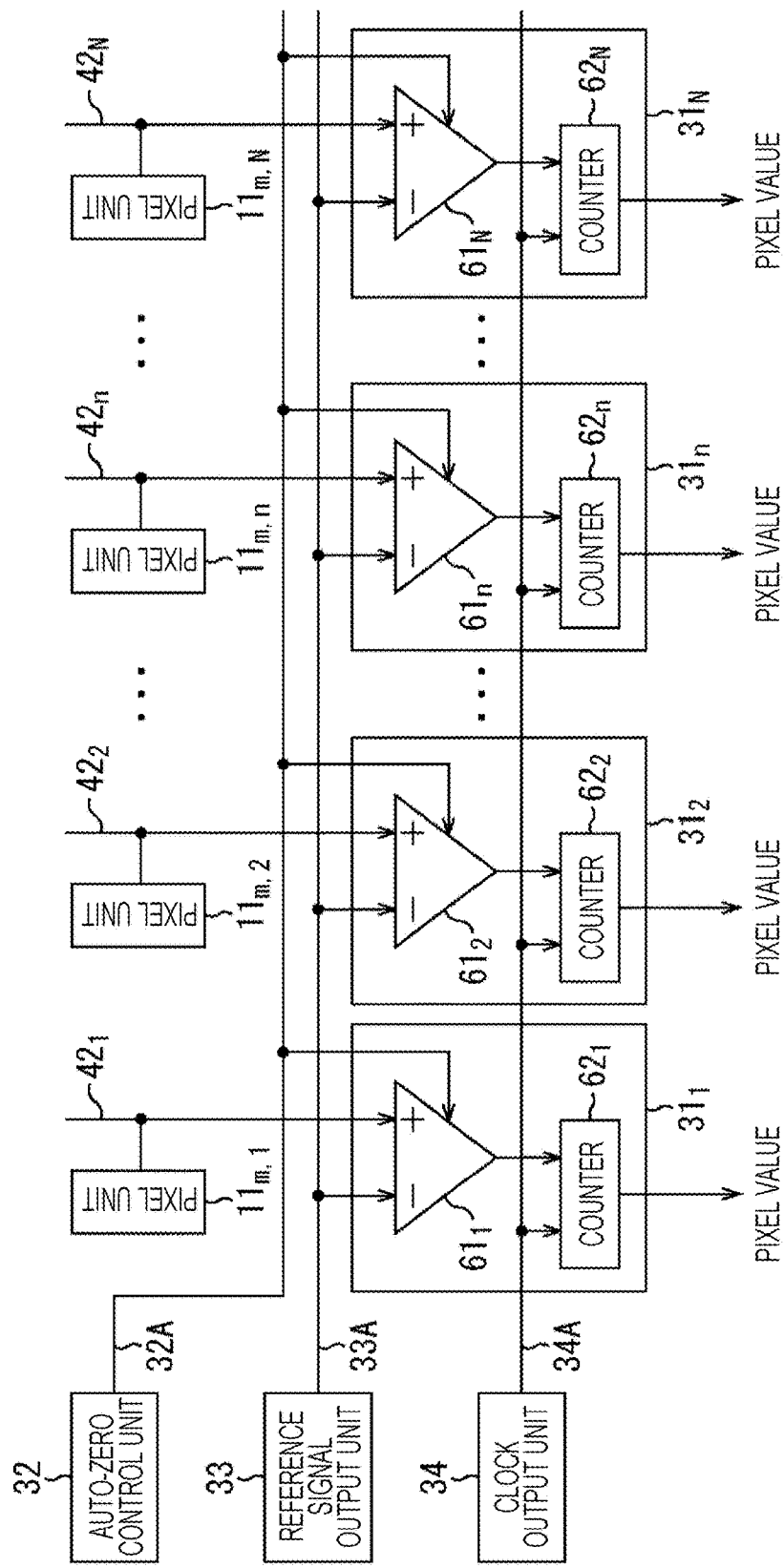
FIG. 4 is a block diagram illustrating an exemplary configuration of an ADC $31_n$.

FIG. 4 is a block diagram illustrating an exemplary configuration of an ADC $31_n$ of FIG. 2.

An ADC $31_n$ has a comparator $61_n$ and a counter $62_n$, and performs single-slope AD conversion and CDS.

The comparator $61_n$ has two input terminals of inverting input terminal (−) and non-inverting input terminal (+).

The inverting input terminal (−) as one of the two input terminals of the comparator $61_n$ is supplied with one of the reference signal from the reference signal output unit 33 and the VSL voltage (reset level, signal level) of the pixel unit $11_{m,n}$, for example, the reference signal. The non-inverting input terminal (+) as the other of the two input terminals of the comparator $61_n$ is supplied with the other of the reference signal from the reference signal output unit 33 and the VSL voltage of the pixel unit $11_{m,n}$, for example, the VSL voltage.

The comparator $61_n$ compares the reference signal supplied to the inverting input terminal with the VSL voltage supplied to the non-inverting input terminal and outputs the comparison result.

That is, the comparator $61_n$ outputs one of H and L levels, for example, L level in a case where the reference signal supplied to the inverting input terminal is higher than the VSL voltage supplied to the non-inverting input terminal.

Further, the comparator $61_n$ outputs the other of H and L levels, for example, H level in a case where the VSL voltage supplied to the non-inverting input terminal is higher than the voltage of the reference signal supplied to the inverting input terminal.

Additionally, the comparator $61_n$ is supplied with the auto-zero pulse from the auto-zero control unit 32 via the auto-zero signal line 32A. The comparator $61_n$ performs the auto-zero processing according to the auto-zero pulse from the auto-zero control unit 32.

Here, in the auto-zero processing, the comparator $61_n$ is set to obtain a comparison result that the two input signals actually given to the comparator $61_n$, or the signal actually supplied to the inverting input terminal of the comparator $61_n$ and the signal actually supplied to the non-inverting input terminal match with each other.

The counter $62_n$ is supplied with the output of the comparator $61_n$ and the clocks from the clock output unit 34.

The counter $62_n$ starts counting clocks from the clock output unit 34 when (the level of) the reference signal supplied from the reference signal output unit 33 to the comparator $61_n$ starts changing, for example, and finishes counting the clocks from the clock output unit 34 when the output of the comparator $61_n$ changes from L level to H level, for example, or the reference signal supplied to the inverting input terminal of the comparator $61_n$ is equal to the level of the VSL voltage supplied to the non-inverting input terminal (the magnitude relationship between the reference signal and the VSL voltage is reversed).

The counter $62_n$ then outputs the count value of the clocks as an AD conversion result of the VSL voltage supplied to the non-inverting input terminal of the comparator $61_n$.

Here, the reference signal output unit 33 outputs, as a reference signal, a signal with a slope (slope-shaped waveform) at which the voltage decreases from a predetermined initial value to a predetermine final value at a constant rate, for example.

In this case, the counter $62_n$ counts a time until the reference signal changes to a voltage matching with the VSL voltage supplied to the non-inverting input terminal of the comparator $61_n$ after the start of the slope, and the count value obtained by the counting is assumed as an AD conversion result of the VSL voltage supplied to the non-inverting input terminal of the comparator $61_n$.

The ADC $31_n$ obtains the AD conversion results of the reset level and the signal level for the VSL voltage supplied to the non-inverting input terminal of the comparator $61_n$ from the pixel unit $11_{m,n}$. The ADC $31_n$ then performs CDS for finding a difference between the signal level AD conversion result (signal level AD value) and the reset level AD conversion result (reset level AD value), and outputs the difference obtained by the CDS as a pixel value of the pixel unit $11_{m,n}$.

Additionally, the ADC $31_n$ can perform CDS by actually making a calculation for finding a difference between the signal level AD value and the reset level AD value and additionally controlling the counter $62_n$ for counting clocks.

That is, the counter $62_n$ can perform AD conversion on the reset level and the signal level and can perform CDS for finding a difference between (the AD conversion result of) the signal level and (the AD conversion result of) the reset level by counting clocks while decrementing the count value, for example, for the reset level and counting clocks while incrementing the count value for the signal level contrary to the reset level with the count value of the clocks for the reset level as initial value.

Further, the present embodiment employs a ramp signal with a slope decreasing at a constant rate as a reference signal, and can additionally employ a ramp signal or the like with a slope increasing at a constant rate, for example, as a reference signal.

<Exemplary Configuration of Comparator $61_n$>

Figure 5:
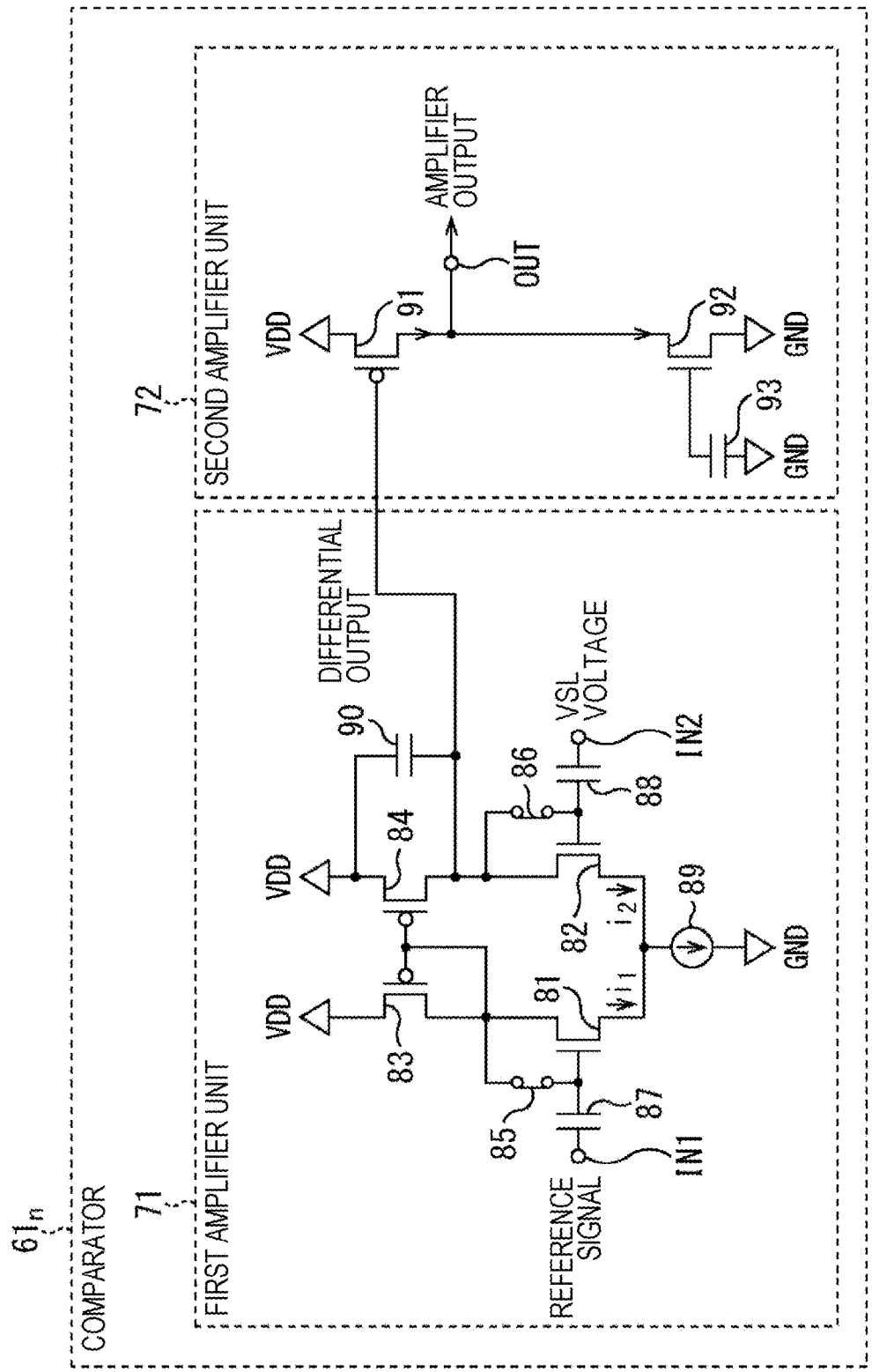
FIG. 5 is a block diagram illustrating an exemplary configuration of a comparator $61_n$.

FIG. 5 is a block diagram illustrating an exemplary configuration of a comparator $61_n$ of FIG. 4.

A comparator $61_n$ has a first amplifier unit 71 and a second amplifier unit 72.

The first amplifier unit 71 is supplied with the reference signal and the VSL voltage.

The first amplifier unit 71 outputs a comparison result signal indicating a comparison result of the two signals supplied thereto, or the reference signal and the VSL voltage as differential output to the second amplifier unit 72. That is, the first amplifier unit 71 outputs a signal corresponding to the difference between the reference signal and the VSL voltage as differential output.

The second amplifier unit 72 functions as a buffer for buffering differential output in order for the first amplifier unit 71 to output the differential output (comparison result signal) to a subsequent circuit at an appropriate level.

That is, the second amplifier unit 72 amplifies the differential output (comparison result signal) output by the first amplifier unit 71 by a predetermined gain, and outputs the signal obtained by the amplification as amplifier output.

The amplifier output of the second amplifier unit 72 is supplied to the counter $62_n$ (FIG. 4) as a final output signal of the comparator $61_n$ indicating the comparison result of the reference signal and the VSL voltage.

The counter $62_n$ counts clocks from the clock output unit 34 and finishes counting the clocks in response to the output of the comparator $61_n$ as described above. The counter $62_n$ then outputs the count value of the clocks as an AD conversion result of the VSL voltage supplied to (the first amplifier unit 71 in) the comparator $61_n$.

In FIG. 5, the first amplifier unit 71 has FETs 81, 82, 83, and 84, switches 85 and 86, capacitors 87 and 88, a current source 89, and a capacitor 90.

The FET 81 and the FET 82 are N-channel MOS FETs, and the sources thereof are connected to each other. Further, the connection point between the sources of the FET 81 and the FET 82 is connected to one end of the current source 89 which is grounded at the other end. The FET 81 and the FET 82 as well as the current source 89 configure a differential pair.

A gate of the FET 81 is connected to an inverting input terminal IN1 of the comparator $61_n$ (the first amplifier unit 71) via the capacitor 87, and a gate of the FET 82 is connected to a non-inverting input terminal IN2 of the comparator $61_n$ (the first amplifier unit 71) via the capacitor 88.

The comparator $61_n$ has a differential pair configured of the FET 81 and the FET 82 (as well as the current source 89) at its input stage as described above.

The FET 83 and the FET 84 are positive channel (P-channel) MOS FETs, and the gates thereof are connected to each other.

Further, the sources of the FET 83 and the FET 84 are connected to the power supply VDD, and the connection point between the gates of the FET 83 and the FET 84 is connected to a drain of the FET 83 and thus the FET 83 and FET 84 configure a current mirror.

The drain of the FET 83 out of the FET 83 and the FET 84 configuring the current mirror is connected to a drain of the FET 81, and a drain of the FET 84 is connected to a drain of the FET 82.

The connection point between the drains of the FET 82 and the FET 84 is then connected to one end of the capacitor 90 which is connected to the power supply VDD at the other end.

Further, the differential output as a comparison result signal indicating a comparison result of the reference signal and the VSL voltage, which are two input signals supplied to the first amplifier unit 71, is output from the connection point between the drains of the FET 82 and the FET 84. The differential output of the first amplifier unit 71 is supplied to a gate of a FET 91 described below in the second amplifier unit 72.

The switch 85 and the switch 86 are configured of FET or the like, for example, and are turned on or off in response to the auto-zero pulse supplied from the auto-zero control unit 32.

That is, the switch 85 is turned on or off to connect or disconnect the gate and the drain of the FET 81 in response to the auto-zero pulse. The switch 86 is turned on or off to connect or disconnect the gate and the drain of the FET 82 in response to the auto-zero pulse.

The capacitors 87 and 88 are used for the auto-zero processing.

The capacitor 87 is connected at one end to the gate of the FET 81 in the first amplifier unit 71, and is connected at the other end to the inverting input terminal IN1(−) of the comparator $61_n$.

The capacitor 88 is connected at one end to the gate of the FET 82 in the first amplifier unit 71, and is connected at the other end to the non-inverting input terminal IN2 (+) of the comparator $61_n$.

The capacitors 87 and 88 inject the charges such that the signal supplied to the gate of the FET 81 via the capacitor 87 takes the same voltage as the signal supplied to the gate of the FET 82 via the capacitor 88 in the auto-zero processing.

The capacitor 87 then offsets the signal (reference signal) supplied from the inverting input terminal IN1 by the voltage corresponding to the charges injected at the time of the auto-zero processing, and supplies the offset signal to the gate of the FET 81. The capacitor 88 similarly offsets the signal (VSL voltage) supplied from the non-inverting input terminal IN2 by the voltage corresponding to the charges injected at the time of the auto-zero processing and supplies the offset signal to the gate of the FET 82.

The second amplifier unit 72 has FETs 91 and 92, and a capacitor 93.

The FET 91 is a P-channel MOS FET, and the gate thereof is supplied with the differential output of the first amplifier unit 71. A source of the FET 91 is connected to the power supply VDD and a drain thereof is connected to a drain of the FET 92.

The FET 92 is an N-channel MOS FET, and functions as a current source. A gate of the FET 92 is connected to one end of the capacitor 93 which is grounded at the other end, and a source thereof is grounded.

The capacitor 93 is connected at one end to the gate of the FET 92, and is grounded at the other end.

Additionally, a connection point between the drain of the FET 91 and the drain of the FET 92 is connected to an output terminal OUT of the second amplifier unit 72, and the voltage of the connection point between the drain of the FET 91 and the drain of the FET 92 is output as amplifier output from the output terminal OUT.

In the thus-configured comparator $61_n$, a current $i_1$ corresponding to the gate voltage of the FET 81 flows (from the drain to the source) in the FET 81 in the first amplifier unit 71, and a current $i_2$ corresponding to the gate voltage of the FET 82 flows (from the drain to the source) in the FET 82.

Further, the same current as the current $i_1$ flowing in the FET 81 flows (from the source to the drain) in the FET 83 and the FET 84 configuring the current mirror.

In a case where the voltage applied to the gate of the FET 81 from the inverting input terminal IN1 via the capacitor 87 (the gate voltage of the FET 81) is larger than the voltage applied to the gate of the FET 82 from the non-inverting input terminal IN2 via the capacitor 88 (the gate voltage of the FET 82), the current $i_1$ flowing in the FET 81 is larger than the current $i_1$ flowing in the FET 82.

In this case, the same current as the current $i_1$ flowing in the FET 81 flows in the FET 84, but the current $i_2$ flowing in the FET 82 connected to the FET 84 is smaller than the current $i_1$, and thus the voltage between the drain and the source is large in the FET 82 in order to increase the current $i_2$.

Consequently, the differential output of the connection point between the FETs 82 and 84 enters L level.

On the other hand, in a case where the gate voltage of the FET 82 is larger than the gate voltage of the FET 81, the current $i_2$ flowing in the FET 82 is larger than the current it flowing in the FET 81.

In this case, the same current as the current $i_1$ flowing in the FET 81 flows in the FET 84, but the current $i_2$ flowing in the FET 82 connected to the FET 84 is larger than the current $i_1$, and thus the voltage between the drain and the source is small in the FET 82 in order to decrease the current $i_2$.

Consequently, the differential output of the connection point between the FETs 82 and 84 enters L level.

The differential output of the connection point between the FETs 82 and 84 obtained in the first amplifier unit 71 is supplied to the gate of the FET 91 in the second amplifier unit 72.

In the second amplifier unit 72, the FET 92 functions as a current source, and the FET 91 is turned off in a case where the differential output supplied to the gate of the FET 91 is at H level.

In a case where the FET 91 is off, the drain of the FET 91 enters L level, and thus the amplifier output of the output terminal OUT connected to the drain of the FET 91 enters L level.

On the other hand, in a case where the differential output supplied to the gate of the FET 91 is at L level, the FET 91 is turned on.

In a case where the FET 91 is on, the drain of the FET 91 enters H level, and thus the amplifier output of the output terminal OUT connected to the drain of the FET 91 enters H level.

From the above, in a case where the reference signal supplied to the inverting input terminal IN1 is higher in its voltage than the VSL voltage supplied to the non-inverting input terminal IN2, the differential output enters H level, and the amplifier output of the output terminal OUT, or the output of the comparator $61_n$ enters L level.

On the other hand, in a case where the VSL voltage supplied to the non-inverting input terminal IN2 is higher in its voltage than the reference signal supplied to the inverting input terminal IN1, the differential output enters L level, and the amplifier output of the output terminal OUT (the output of the comparator $61_n$) enters H level.

Here, the switches 85 and 86 are turned on or off in response to the auto-zero pulse.

The auto-zero pulse temporarily changes from L level to H level, for example, and the switches 85 and 86 enter OFF state when the auto-zero pulse is at L level, and enters ON state when the auto-zero pulse is at H level.

When the switches 85 and 86 enter ON state, the gate and the drain of the FET 81 are connected, and the gate and the drain of the FET 82 are connected so that the gate voltages of the FETs 81 and 82 are equal.

Therefore, when the auto-zero pulse enters H level, the charges are injected in the capacitors 87 and 88 such that the voltage applied to the gate of the FET 81 from the inverting input terminal IN1 via the capacitor 87 (the gate voltage of the FET 81) matches with the voltage applied to the gate of the FET 82 from the non-inverting input terminal IN2 via the capacitor (the gate voltage of the FET 82).

Then, when the auto-zero pulse enters L level, the gate and the drain of the FET 81 are disconnected, and the gate and the drain of the FET 82 are disconnected. The charges injected when the auto-zero pulse is at H level are then kept in the capacitors 87 and 88.

Consequently, (the first amplifier unit 71 in) the comparator $61_n$ is set to obtain a comparison result that the two input signals given to the comparator $61_n$ when the auto-zero pulse is at H level (when the auto-zero pulse falls), or the reference signal supplied to the inverting input terminal IN1 of the comparator $61_n$ and the VSL voltage supplied to the non-inverting input terminal IN2 match with each other.

The auto-zero processing is that the comparator $61_n$ is set as described above.

In the auto-zero processing, the first amplifier unit 71 or the comparator $61_n$ can determine a magnitude relationship between the voltage given to the inverting input terminal IN1 and the voltage given to the non-inverting input terminal IN2 assuming that the voltage given to the inverting input terminal IN1 of the comparator $61_n$ matches with the voltage given to the non-inverting input terminal IN2 during the auto-zero processing.

<Outline of Operations of Image Sensor 2>

Figure 6:
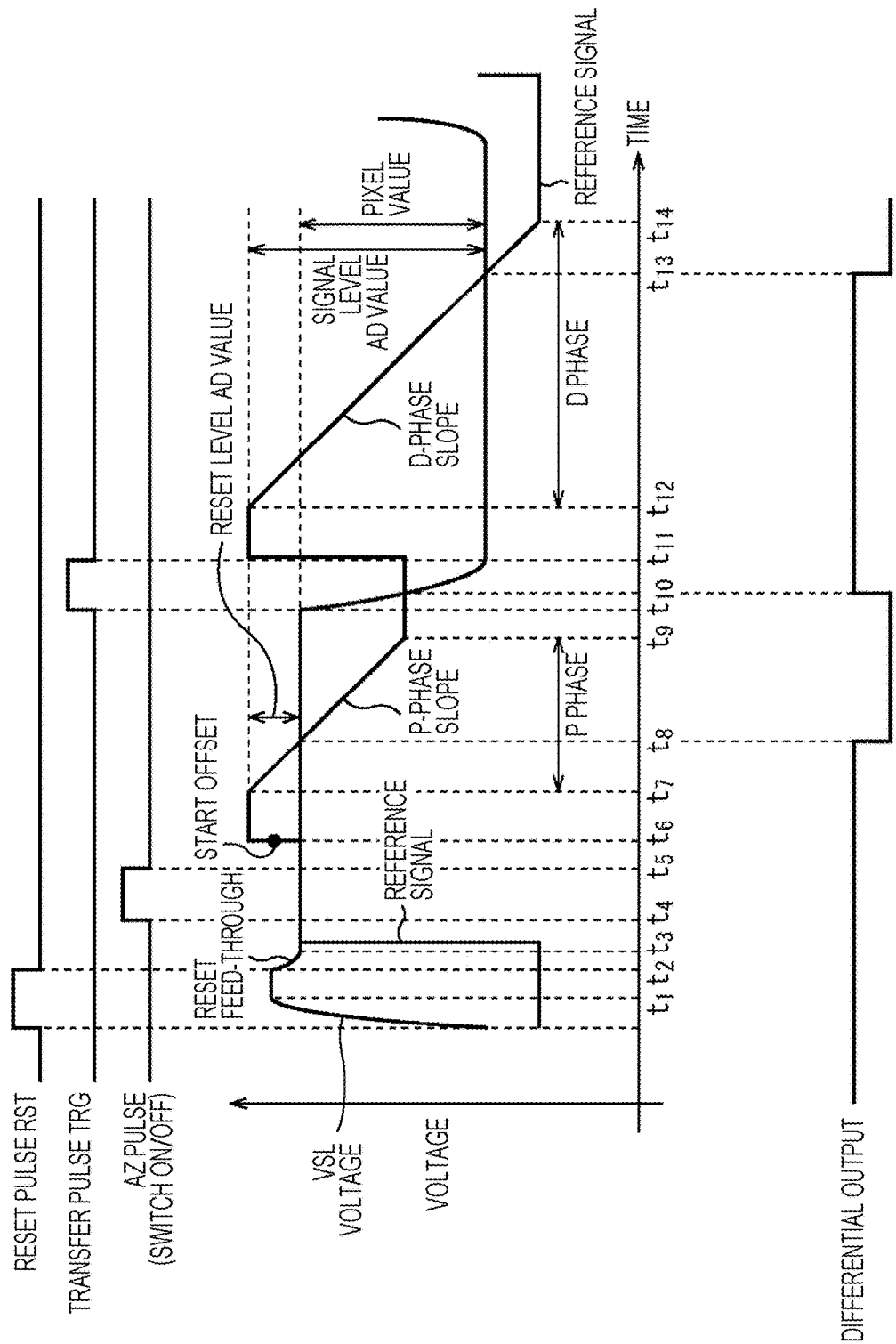
FIG. 6 is a diagram for explaining an outline of the operations of the image sensor 2.

FIG. 6 is a diagram for explaining an outline of the operations of the image sensor 2 (FIG. 2).

Additionally, the horizontal axis indicates time and the vertical axis indicates voltage in FIG. 6.

FIG. 6 is a waveform diagram illustrating the VSL voltage as an electric signal supplied from a pixel unit $11_{m,n}$ to the non-inverting input terminal IN2(+) of a comparator $61_n$ in an ADC $31_n$ via a VSL $42_n$ and (the voltage of) the reference signal supplied from the reference signal output unit 33 to the inverting input terminal IN1(−) of the comparator $61_n$ in the ADC $31_n$ via the reference signal line 33A in the image sensor 2 by way of example.

Additionally, FIG. 6 illustrates the transfer pulse TRG given to (the gate of) the transfer Tr 52 (FIG. 3), the reset pulse RST given to the reset Tr 54, the auto-zero pulse (AZ pulse) given to the switches 85 and 86 of the comparator $61_n$ (FIG. 5) from the auto-zero control unit 32, and the differential output of the comparator $61_n$ (the differential output of the first amplifier unit 72) in addition to the VSL voltage and the reference signal.

Further, in FIG. 6, the VSL voltage (is not a voltage of a VSL $42_n$ and) indicates a voltage applied to the gate of the FET 81 in a comparator $61_n$ (FIG. 5), and the reference signal (is not a voltage of the reference signal line 34A and) indicates a voltage applied to the gate of the FET 82 in the comparator $61_n$.

In the image sensor 2, the reset pulse RST is temporarily set at H level, and thus the pixel unit $11_{m,n}$ is reset.

The pixel unit $11_{m,n}$ is reset so that the FD 53 is connected to the power supply VDD via the reset Tr 54 and the charges in the FD 53 are reset, and thus the VSL voltage output by the pixel unit $11_{m,n}$, or the VSL voltage of the VSL $42_n$ output from the FD 53 via the amplification Tr 55 and the selection Tr 56 in the pixel unit $11_{m,n}$ increases to be a voltage corresponding to the power supply VDD at time $t_1$ as described in FIG. 3.

The VSL voltage is kept at the voltage corresponding to the power supply VDD while the FD 53 is being connected to the power supply VDD, and then the charges slightly move within the pixel unit $11_{m,n}$ when the reset pulse RST enters L level at time $t_2$ and a small amount of charges are injected in the FD 53, and consequently the VSL voltage slightly decreases.

In FIG. 6, the VSL voltage slightly decreases due to movement of the charges caused in the pixel unit 11$_{m, n}$ between time $t_2$ when the reset pulse RST enters L level and time $t_3$.

As described above, the decrease in the VSL voltage caused after the pixel unit 11$_{m, n}$ is reset is called reset feed-through.

After the pixel unit 11$_{m, n}$ is reset, the auto-zero pulse is set from L level to H level in the auto-zero control unit 32, and thus the auto-zero processing of the comparator 61$_n$ (FIG. 4) is started.

In FIG. 6, the auto-zero pulse is set from H level to L level and the auto-zero processing of the comparator 61$_n$ is started at time $t_4$ after the reset feed-through is caused. Thereafter, the auto-zero pulse is then set from H level to L level and the auto-zero processing of the comparator 61$_n$ is terminated (completed) at time $t_5$.

In the auto-zero processing, the comparator 61$_n$ (the first amplifier unit 71) is set such that the magnitude relationship between the VSL voltage and the reference signal can be determined (compared) assuming that the VSL voltage and the reference signal given to the comparator 61$_n$ match with each other at time $t_5$ or at the falling edge of the auto-zero pulse.

In FIG. 6, the auto-zero processing is completed after the reset feed-through.

In this case, the comparator 61$_n$ is set such that the magnitude relationship between the VSL voltage and the reference signal can be determined assuming that the voltage, which decreases by the reset feed-through from the VSL voltage while the pixel unit 11$_{m, n}$ is being reset, matches with the reference signal.

Consequently, (the waveform of) the reference signal is arranged at a position with reference to the voltage decreased by the reset feed-through from the VSL voltage while the pixel unit 11$_{m, n}$ is being reset.

The reference signal output unit 33 (FIG. 4) increases the reference signal by a predetermined voltage at time $t_6$ after the auto-zero processing is completed (terminated).

Here, increasing the reference signal by a predetermined voltage at time $t_6$ after the auto-zero processing is terminated will be also called start offset below.

Further, the reference signal output unit 33 decreases the voltage of the reference signal at a constant rate in order to perform AD conversion on the VSL voltage, and the part of the reference signal where the voltage of the reference signal decreases at a constant rate is also called slope.

The reference signal output unit 33 performs the start offset of offsetting the reference signal by a predetermined voltage in a reverse direction to the slope direction (the direction in which the voltage of the reference signal changes) at time $t_6$.

Thereafter, the reference signal output unit 33 decreases (lowers) the voltage of the reference signal at a constant rate for a certain period from time $t_7$ to time $t_9$.

Therefore, the reference signal in the period between time $t_7$ and time $t_9$ forms a slope.

The slope of the reference signal in the period between time $t_7$ and time $t_9$ is directed for performing AD conversion on the reset level of the VSL voltage (the VSL voltage immediately after the pixel unit 11$_{m, n}$ is reset (the VSL voltage after the pixel unit 11$_{m, n}$ is reset and the decrease in voltage due to the reset feed-through is caused)), and the period of the slope (the period between time $t_7$ and time $t_9$) will be also called preset (P) phase below. Further, the slope at the P phase is also called P-phase slope.

Here, the comparator 61$_n$ is set such that the VSL voltage and (the voltage of) the reference signal during the auto-zero processing match with each other in the auto-zero processing after the pixel unit 11$_{m, n}$ is reset, and thus the reference signal is larger in its voltage than the VSL voltage (reset level) due to the start offset by which the reference signal increases by a predetermined voltage at time $t_6$ after the auto-zero processing ends. Therefore, the comparator 61$_n$ outputs the comparison result that the reference signal is larger than the VSL voltage at time $t_7$ when the P phase starts.

That is, the differential output of the comparator 61$_n$ (the differential output of the first amplifier 71) enters H level.

The counter 62$_n$ in the ADC 31$_n$ (FIG. 4) starts counting clocks at time $t_7$ when the P-phase slope starts, for example.

(The voltage of) the reference signal decreases at a constant rate at the P phase, and the reference signal matches with the VSL voltage in reset level at time $t_8$ at the P phase and the magnitude relationship between the reference signal and the VSL voltage is reversed from that at the start of the P phase in FIG. 6.

Consequently, the comparison result output by the comparator 61$_n$ is inverted (reversed) from that at the start of the P phase, and the comparator 61$_n$ starts outputting the comparison result that the VSL voltage in reset level is larger than the reference signal.

That is, the differential output of the comparator 61$_n$ enters L level.

When the differential output of the comparator 61$_n$ enters L level, the counter 62$_n$ in the ADC 31$_n$ (FIG. 4) finishes counting the clocks, and the count value of the counter 62$_n$ at that time is to be the reset level AD conversion result (reset level AD value).

After the end of the P phase, the transfer pulse TRG is set from L level to H level between times $t_{10}$ and $t_{11}$, and consequently the charges injected by the PD 51 by photoelectric conversion are transferred and injected in the FD 53 via the transfer Tr 52 in the pixel unit 11$_{m, n}$ (FIG. 3) in the image sensor 2.

The charges are injected from the PD 51 to FD 53 so that the VSL voltage corresponding to the charges injected in the FD 53 decreases and the VSL voltage reaches a signal level (voltage) corresponding to the charges injected in the FD 53.

Further, after the end of the P phase, the reference signal output unit 33 (FIG. 4) increases the reference signal to the same voltage as at the start of the P phase, for example.

As described above, the VSL voltage reaches a voltage corresponding to the charges injected in the FD 53 or the reference signal increases to the same voltage as at the start of the P phase, and thus the magnitude relationship between the reference signal and the VSL voltage is reversed again.

Consequently, the differential output of the comparator 61$_n$ enters H level.

The reference signal output unit 33 (FIG. 4) increases the reference signal to the same voltage as at the start of the P phase, and then decreases (lowers) the voltage of the reference signal at the same change rate as the P phase, for example, for a certain period between time $t_{12}$ and time $t_{14}$ (which does not need to match with the certain period between time $t_7$ and time $t_9$).

Therefore, the reference signal in the period between time $t_{12}$ and time $t_{14}$ forms a slope similarly to the reference signal in the period between time $t_7$ and time $t_9$.

The slope of the reference signal in the period between time $t_{12}$ and time $t_{14}$ is directed for performing AD conversion on the signal level of the VSL voltage (the VSL voltage immediately after the charges are transferred from the PD 51 to the FD 53 in the pixel unit $11_{m,n}$ (FIG. 3)), and the period of the slope (the period between time $t_{12}$ and time $t_{14}$) will be also called data (D) phase below. Further, the slope at the D phase is also called D-phase slope.

Here, the reference signal is larger than the VSL voltage at time $t_{12}$ when the D phase starts similarly as at time $t_7$ when the P phase starts. Therefore, the comparator $61_n$ outputs the comparison result that the reference signal is larger than the VSL voltage at time $t_{12}$ when the D phase starts.

That is, the differential output of the comparator $61_n$ enters H level.

The counter $62_n$ in the ADC $31_n$ (FIG. 4) starts counting clocks at time $t_{12}$ when the D-phase slope starts, for example.

(The voltage of) the reference signal decreases at a constant rate at the D phase, and the reference signal matches with the VSL voltage in signal level at time $t_{13}$ at the D phase and the magnitude relationship between the reference signal and the VSL voltage is reversed from that at the start of the D phase in FIG. 6.

Consequently, the comparison result output by the comparator $61_n$ is also inverted from that at the start of the D phase, and the comparator $61_n$ starts outputting the comparison result that the VSL voltage in signal level is larger than the reference signal.

That is, the differential output of the comparator $61_n$ enters L level.

When the differential output of the comparator $61_n$ is inverted to be at L level, the counter $62_n$ in the ADC $31_n$ (FIG. 4) finishes counting the clocks. The count value of the counter $62_n$ at that time is then to be the signal level AD conversion result (signal level AD value).

When the reset level AD value is found at the P phase and the signal level AD value is found at the D phase as described above, the image sensor 2 performs CDS for finding a difference between the reset level AD value and the signal level AD value and outputs the difference obtained by the CDS as a pixel value.

<Deterioration in Image Quality Due to Variation of Threshold Voltage Vth Between Gate and Source>

Figure 7:
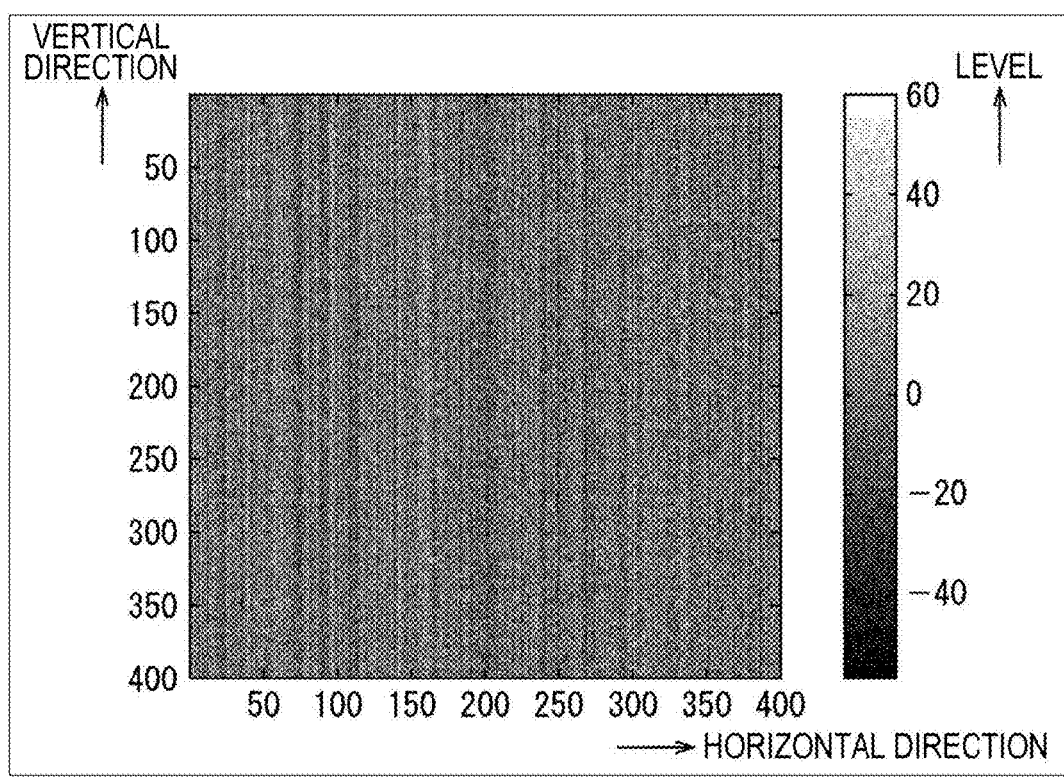
FIG. 7 is a diagram for explaining a deterioration in image quality caused by a variation of a threshold voltage Vth between gate and source of FETs 81 and 82 configuring a differential pair of a comparator $61_n$

FIG. 7 is a diagram for explaining a deterioration in image quality due to a variation of a threshold voltage Vth between the gate and the source of the FETs 81 and 82 configuring a differential pair of a comparator $61_n$.

The comparators $61_1$ to $61_N$ (or the ADC $31_1$ to $31_N$) are formed on a substrate (die) forming the pixel array 10 thereon, for example.

Here, in a case where the image sensor 2 is a laminated image sensor in which a substrate forming the pixel array 10 thereon and a substrate forming peripheral circuits thereon are laminated, the comparators $61_1$ to $61_N$ are formed on the substrate forming peripheral circuits thereon, for example.

The threshold voltage Vth between the gate and the source of the FETs 81 and 82 configuring a differential pair of each comparator $61_n$ varies on the substrate forming the comparators $61_1$ to $61_N$ thereon. A deterioration in image quality such as fixed pattern noise (FPN) (vertical streaks) or random telegraph signal (RTS) noise is caused for an image obtained from the image sensor 2 due to the variation of the threshold voltage Vth.

FIG. 7 illustrates an exemplary image obtained from the image sensor 2. In FIG. 7, the black/white contrast indicates a level of a pixel value obtained from a pixel unit $11_{m,n}$, and a thinner (whiter) color indicates a higher level.

The image of FIG. 7 is obtained by shooting a no-pattern and single-color object, and it can be seen from FIG. 7 that vertical streaks are caused on the image due to the variation of the threshold voltage Vth.

Figure 8:
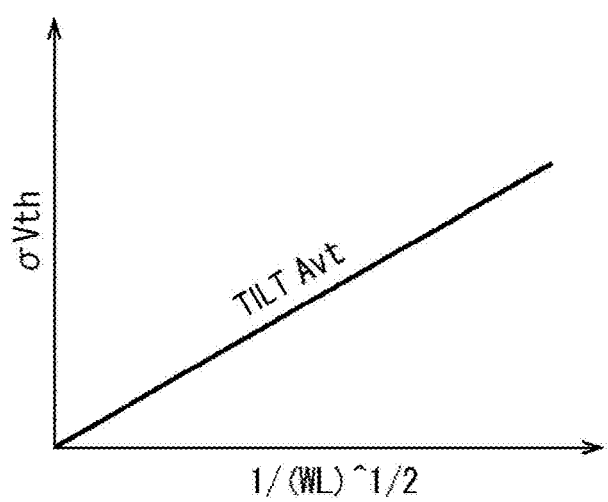
FIG. 8 is a diagram illustrating the characteristic of a variation SIGMAVth of the threshold voltage Vth.

FIG. 8 is a diagram illustrating the characteristics of the variation SIGMAVth of the threshold voltage Vth.

In FIG. 8, the horizontal axis indicates a parameter $(1/WL)^{1/2}$ corresponding to the size of the FETs 81 and 82 configuring a differential pair of a comparator $61_n$, and the vertical axis indicates the variation SIGMAVth of the threshold voltage Vth.

Here, W and L indicate a channel width and a channel length of the FETs 81 and 82 (the first and second transistors paired to configure a differential pair), respectively.

The characteristics of the variation SIGMAVth of the threshold voltage Vth illustrated in FIG. 8 is called Pelgrom plot.

The variation SIGMAVth of the threshold voltage Vth can be expressed in Equation (1).

$$SIGMAVth = Avt \times (1/WL)^{1/2}$$

$$Avt = Tox/Eox(Nsub\, Wdep/3)^{1/2} \qquad (1)$$

In Equation (1), Tox indicates a film thickness (gate oxide film thickness) of a gate oxide film of the FETs 81 and 82 configuring a differential pair of a comparator $61_n$, and Eox indicates a dielectric of the gate oxide film. Nsub indicates an impurity concentration of the FETs 81 and 82, and Wdep indicates a width of a depletion layer of the FETs 81 and 82.

With reference to FIG. 8 and Equation (1), a method for restricting the variation SIGMAVth of the threshold voltage Vth may be a method for increasing the size of the FETs 81 and 82, or the channel width W or the channel length L.

Figure 9:
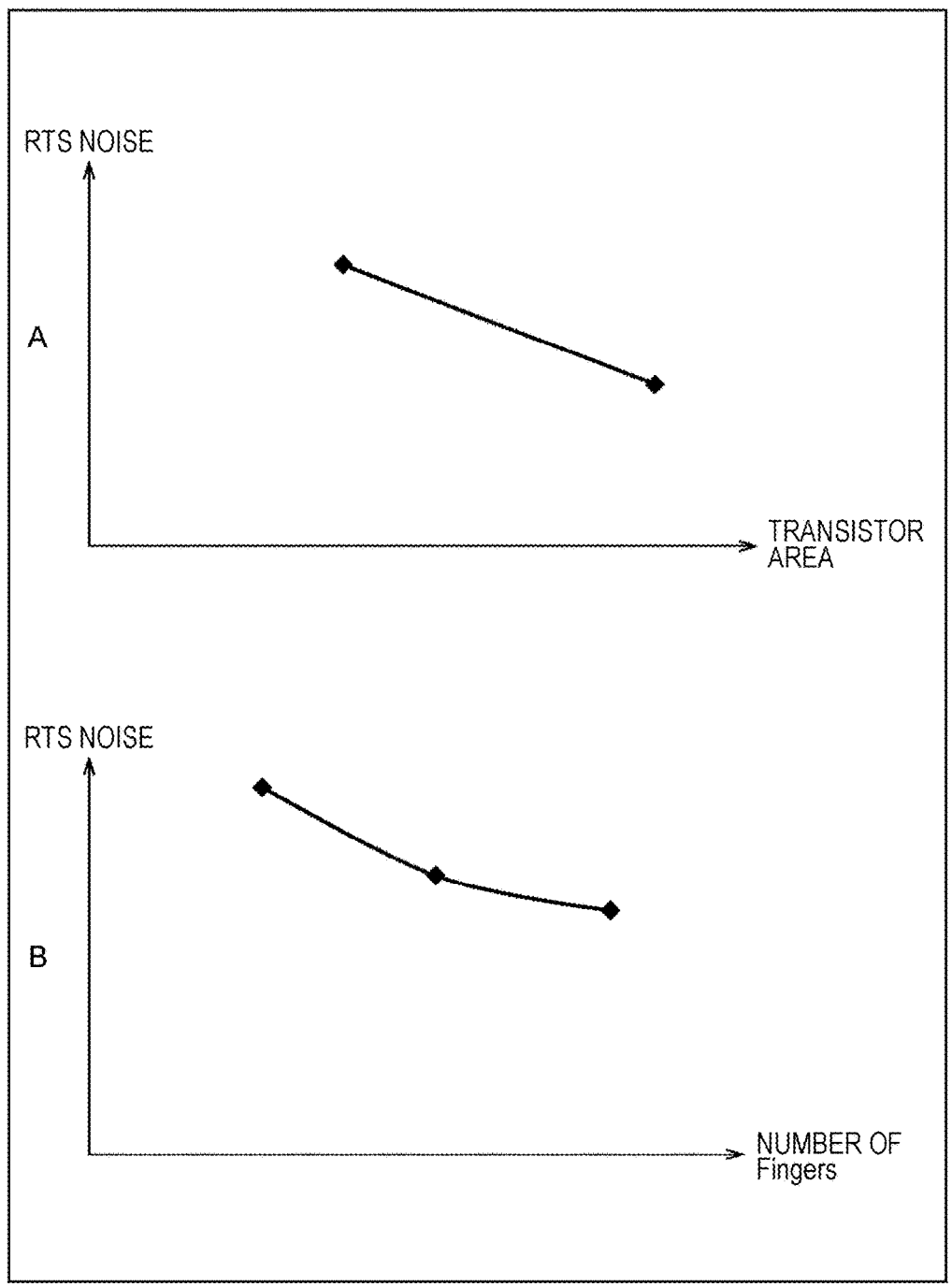
FIG. 9 is a diagram illustrating a relationship between size of the FETs 81 and 82 and RTS noise.

FIG. 9 is a diagram illustrating a relationship between the size of the FETs 81 and 82 and the RTS noise.

That is, A of FIG. 9 illustrates a relationship between the area WL of the FETs 81 and 82 and the RTS noise, and B of FIG. 9 illustrates a relationship between the number of fingers of the FETs 81 and 82 and the RTS noise.

It can be confirmed from FIG. 9 that as the area WL as the size of the FETs 81 and 82 or the number of fingers is larger, the RTS noise is reduced.

Figure 10:
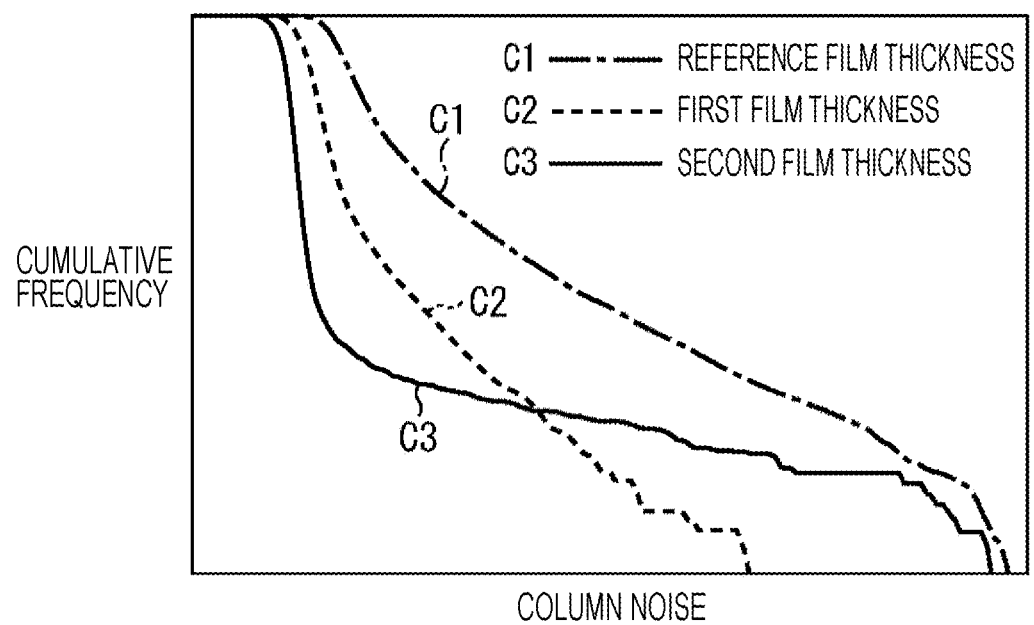
FIG. 10 is a diagram illustrating a relationship between column noise and cumulative frequency.

FIG. 10 is a diagram illustrating a relationship between column noise and cumulative frequency.

In FIG. 10, the column noise on the horizontal axis indicates a noise level on a VSL $42_n$ connected with a comparator $61_n$, and the cumulative frequency on the vertical axis indicates a cumulative frequency of the VSL $42_n$ where a noise occurs at each noise level.

A curve indicating the relationship between column noise and cumulative frequency is now called noise curve.

In FIG. 10, a noise curve C1 is a noise curve in a case where the gate oxide film thickness of the FETs 81 and 82 is set at a predetermined reference film thickness. Further, a noise curve C2 is a noise curve in a case where the gate oxide film thickness of the FETs 81 and 82 is set at a first film thickness smaller than the reference film thickness, and a noise curve C3 is a noise curve in a case where the gate oxide film thickness of the FETs 81 and 82 is set at a second film thickness smaller than the first film thickness.

A column noise when a noise curve starts falling corresponds to a random noise (RN) of the gate oxide film of the FETs 81 and 82, and gentle falling of a noise curve corresponds to the RTS noise.

As viewed from the left of a noise curve, it is indicated that as the noise curve falls earlier, the RN is smaller.

Further, it is indicated that as the noise curve falls more steeply, the RTS noise is smaller.

It can be confirmed from FIG. 10 that the RN and the RTS noise are sensitive to the gate oxide film thickness and gate oxide film capacitance Cox due to the gate oxide film.

That is, it can be confirmed from. FIG. 10 that as the gate oxide film thickness is smaller and thus the gate oxide film capacitance Cox is larger, the RN and the RTS noise are smaller.

From the above, it is effective to increase the gate oxide film capacitance Cox by increasing the size (the channel width W or the channel length L) of the FETs 81 and 82 or decreasing the gate oxide film thickness in order to restrict noises.

That is, it is possible to restrict noises and to achieve higher signal to noise ratio (S/N) by increasing the size of the FETs 81 and 82 or decreasing the gate oxide film thickness.

Figure 11:
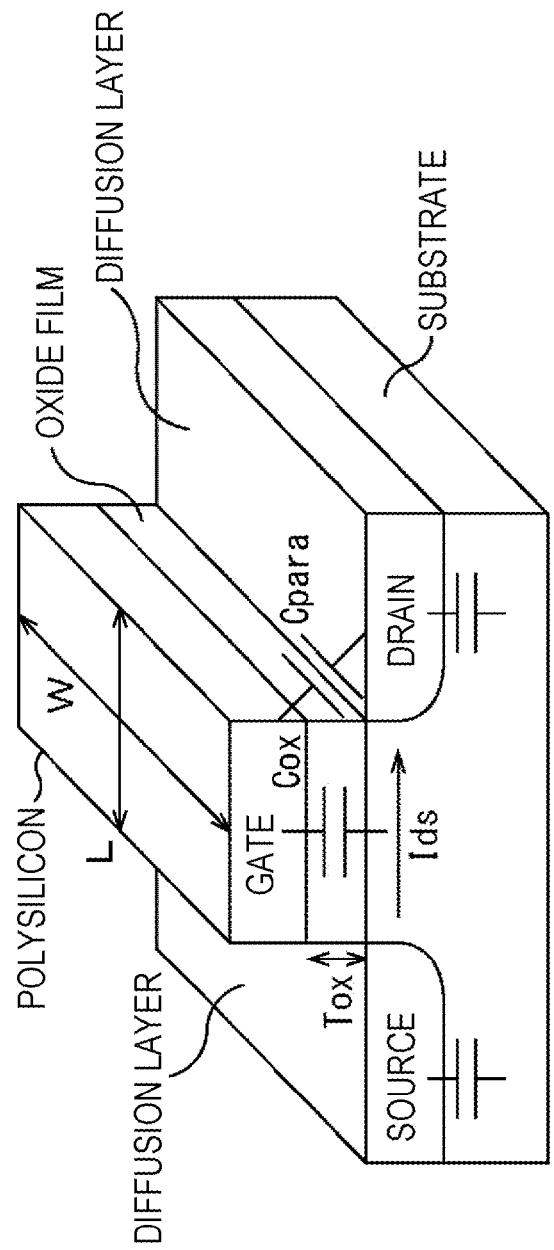
FIG. 11 is a perspective view illustrating an exemplary configuration of a MOS FET.

FIG. 11 is a perspective view illustrating an exemplary configuration of a MOS FET.

The MOS FETs such as the FETs 81 and 82 configuring a differential pair of a comparator $61_n$ are configured such that a gate oxide film and polysilicon as gate are formed on (a P well or N well to be) a substrate and a diffusion layer as drain and source is formed on the substrate.

Here, in FIG. 11, W and L indicate a channel width and a channel length of a FET, respectively, and Ids indicates a current flowing from the source to the drain. Cox indicates gate oxide film capacitance with a gate oxide film as dielectric body, and Cpara indicates a parasitic capacitance relative to the gate of a FET other than the gate oxide film capacitance Cox. Tox indicates a gate oxide film thickness.

A FET has a time constant TAU expressed in equation (2) according to the gate oxide film capacitance Cox of the FET and the parasitic capacitance Cpara.

$$AU=(Cox+Cpara)\times Vdd/Ids$$

$$Cox=Eox\times(WL/Tox) \quad (2)$$

Vdd indicates a power supply voltage of a FET in Equation (2).

The FETs 81 an 82 configuring a differential pair of a comparator $61_n$ has the time constant TAU defined in Equation (2), and the comparator $61_n$ has a delay time determined by the time constant TAU of the FETs 81 and 82.

As described in FIG. 10, it is possible to achieve higher S/N by increasing the size (the channel width W or the channel length L) of the FETs 81 and 82 or decreasing the gate oxide film thickness Tox thereby to increase the gate oxide film capacitance Cox.

However, as the gate oxide film capacitance Cox is larger, the time constant TAU is higher and the delay time of the comparator $61_n$ is longer in Equation (2). As the delay time of the comparator $61_n$ is longer, a time required for performing AD conversion on the VSL voltage in the ADC $31_n$ is longer and higher frame rate is difficult to achieve.

Further, as the time constant TAU is higher, an error can occur in the ADC $31_n$ for performing AD conversion on the VSL voltage.

Figure 12:
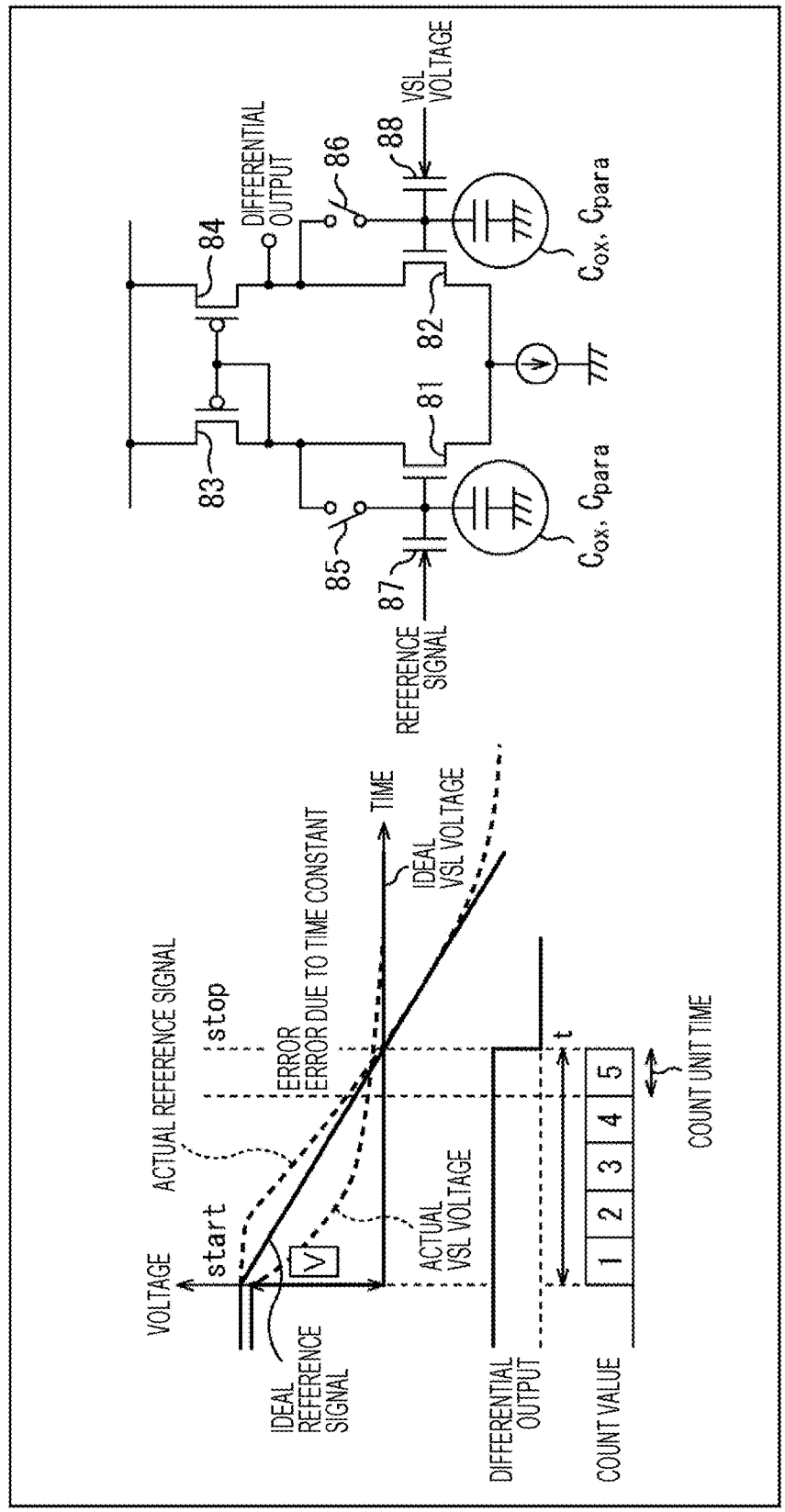
FIG. 12 is a diagram for explaining an error in AD conversion of a VSL voltage which can be caused by a time constant TAU.

FIG. 12 is a diagram for explaining an error in AD conversion of the VSL voltage, which can be caused by the time constant TAU.

Ideal reference signal and VSL voltage for the reference signal and the VSL voltage to be compared by a comparator $61_n$ are assumed as ideal reference signal and ideal VSL voltage, respectively.

Further, actual reference signal and VSL voltage supplied to a comparator $61_n$ are assumed as actual reference signal and actual VSL voltage, respectively.

FIG. 12 illustrates the ideal reference signal and the ideal VSL voltage, the actual reference signal and the actual VSL voltage, the differential output of a comparator $61_n$, and the count value of a counter $62_n$ by way of example.

(The voltage of) the ideal reference signal decreases at a constant tilt, and the ideal VSL voltage steeply decreases to a voltage corresponding to the charges transferred from the PD 51 (FIG. 3) to the FD 53.

In the ADC $31_n$, a time after the ideal reference signal start decreasing until a magnitude relationship between the ideal reference signal and the ideal VSL voltage is inverted is counted by the counter $62_n$, and the count value is output as an AD conversion result of the ideal VSL voltage.

On the other hand, the actual reference signal and the actual VSL voltage have duller waveforms than the ideal reference signal and the ideal VSL voltage, respectively, due to the gate oxide film capacitance Cox of the FETs 81 and 82 configuring a differential pair of the comparator $61_n$ and the time constant TAU caused by the parasitic capacitance Cpara.

That is, the actual reference signal and the actual VSL voltage more gently decrease due to the time constant TAU when starting decreasing as indicated in dotted lines in FIG. 12.

Thus, a timing when the magnitude relationship between the actual reference signal and the actual VSL voltage is inverted is offset to be later than a timing when the magnitude relationship between the ideal reference signal and the ideal VSL voltage is inverted.

A cycle of clocks counted by the counter $62_n$ is now assumed as count unit time.

When the timing when the magnitude relationship between the actual reference signal and the actual VSL voltage is inverted is offset outside the range of the count unit time of the count value (5 in FIG. 12) of the timing when the magnitude relationship between the ideal reference signal and the ideal VSL voltage is inverted, the count value at the timing when the magnitude relationship between the actual reference signal and the actual VSL voltage is inverted is different from the count value at the timing when the magnitude relationship between the ideal reference signal and the ideal VSL voltage is inverted.

Consequently, the AD conversion result of the actual VSL voltage indicates an error-including value which is different from the AD conversion result of the ideal VSL voltage.

Thus, higher S/N can be achieved as described in FIG. 10 in a case where the gate oxide film capacitance Cox is increased, however, higher frame rate is difficult to achieve as described in FIG. 11 and further an error can be caused in the AD conversion result of the VSL voltage as described in FIG. 12.

Figures 13, 14:
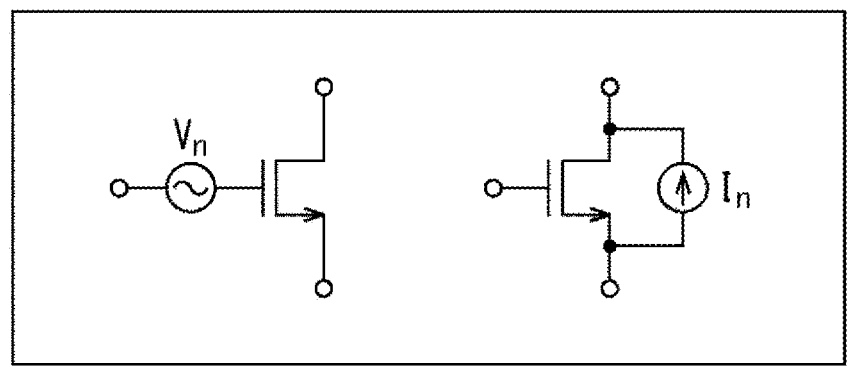
FIG. 13 is a diagram for explaining thermal noise of a FET.
FIG. 14 is a diagram illustrating relationships between an area WL as size of FET, and the variation SIGMAVth of the threshold voltage Vth as well as the time constant TAU, respectively.

FIG. 13 is a diagram for explaining thermal noise of a FET.

A Boltzman constant ($1.380\times10^{-23}$ [JK$^{-1}$]), a temperature [K], FET mutual conductance, and a bandwidth [Hz] of FET frequency characteristics determined by the FET parasitic capacitance Cpara and the like are denoted as k, T, gm, and Δf, respectively.

In this case, a voltage Vn[Vrms] and a current In[Arms] (both of which are effective values) of FET thermal noise are expressed in Equation (3) and Equation (4), respectively.

$$Vn=\sqrt{(4kT(2/3)1/gm\Delta f)} \quad (3)$$

$$In=\sqrt{(4kT(2/3)gm\Delta f)} \quad (4)$$

It is necessary, from Equation (3), to increase the mutual conductance gm or to increase the current flowing in a FET, and to narrow the bandwidth Δf or to lower the cutoff frequency of the FET frequency characteristics in order to decrease the voltage Vn of FET thermal noise.

A method for increasing the mutual conductance gm and increasing the current flowing in a FET or a method for lowering the cutoff frequency needs to increase the size of the FET, for example.

However, as the size of the FET is larger, the gate oxide film capacitance Cox and the like are larger, the time constant TAU is higher, and the time required for performing AD conversion on the VSL voltage is longer in Equation (2) and the like, and thus higher frame rate is difficult to achieve.

That is, as the size of the FET is larger, the thermal noise can be reduced, but higher frame rate is difficult to achieve.

FIG. 14 is a diagram illustrating a relationship between the area WL as the size of the FET (Tr size), and the variation SIGMAVth of the threshold voltage Vth as well as the time constant TAU.

In a case where the size (area) WL of the FET is larger, the variation SIGMAVth of the threshold voltage Vth is smaller but the time constant TAU is higher. Consequently, higher S/N can be achieved, but the time required for performing AD conversion on the VSL voltage is longer and higher frame rate is difficult to achieve.

On the other hand, in a case where the size WL of the FET is smaller, the time constant TAU is lower but the variation SIGMAVth of the threshold voltage Vth is larger. Consequently, higher frame rate can be achieved but higher S/N is difficult to achieve.

As described above, higher S/N for improving the noise characteristics and higher frame rate for rapidly performing AD conversion and outputting an image at a high frame rate are in a tradeoff relationship. Then, it is difficult for the image sensor 2 having the comparators $61_n$ of FIG. 5 or the image sensor described in Patent Document 1 to eliminate the tradeoff between higher S/N and higher frame rate and to achieve both higher S/N and higher frame rate.

Therefore, according to the present technology, the tradeoff between higher S/N and higher frame rate is eliminated and both higher S/N and higher frame rate are achieved.

<First Exemplary Configuration of Comparator $61_n$ in Image Sensor 2 to which Present Technology is Applied>

Figure 15:
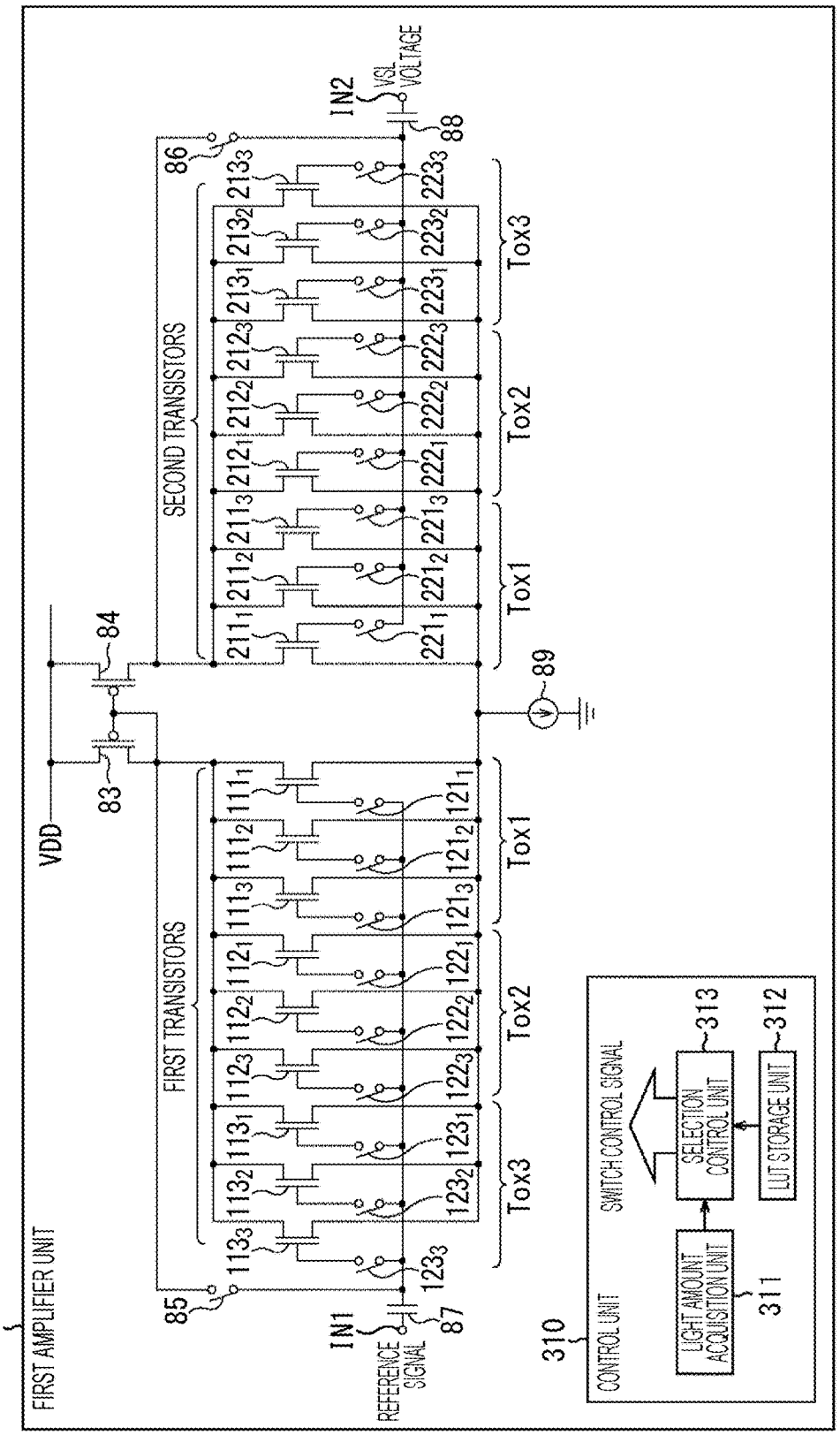
FIG. 15 is a diagram illustrating a first exemplary configuration of a comparator $61_n$ in the image sensor 2 to which the present technology is applied.

FIG. 15 is a diagram illustrating a first exemplary configuration of a comparator $61_n$ in the image sensor 2 to which the present technology is applied.

Additionally, a comparator $61_n$ is configured of the first amplifier unit 71 and the second amplifier unit 72, but only the first amplifier unit 71 configuring a comparator $61_n$ is illustrated in FIG. 15 since the second amplifier unit 72 is configured similarly as in FIG. 5. This is similarly applicable to the following Figures.

Further, the parts corresponding to those of FIG. 5 are denoted with the same reference numerals in FIG. 15, and the description thereof will be omitted below as needed.

Further, the capacitor 90 (FIG. 5) is not illustrated in FIG. 15. This is similarly applicable to the following Figures.

The first amplifier unit 71 of FIG. 15 has the FETs 83 and 84, the switches 85 and 86, the capacitors 87 and 88, and the current source 89.

Further, the first amplifier unit 71 of FIG. 15 has first transistors and second transistors which are paired to configure differential pairs, respectively and which have a plurality of FETs $111_1$, $111_2$, $111_3$, $112_1$, $112_2$, $112_3$, $113_1$, $113_2$, and $113_3$ and a plurality of FETs $211_1$, $211_2$, $211_3$, $212_1$, $212_2$, $212_3$, $213_1$, $213_2$, and $213_3$, respectively, and has a plurality of switches $121_1$, $121_2$, $121_3$, $122_1$, $122_2$, $122_3$, $123_1$, $123_2$, and $123_3$, a plurality of switches $221_1$, $221_2$, $221_3$, $222_1$, $222_2$, $222_3$, $223_1$, $223_2$, and $223_3$, and a control unit 310.

Therefore, the first amplifier unit 71 of FIG. 15 is common with that of FIG. 5 in that the FETs 83 and 84, the switches 85, and 86, the capacitors 87 and 88, and the current source 89 (and the capacitor 90 though not illustrated in FIG. 15) are provided.

However, the first amplifier unit 71 of FIG. 15 is different from that of FIG. 5 in that the FETs $111_1$, $111_2$, $111_3$, $112_1$, $112_2$, $112_3$, $113_1$, $113_2$, and $113_3$ and the FETs $211_1$, $211_2$, $211_3$, $212_1$, $212_2$, $212_3$, $213_1$, $213_2$, and $213_3$ are provided as the first transistors and the second transistors paired to configure differential pairs, respectively, instead of the FETs 81 and 82.

Further, the first amplifier unit 71 of FIG. 15 is different from that of FIG. 5 in that the switches $121_1$, $121_2$, $121_3$, $122_1$, $122_2$, $122_3$, $123_1$, $123_2$, and $123_3$ and the switches $221_1$, $221_2$, $221_3$, $222_1$, $222_2$, $222_3$, $223_1$, $223_2$, and $223_3$, and the control unit 310 are newly provided.

Additionally, the control unit 310 is assumed to be provided in the first amplifier unit 71 for simple description herein, but only one control unit 310 may be provided for the comparators $61_1$ to $61_N$ in the N ADCs $31_1$ to $31_N$ not for each first amplifier unit 71.

It is assumed here that the reference signal is supplied to the first transistors, for example, out of the first transistors and the second transistors paired to configure differential pairs, respectively, and the VSL voltage is supplied to the second transistors in the first amplifier unit 71 in the comparator $61_n$.

That is, the transistor to which the reference signal is supplied out of the paired transistors configuring a differential pair is assumed as first transistor, and the transistor to which the VSL voltage is supplied is assumed as second transistor.

The FETs $111_1$ to $111_3$, $112_1$ to $112_3$, and $113_1$ to $113_3$ are the first transistors, where the drains thereof are connected to the drain of the FET 83 and the sources thereof are connected to the current source 89.

A gate of the FET $111_i$ is connected to the inverting input terminal IN1 via the switch $121_i$ and the capacitor 87 (i=1, 2, 3 in FIG. 15). Similarly, a gate of the FET $112_i$ is connected to the inverting input terminal IN1 via the switch $122_i$ and the capacitor 87, and a gate of the FET $113_i$ is connected to the inverting input terminal IN1 via the switch $123_i$ and the capacitor 87.

The FETs $111_1$ to $111_3$ are similarly configured. The FETs $112_1$ to $112_3$ are similarly configured, and the FETs $113_1$ to $113_3$ are similarly configured.

However, the FET $111_1$, the FET $112_i$, and the FET $113i$ are different in gate oxide film thickness Tox, and thus different in gate oxide film capacitance Cox.

That is, the gate oxide film thickness Tox of the FETs $111_1$ to $111_3$ is a first film thickness Tox1, and the gate oxide film thickness Tox of the FETs $112_1$ to $112_3$ is a second film thickness Tox2 larger than the first film thickness Tox1. The gate oxide film thickness Tox of the FETs $113_1$ to $113_3$ is a third film thickness Tox3 larger than the second film thickness Tox2.

The switches $121_i$, $122_i$, and $123_i$ are turned on or off under control of the control unit 310.

In a case where the switch $121_i$ is tuned on, the gate of the FET $111_1$ is supplied with the reference signal from the inverting input terminal IN1 via the capacitor 87 and the switch $121_i$.

Similarly, in a case where the switch $122_i$ is turned on, the gate of the FET $112_i$ is supplied with the reference signal from the inverting input terminal IN1 via the capacitor 87 and the switch $122_i$. Further, in a case where the switch $123_i$ is turned on, the gate of the FET $113_i$ is supplied with the reference signal from the inverting input terminal IN1 via the capacitor 87 and the switch $123_i$.

The FETs $211_1$ to $211_3$, $212_1$ to $212_3$, and $213_1$ to $213_3$ are the second transistors, where the drains thereof are connected to the drain of the FET 84 and the sources thereof are connected to the current source 89.

A gate of the FET $211_i$ is connected to the non-inverting input terminal IN2 via the switch $221_i$ and the capacitor 88. Similarly, a gate of the FET $212_i$ is connected to the non-inverting input terminal IN2 via the switch $222_i$ and the capacitor 88, and a gate of the FET $213_i$ is connected to the non-inverting input terminal IN2 via the switch $223_i$ and the capacitor 88.

The FETs $211_1$ to $211_3$ are configured similarly to the FET $111_1$. The FETs $212_1$ to $212_3$ are configured similarly to the FET $112_i$, and the FETs $213_1$ to $213_3$ are configured similarly to the FET $113_i$.

Therefore, the FET $211_i$, the FET $212_i$, and the FET $213_i$ are different in gate oxide film thickness Tox.

That is, the gate oxide film thickness Tox of the FETs $211_1$ to $211_3$ is the first film thickness Tox1 similarly to the FETs $111_1$, and the gate oxide film thickness Tox of the FETs $212_1$ to $212_3$ is the second film thickness Tox2 similarly to the FETs $112_i$. The gate oxide film thickness Tox of the FETs $213_1$ to $213_3$ is the third film thickness Tox3 similarly to the FETs $113_i$.

The switches $221_i$, $222_i$, and $223_i$ are turned on or off under control of the control unit 310.

In a case where the switch $221_i$ is turned on, the gate of the FET $211_i$ is supplied with the VSL voltage from the non-inverting input terminal IN2 via the capacitor 88 and the switch $221_i$.

Similarly, in a case where the switch $222_i$ is turned on, the gate of the FET $212_i$ is supplied with the VSL voltage from the non-inverting input terminal IN2 via the capacitor 88 and the switch $222_i$. Further, in a case where the switch $223_i$ is turned on, the gate of the FET $213_i$ is supplied with the VSL voltage from the non-inverting input terminal IN2 via the capacitor 88 and the switch $223_i$.

Additionally, the switches $121_i$ and $221_i$ are turned on/off in tandem. Similarly, the switches $122_i$ and $222_i$ are turned on/off in tandem, and the switches $123_i$ and $223_i$ are turned on/off in tandem.

The control unit 310 functions as a control device for performing control such that a FET to be operated is selected as active transistor from among the FETs $111_1$ to $111_3$, $112_1$ to $112_3$, and $113_1$ to $113_3$ as the first transistors and the FETs $211_1$ to $211_3$, $212_1$ to $212_3$, and $213_1$ to $213_3$ as the second transistors depending on the amount of light incident in the pixel array 10, and the active transistor is operated.

That is, the control unit 310 selects an active transistor from among the FETs $111_1$ to $111_3$, $112_1$ to $112_3$, and $113_1$ to $113_3$ depending on the amount of light incident in the pixel array 10, and turning on the switch connected to the gate of the active transistor thereby to operate the active transistor.

For example, in a case where the control unit 310 selects the FETs $111_1$ to $111_3$ as active transistors, the control unit 310 turns on the switches $121_1$ to $121_3$ connected to the gates of the FETs $111_1$ to $111_3$ as active transistors and supplies the reference signal to the gates of the FETs $111_1$ to $111_3$, thereby controlling the FETs $111_1$ to $111_3$ to operate.

Further, for example, in a case where the control unit 310 selects the FETs $112_1$ and $112_2$ as active transistors, the control unit 310 turns on the switches $122_1$ and $122_2$ connected to the gates of the FETs $112_1$ and $112_2$ as active transistors and supplies the reference signal to the gates of the FETs $112_1$ and $112_2$, thereby controlling the FETs $112_1$ and $112_2$ to operate.

Further, for example, in a case where the control unit 310 selects the FET $113_1$ as active transistor, the control unit 310 turns on the switch $123_1$ connected to the gate of the FET $113_1$ as active transistor and supplies the reference signal to the gate of the FET $113_1$, thereby controlling the FET $113_1$ to operate.

Additionally, in a case where the FET $111_1$ is selected as active transistor, the FET $211_i$ is also selected as active transistor. Similarly, in a case where the FET $112_i$ is selected as active transistor, the FET $212_i$ is also selected as active transistor, and in a case where the FET $113_i$ is selected as active transistor, the FET $213_i$ is also selected as active transistor.

The operations of the FETs $211_i$, $212_i$, and $213_i$ as second transistors and the switches $221_i$, $222_i$, and $223_i$ connected to the gates of the FETs are similar to the operations of the FETs $111_i$, $112_i$, and $113_i$ as first transistors and the switches $121_i$, $122_i$, and $123_i$ connected to the gates of the FETs, and thus the description of the second transistors such as the FETs $211_i$, $212_i$, and $213_i$ and the switches $221_i$, $222_i$, and $223_i$ will be omitted below as needed.

The control unit 310 has a light amount acquisition unit 311, a look up table (LUT) storage unit 312, and a selection control unit 313.

The light amount acquisition unit 311 acquires the amount of light received by the pixel array 10 (luminance and the like acquired from a pixel value of a pixel unit $11_{m, n}$, for example) as the amount of light incident in the pixel array 10, for example, and supplies it to the selection control unit 313.

The LUT storage unit 312 stores a selection LUT registering the information on the FETs selected as active transistors in association with the amount of light incident in the pixel array 10.

The selection control unit 313 selects an active transistor from among the FETs $111_1$ to $111_3$, $112_1$ to $112_3$, and $113_1$ to $113_3$ (and the FETs $211_1$ to $211_3$, $212_1$ to $212_3$, and $213_1$ to $213_3$) depending on the amount of light from the light amount acquisition unit 311 with reference to the selection LUT stored in the LUT storage unit 312, and outputs a switch control signal for controlling the switches $121_1$ to $121_3$, $122_1$ to $122_3$, and $123_1$ to $123_3$ (and the switches $221_1$ to $221_3$, $222_i$ to $222_3$, and $223_i$ to $223_3$) in order to operate the active transistor.

The switch control signal output by the selection control unit 313 is supplied to the switches $121_1$ to $121_3$, $122_1$ to $122_3$, and $123_1$ to $123_3$. The switches $121_1$ to $121_3$, $122_1$ to $122_3$, and $123_1$ to $123_3$ are then turned on or off in response to the switch control signal.

Additionally, the FETs with a total of three gate oxide film thicknesses including the FETs $111_i$ (and the FET $211_i$) with the first film thickness Tox1, the FETs $112_i$ with the second film thickness Tox2, and the FETs $113_i$ with the third film thickness Tox3 are provided as the FETs configuring differential pairs of a comparator $61_n$ in FIG. 15, and the FETs with one, two, or four or more gate oxide film thicknesses can be provided as the FETs configuring differential pairs.

That is, for example, a plurality of FETs with the first film thickness Tox1 can be provided, or one FET with the first film thickness Tox1, one FET with the second film thickness Tox2, one FET with the third film thickness Tox3, and one FET with other gate oxide film thickness can be provided as the FETs configuring differential pairs.

Further, three (six) FET $111_1$ to $111_3$ (and the FETs $211_1$ to $211_3$) are provided as FETs with the first film thickness Tox1, three FETs $112_1$ to $112_3$ are provided as FETs with the second film thickness Tox2, and three FETs $113_1$ to $113_3$ are provided as FETs with the third film thickness Tox3 in FIG. 15, but one, two, or four or more FETs can be provided for the FETs with the first film thickness Tox1, the FETs with the second film thickness Tox2, and the FETs with the third film thickness Tox3, respectively.

Further, the numbers of FETs with the first film thickness Tox1, FETs with the second film thickness Tox2, and FETs with the third film thickness Tox3 may be equal or different.

That is, only one FET with the first film thickness Tox1, only two FETs with the second film thickness Tox2, and only three FETs with the third film thickness Tox3 can be provided as FETs configuring differential pairs.

<Exemplary Configuration of Cross-Section of FETs with Different Gate Oxide Film Thicknesses Tox>

Figure 16:
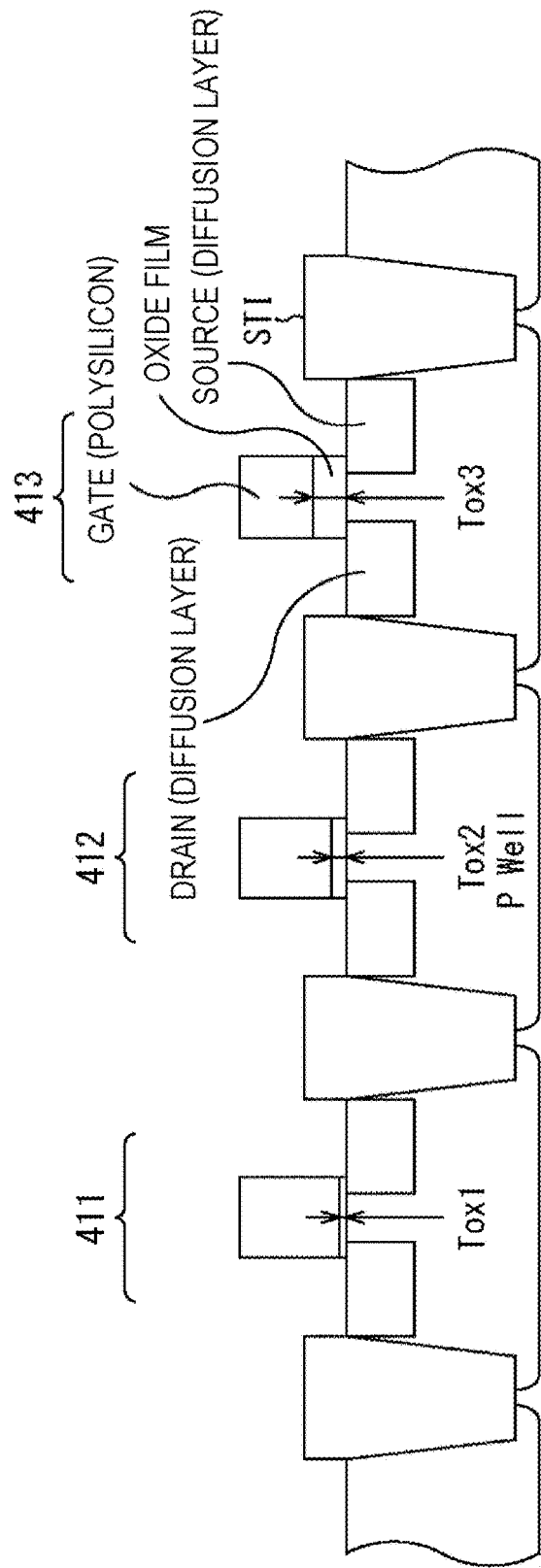
FIG. 16 is a cross-section view illustrating an exemplary configuration of FETs with different gate oxide film thicknesses Tox.

FIG. 16 is a cross-section view illustrating an exemplary configuration of FETs with different gate oxide film thicknesses Tox.

As described in FIG. 15, the gate oxide film thickness Tox of the FET $111_1$ is the first film thickness Tox1, and the gate oxide film thickness Tox of the FET $112_i$ is the second film thickness Tox2 larger than the first film thickness Tox1. Further, the gate oxide film thickness Tox of the FET $113_i$ is the third film thickness Tox3 larger than the second film thickness Tox2.

FIG. 16 illustrates an exemplary configuration of the cross section of the FETs with different gate oxide film thicknesses Tox such as the FETs $111_i$, $112_i$, and $113_i$.

FIG. 16 illustrates the FETs with different gate oxide film thicknesses Tox including a FET 411 with the first film thickness Tox1 of the gate oxide film, a FET 412 with the second film thickness Tox2 of the gate oxide film, and a FET 413 with the third film thickness Tox3 of the gate oxide film.

The FETs 411 to 413 are electrically separated from each other by shallow trench isolation (STI).

Each of the FETs 411 to 413 is configured such that a gate oxide film is formed on the P well, polysilicon as gate is formed on the gate oxide film, and a (n-type) diffusion layer as drain and source is formed on the P well across the gate.

However, the gate oxide film thickness Tox (of the gate oxide film) of the FET 411 is the first film thickness Tox1 which is the smallest, the gate oxide film thickness Tox of the FET 412 is the second film thickness Tox2 which is the second smallest, and the gate oxide film thickness Tox of the FET 413 is the third film thickness Tox3 which is the largest.

Additionally, FIG. 16 is a cross-section view for explaining an exemplary configuration of FETs with different gate oxide film thicknesses Tox, and does not limit the arrangement of the FETs $111_i$, $112_i$, and $113_i$. That is, the arrangement of the FETs $111_i$, $112_i$, and $113_i$ may employ a different arrangement from the cross-section view of FIG. 16.

<Exemplary Layout of FETs with Different Gate Oxide Film Thicknesses Tox>

Figure 17:
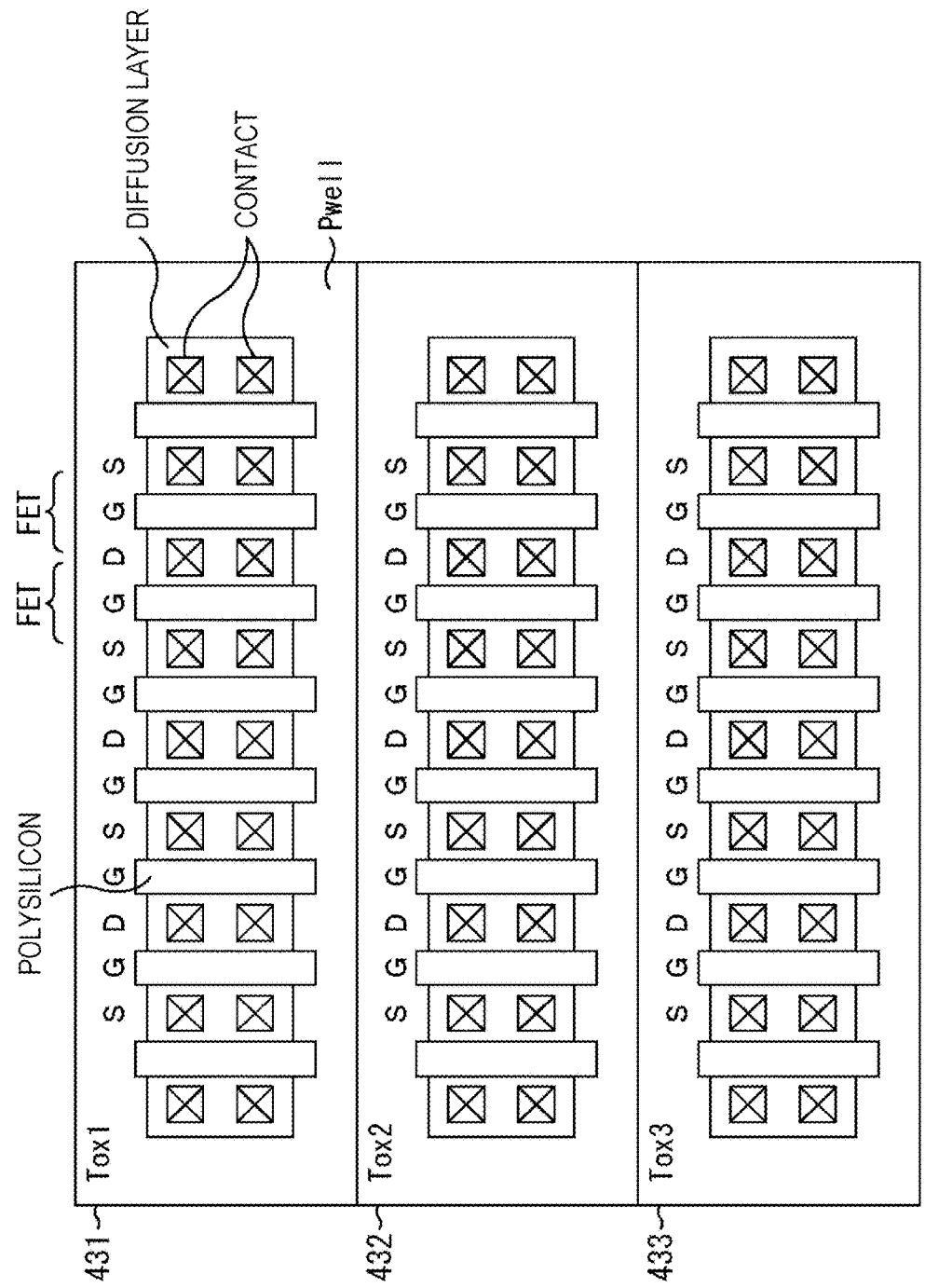
FIG. 17 is a plan view illustrating an exemplary layout of FETs with different gate oxide film thicknesses Tox.

FIG. 17 is a plan view illustrating an exemplary layout of FETs with different gate oxide film thicknesses Tox.

The layout of FIG. 17 is a source-sharing common centroid layout, where the P well is divided into three areas 431, 432, and 433.

A plurality of FETs with the first film thickness Tox1 of the gate oxide film are formed in the area 431, a plurality of FETs with the second film thickness Tox2 of the gate oxide film are formed in the area 432, and a plurality of FETs with the third film thickness Tox3 of the gate oxide film are formed in the area 433.

As many vertically-long polysilicon as gate (G) as the FETs with the first film thickness Tox1 of the gate oxide film are arranged in the horizontal direction in the area 431. Additionally, a gate oxide film is formed between the polysilicon as gate (G) and the P well. The gate oxide film is hidden behind the polysilicon as gate (G) and is not seen in FIG. 17.

The diffusion layer as drain (D) and source (S) is formed on the P well across the gate (G) in the area 431. Further, contacts are formed in the diffusion layer as drain (D) and source (S).

In FIG. 17, the diffusion layer as drain (D) and source (S) is shared by a FET with a gate (G) and a FET with a gate (G) adjacent to the gate (G).

The areas 432 and 433 are configured similarly to the area 431.

However, the gate oxide film thickness Tox of the FETs in the area 431 is the first film thickness Tox1, the gate oxide film thickness Tox of the FETs in the area 432 is the second film thickness Tox2, and the gate oxide film thickness Tox in the area 433 is the third film thickness Tox3.

As illustrated in FIG. 17, the FETs with different gate oxide film thicknesses Tox can be formed on one semiconductor substrate forming the P well thereon.

Additionally, FIG. 17 is a plan view for explaining an exemplary layout of FETs with different gate oxide film thicknesses Tox, and does not limit the arrangement of the FETs $111_i$, $112_i$, and $113_i$. That is, the layout of the FETs $111_i$, $112_i$, and $113_i$ can employ a different layout from that of FIG. 17.

<Accuracy of Gate Oxide Film Thicknesses Tox>

FIG. 18 is a diagram for explaining accuracy of gate oxide film thicknesses Tox.

That is, FIG. 18 illustrates a gate oxide film thickness of each process generation, and an accuracy of the gate oxide film thickness, which are cited from International Technology Roadmap for Semiconductors.

The gate oxide film thickness, and the material and dielectric of a gate oxide film are different depending on a process generation, but the gate oxide film thickness is controlled to a thickness of about several nm at an accuracy (error) of about 4%.

It is assumed that a film thickness difference beyond an accuracy of about 4% of the gate oxide film thickness can be set between the first film thickness Tox1 and the second film thickness Tox2 or between the second film thickness Tox2 and the third film thickness Tox3 for the different gate oxide film thicknesses.

That is, different gate oxide film thicknesses mean that a film thickness difference between different gate oxide film thicknesses takes a value beyond the accuracy of the gate oxide film thicknesses.

<Exemplary Selection LUT>

FIG. 19 is a diagram illustrating an exemplary selection LUT stored in the LUT storage unit 312 of FIG. 15.

Here, the FET $111_1$ (and the FET $211_i$) with the first film thickness Tox1, the FET $112_i$ with the second film thickness Tox2, and the FET $113_i$ with the third film thickness Tox3 are called small-film-thickness Tr, middle-film-thickness Tr, and large-film-thickness Tr, respectively.

Further, the FETs $111_1$, $111_2$, and $111_3$ ($211_1$, $211_2$, and $211_3$) with the first film thickness Tox1 as small-film-thickness Tr are denoted as Tox1 Tr1, Tox1 Tr2, and Tox1 Tr3, respectively, the FETs $112_1$, $112_2$, and $112_3$ with the second film thickness Tox2 as middle-film-thickness Tr are denoted as Tox2 Tr1, Tox2 Tr2, and Tox2 Tr3, respectively, and the FETs $113_1$, $113_2$, and $113_3$ with the third film thickness Tox3 as large-film-thickness Tr are denoted as Tox3 Tr1, Tox3 Tr2, and Tox3 Tr3, respectively.

The information on the FETs selected as active transistors are registered in the selection LUT of FIG. 19 in association with the amount of light indicated in an integer between 0 and 100.

In FIG. 19, ON indicates selecting an active transistor, and OFF indicates not selecting an active transistor.

According to the selection LUT of FIG. 19, as the amount of light is smaller, a FET with a smaller gate oxide film thickness Tox is selected as active transistor, and a larger number of FETs are selected as active transistors.

Further, according to the selection LUT of FIG. 19, as the amount of light is larger, a FET with a larger gate oxide film thickness Tox is selected as active transistor, and a smaller number of FETs are selected as active transistors.

Specifically, according to the selection LUT of FIG. 19, in a case where the amount of light is as small as 0 or 1, three FETs including small-film-thickness Tox1 Tr1, Tox1 Tr2, and Tox1 Tr3 are selected as active transistors.

When the amount of light is 2, two FETs including small-film-thickness Tox1 Tr1 and Tox1 Tr2 are selected as active transistors, and as the amount of light is larger, a smaller number of small-film-thicknesses Tr are selected as active transistors.

Then, when the amount of light is 50, the number of small-film-thicknesses Tr selected as active transistors is 0, and three FETs including middle-film-thickness Tox2 Tr1, Tox2 Tr2, and Tox2 Tr3 are selected as active transistors.

When the amount of light is 52, two FETs including middle-film-thickness Tox2 Tr1 and Tox2 Tr2 are selected as active transistors, and as the amount of light is larger, a smaller number of middle-film-thicknesses Tr are selected as active transistors.

Similarly below, as the amount of light is much larger, the number of middle-film-thicknesses Tr selected as active transistors is 0, and three FETs including large-film-thickness Tox3 Tr1, Tox3 Tr2, and Tox3 Tr3 are selected as active transistors (not illustrated).

As the amount of light is much larger, two FETs including large-film-thickness Tox3 Tr1 and Tox3 Tr2 are selected as active transistors (not illustrated), and when the amount of light is almost 100 as the maximum value (99 in FIG. 19), only the large-film-thickness Tox3 Tr1 is selected as active transistor at the amount of light of the value or more.

<Relationships Between Amount of Light and Variation SIGMAVth of Threshold Voltage Vth as well as Time Constant TAU>

Figure 20:
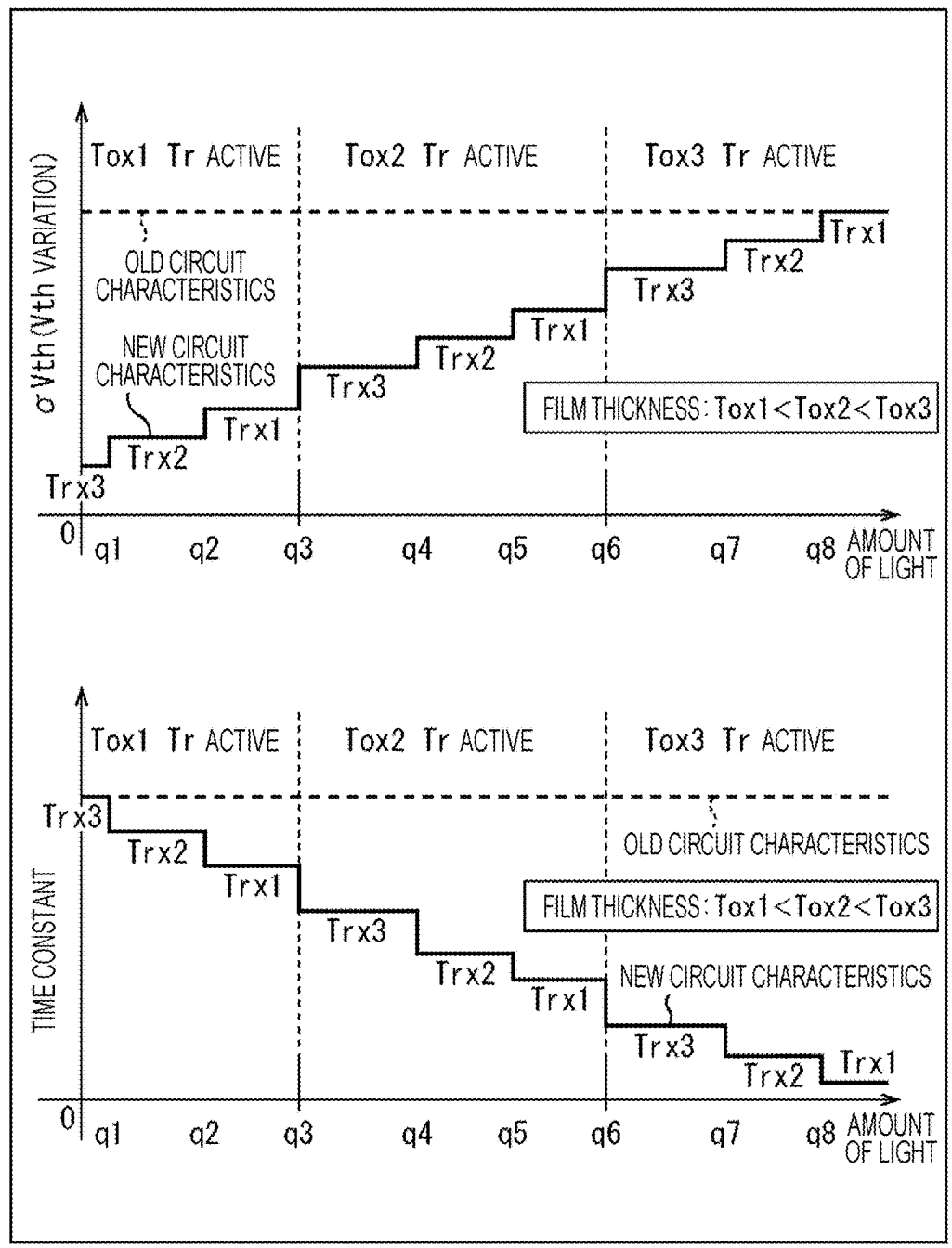
FIG. 20 is a diagram illustrating relationships between the amount of light and the variation SIGMAVth of the threshold voltage Vth of a first transistor configuring a differential pair of a comparator $61_n$ as well as the time constant TAU, respectively, in a case where an active transistor selected according to the selection LUT operates.

FIG. 20 illustrates relationships between the amount of light and the variation SIGMAVth of the threshold voltage Vth of the first transistor (second transistor) configuring a differential pair of a comparator $61_n$, and between the amount of light and the time constant TAU in a case where the active transistors selected according to the selection LUT of FIG. 19 operate.

The FET 81 (and the FET 82) as the first transistor (and the second transistor) configuring a differential pair always operates in the comparator $61_n$ of FIG. 5. Thus, both the variation SIGMAVth of the threshold voltage Vth and the time constant TAU take constant values (fixed values), respectively, in the comparator $61_n$ of FIG. 5 as illustrated as old circuit characteristics in FIG. 20.

As described above, the variation SIGMAVth of the threshold voltage Vth takes a constant value irrespective of the amount of light in the comparator $61_n$ of FIG. 5. Then, in a case where the amount of light is small, the signal component (signal) of the VSL voltage is small and S/N is low, and in a case where the amount of light is large, the signal component of the VSL voltage is large and S/N is high.

On the other hand, an active transistor is selected depending on the amount of light and only the active transistor operates as the first transistor (and the second transistor) configuring a differential pair in the comparator $61_n$ of FIG. 15.

That is, as described in FIG. 19, as the amount of light is smaller, a FET with a smaller gate oxide film thickness Tox is selected as active transistor, and a larger number of FETs are selected as active transistors. Then, as the amount of light is larger, a FET with a larger gate oxide film thickness Tox is selected as active transistor, and a smaller number of FETs are selected as active transistors.

Here, three small-film-thickness Tr (Tox1 Tr) (Tr×3) are selected as active transistors and operate in the range of the amount of light between 0 and q1 in FIG. 20. Further, two small-film-thickness Tr (Tr×2) and one small-film-thickness Tr (Tr×1) are selected as active transistors and operate in the range of the amount of light between q1 and q2 (>q1) and in the range of the amount of light between q2 and q3 (>q2), respectively.

Further, three middle-film-thickness Tr (Tox2 Tr) (Tr×3), two middle-film-thickness Tr (Tr×2), and one middle-film-thickness Tr (Tr×1) are selected as active transistors and operate in the range of the amount of light between q3 and q4 (>q3), in the range of the amount of light between q4 and q5 (>q4), and in the range of the amount of light between q5 and q6 (>q5), respectively.

Then, three large-film-thickness Tr (Tox3 Tr) (Tr×3), two large-film-thickness Tr (Tr×2), and one large-film-thickness Tr (Tr×1) are selected as active transistors and operate in the range of the amount of light between q6 and q7 (>q6), in the range of the amount of light between q7 and q8 (>q7), and in the range of the amount of light of q8 or more, respectively.

In a case where a FET with a small gate oxide film thickness Tox operates as the first transistor configuring a differential pair of a comparator $61_n$, the gate oxide film capacitance Cox of the first transistor is large.

Further, in a case where a large number of FETs operate as the first transistors, the area WL of the first transistors is substantially large, and the gate oxide film capacitance Cox of the first transistors is large.

In a case where the gate oxide film thickness Tox is small (thin) or in a case where the area WL of the transistor is large, the variation SIGMAVth of the threshold voltage Vth in Equation (1) is small, thereby restricting noises.

Further, in a case where the gate oxide film capacitance Cox of the first transistor is large, the cutoff frequency of the frequency characteristics of the first transistor lowers, and the bandwidth Δf in Equation (3) and Equation (4) is small. Consequently, the voltage Vn and the current In of thermal noise in Equation (3) and Equation (4) are low, thereby restricting noises.

Further, in a case where the gate oxide film capacitance Cox of the first transistor is large, the time constant TAU in Equation (2) is high.

On the other hand, in a case where a FET with a large gate oxide film thickness Tox operates as the first transistor configuring a differential pair of a comparator $61_n$, the gate oxide film capacitance Cox of the first transistor is small.

Further, in a case where a small number of FETs operate as the first transistors, the area WL of the first transistors is small and the gate oxide film capacitance Cox of the first transistors is small.

In a case where the gate oxide film capacitance Cox of the first transistor is small, the time constant TAU in Equation (2) is low, and the delay time of the first transistor determined by the time constant TAU is short.

Further, in a case where the gate oxide film thickness Tox of the first transistor is large (thick) or in a case where the area WL of the first transistor is small, the variation SIGMAVth of the threshold voltage Vth in Equation (1) is large.

Thus, in a case where an active transistor is selected and operated depending on the amount of light, the variation SIGMAVth of the threshold voltage Vth and the time constant TAU are illustrated as new circuit characteristics in FIG. 20.

That is, in a case where a FET with a small gate oxide film thickness Tox operates as the first transistor or a large number of FETs operate when the amount of light is small, the variation SIGMAVth of the threshold voltage Vth is small and the time constant TAU is high.

Then, in a case where a FET with a larger gate oxide film thickness Tox operates as the first transistor or a smaller number of FETs operate as the amount of light is larger, the variation SIGMAVth of the threshold voltage Vth is large and the time constant TAU is low.

Therefore, in a case where the amount of light is small, noises can be restricted by decreasing the variation SIGMAVth of the threshold voltage Vth in Equation (1), and the voltage Vn and the current In of thermal noise in Equation (3) and Equation (4), thereby achieving higher S/N.

Additionally, in a case where the amount of light is small, the time constant TAU is high, but when the amount of light is small, a reduction in the VSL voltage caused by the charges transferred from the PD 51 to the FD 53, which is AD-converted at the D phase described in FIG. 6, is small, and little time is required to stabilize the VSL voltage irrespective of the time constant.

Thus, in a case where the amount of light is small, the VSL voltage is stabilized early even if the time constant TAU is high, thereby preventing an error in AD conversion of the VSL voltage described in FIG. 12 from occurring, and achieving higher frame rate.

On the other hand, in a case where the amount of light is large, a reduction in the VSL voltage caused by the charges transferred from the PD 51 to the FD 53, which is AD-converted at the D phase, is large, and when the time constant is high, it takes a time to stabilize the VSL voltage.

However, in a case where the amount of light is large, the time constant TAU is low, and thus the VSL voltage is early stabilized, and consequently it is possible to prevent an error in AD conversion of the VSL voltage described in FIG. 12 from occurring, and to enable rapid AD conversion of the VSL voltage, thereby achieving higher frame rate.

Additionally, in a case where the amount of light is large, the variation SIGMAVth of the threshold voltage Vth is large but the signal component of the VSL voltage is large, thereby preventing a deterioration in S/N.

As described above, a plurality of FETs with several gate oxide film thicknesses are provided as the first transistors (and the second transistors) configuring differential pairs of a comparator $61_n$, and an active transistor is selected from among the FETs with several gate oxide film thicknesses depending on the amount of light, and is controlled to operate, thereby adaptively controlling the variation SIGMAVth of the threshold voltage Vth in Equation (1), the time constant TAU in Equation (2), and the like, and thus it is possible to eliminate the tradeoff between higher S/N and higher frame rate and to achieve both higher S/N and higher frame rate.

That is, since FETs with a small gate oxide film thickness Tox or a large number of FETs are operated at low illuminance with a small amount of light, and thus the gate oxide film capacitance Cox of the first transistors increases and the area WL of the first transistors increases. Consequently, it is possible to decrease the variation SIGMAVth of the threshold voltage Vth in Equation (1), to reduce FPN due to the variation SIGMAVth, and to achieve higher S/N.

Further, in a case where the area WL of the first transistors is large, the RTS noise is further reduced than in FIG. 4, and higher S/N can be achieved.

Further, in a case where the gate oxide film capacitance Cox of the first transistors is large, the bandwidth $\Delta f$ in Equation (3) and Equation (4) is small, and thus the voltage Vn and the current In of thermal noise in Equation (3) and Equation (4) are low, thereby achieving higher S/N.

On the other hand, FETs with a large gate oxide film thickness Tox or a small number of FETs are operated at high illuminance with a large amount of light, and thus the gate oxide film capacitance Cox of the first transistors is small. Consequently, the time constant TAU in Equation (2) is low and the largely-reduced VSL voltage is early stabilized, thereby achieving higher frame rate.

As described above, it is possible to improve the noise characteristics which are problematic at low illuminance, and to achieve higher S/N, and it is possible to improve a time to stabilize the VSL voltage which is problematic at high illuminance, and to achieve higher frame rate.

Additionally, in a case where the image sensor 2 is a laminated image sensor in which a pixel substrate forming the pixel array 10 thereon and a peripheral circuit substrate forming the peripheral circuits such as the column parallel AD converter 22 thereon are laminated, the peripheral circuit substrate has more room than in a case where the pixel array 10 and the peripheral circuits are formed on one substrate, and thus a plurality of FETs with several gate oxide film thicknesses can be provided as the first transistors (and the second transistors) configuring differential pairs of a comparator $61_n$ without particularly extending the area of the peripheral circuit substrate.

<Control by Selection Control Unit 313>

Figure 21:
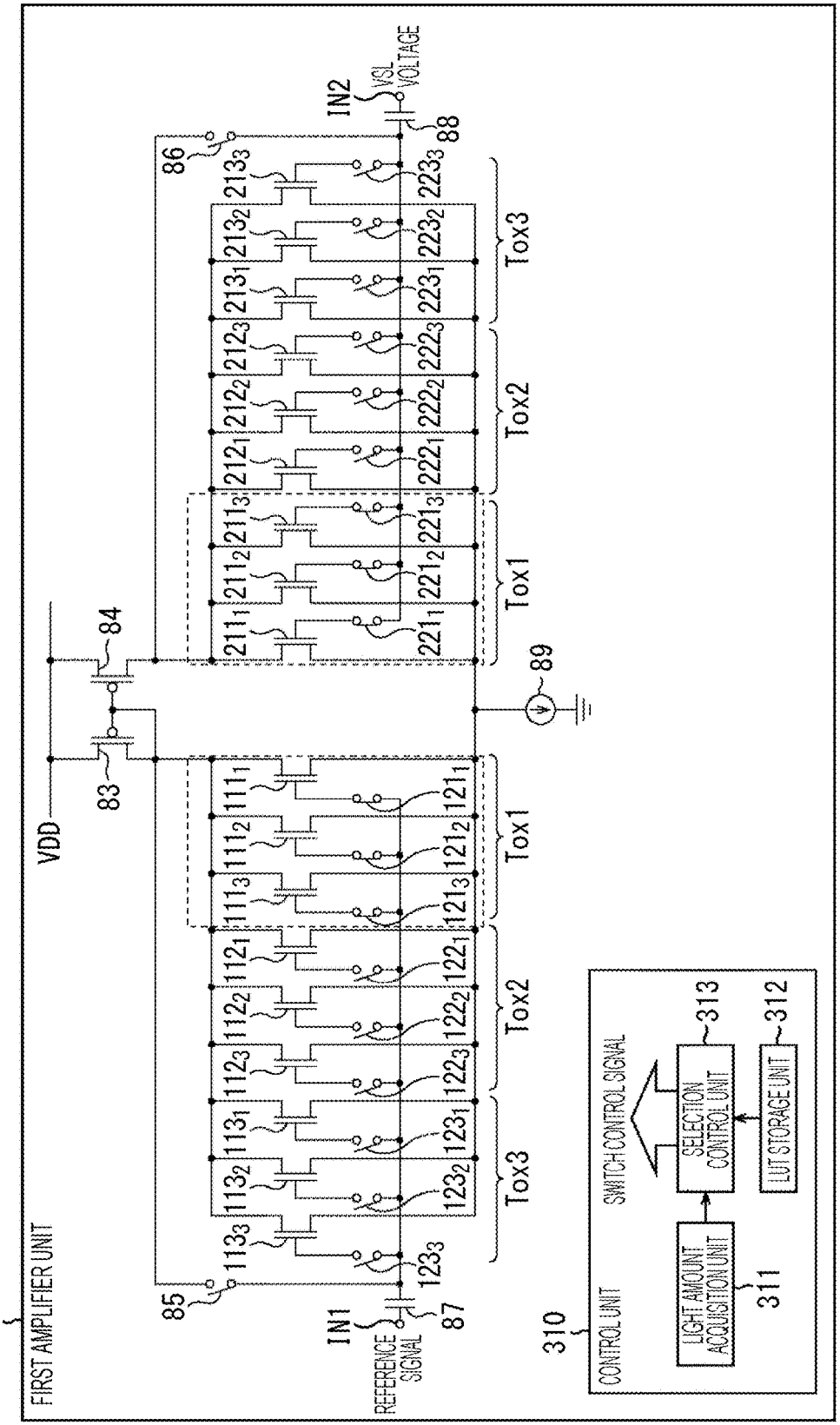
FIG. 21 is a diagram illustrating how the selection control unit 313 controls switches $121_1$ to $121_3$, $122_1$ to $122_3$, and $123_1$ to $123_3$ by way of example.
Figure 22:
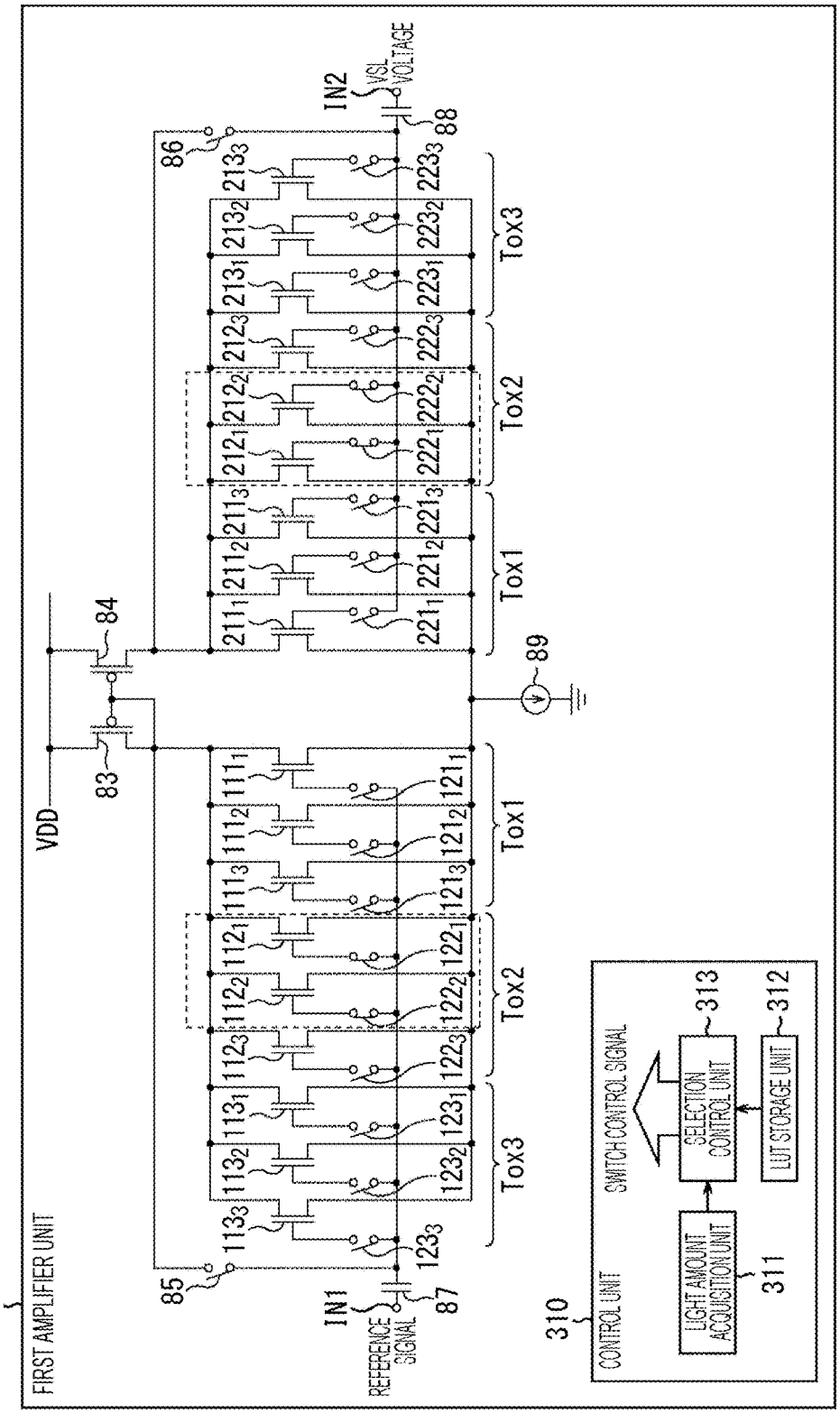
FIG. 22 is a diagram illustrating how the selection control unit 313 controls the switches $121_1$ to $121_3$, $122_1$ to $122_3$, and $123_1$ to $123_3$ by way of example.
Figure 23:
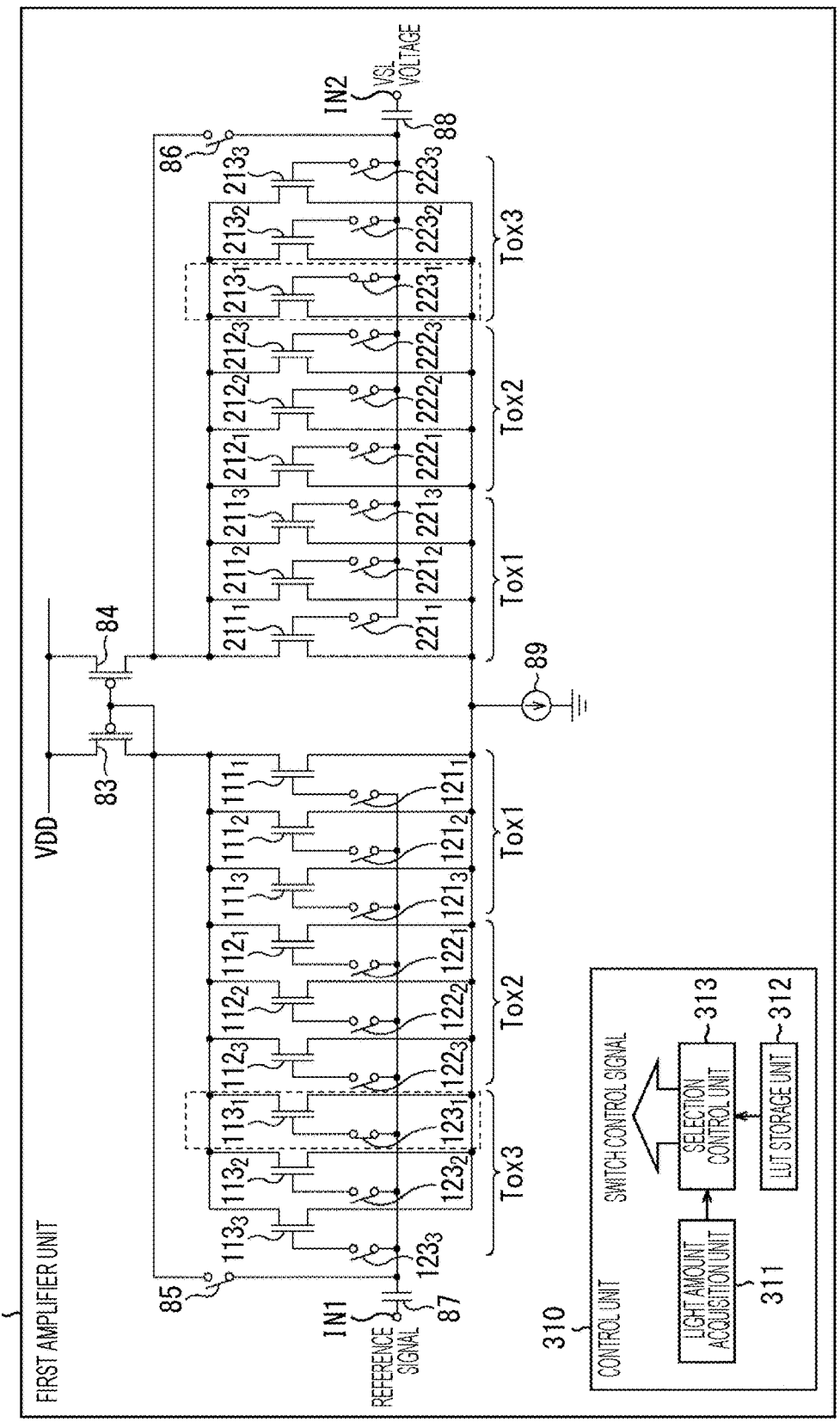
FIG. 23 is a diagram illustrating how the selection control unit 313 controls the switches $121_1$ to $121_3$, $122_1$ to $122_3$, and $123_1$ to $123_3$ by way of example.

FIG. 21, FIG. 22, and FIG. 23 are diagrams illustrating how the selection control unit 313 of FIG. 15 controls the switches $121_1$ to $121_3$, $122_1$ to $122_3$, and $123_1$ to $123_3$ (and the switches $221_1$ to $221_3$, $222_1$ to $222_3$, and $223_1$ to $223_3$) by way of example.

FIG. 21 illustrates how the selection control unit 313 controls the switches $121_1$ to $121_3$, $122_1$ to $122_3$, and $123_1$ to $123_3$ in a case where the amount of light is small by way of example.

In a case where the amount of light is small, the selection control unit 313 selects all the three FETs $111_1$ to $111_3$ (and the FETs $211_1$ to $211_3$) with the first film thickness Tox1 of the gate oxide film as active transistors, for example, with reference to the selection LUT (FIG. 19) stored in the LUT storage unit 312.

The selection control unit 313 then outputs a switch control signal for turning on the switches $121_1$ to $121_3$ (and the switches $221_1$ to $221_3$) (and a switch control signal for turning off other switches) as a switch control signal for operating the active transistors, and turns on the switches $121_1$ to $121_3$.

When the switches $121_1$ to $121_3$ are turned on, there is caused a state in which the reference signal is supplied to the gates of the FETs $111_1$ to $111_3$ as active transistors (a state in which the VSL voltage is supplied to the gates of the FETs $211_1$ to $211_3$), and the FETs $111_1$ to $111_3$ as active transistors operate in response to the reference signal supplied to the gates thereof.

As described above, all the three FETs $111_1$ to $111_3$ with the first film thickness Tox1 as the smallest gate oxide film thickness Tox operate so that the gate oxide film capacitance Cox and the area WL are large and the variation SIGMAVth of the threshold voltage Vth in Equation (1) is small, thereby achieving higher S/N.

Additionally, in a case where the gate oxide film capacitance Cox is large, the time constant TAU in Equation (2) is high, but in a case where the amount of light is small, the time to stabilize the VSL voltage is short, thereby rapidly performing AD conversion on the VSL voltage and achieving higher frame rate even if the time constant TAU is high.

FIG. 22 illustrates how the selection control unit 313 controls the switches $121_1$ to $121_3$, $122_1$ to $122_3$, and $123_1$ to $123_3$ in a case where the amount of light is middle by way of example.

In a case where the amount of light is middle, the selection control unit 313 selects two FETs $112_1$ and $112_2$ as active transistors from among the three FETs $112_1$ to $112_3$ with the second film thickness Tox2 of the gate oxide film, for example, with reference to the selection LUT (FIG. 19) stored in the LUT storage unit 312.

The selection control unit 313 then outputs a switch control signal for tuning on the switches $122_1$ and $122_2$ as a switch control signal for operating the active transistors, and turns on the switches $122_1$ and $122_2$.

When the switches $122_1$ and $122_2$ are turned on, there is caused a state in which the reference signal is supplied to the gates of the FETs $112_1$ and $112_2$ as active transistors, and the FETs $112_1$ and $112_2$ as active transistors operate in response to the reference signal supplied to the gates thereof.

The two FETs $112_1$ and $112_2$ with the second film thickness Tox2 as the second largest gate oxide film thickness Tox operate as described above, and thus the gate oxide film capacitance Cox and the area WL are middle, and the variation SIGMAVth of the threshold voltage Vth in Equation (1) and the time constant TAU in Equation (2) can be restricted to some extent.

Consequently, higher S/N and higher frame rate can be achieved similarly as in FIG. 21 described above and FIG. 23 described below.

FIG. 23 illustrates how the selection control unit 313 controls the switches $121_1$ to $121_3$, $122_1$ to $122_3$, and $123_1$ to $123_3$ in a case where the amount of light is large by way of example.

In a case where the amount of light is large, the selection control unit 313 selects one FET $113_1$ as active transistor from among the three FETs $113_1$ to $113_3$ with the third film thickness Tox3 of the gate oxide film, for example, with reference to the selection LUT (FIG. 19) stored in the LUT storage unit 312.

The selection control unit 313 then outputs a switch control signal for tuning on the switch $123_1$ as a switch control signal for operating the active transistor, and turns on the switch $123_1$.

When the switch $123_1$ is turned on, there is caused a state in which the reference signal is supplied to the gate of the FET $113_1$ as active transistor, and the FET $113_1$ as active transistor operates in response to the reference signal supplied to the gate thereof.

The FET $113_i$ with the third film thickness Tox3 as the largest gate oxide film thickness Tox operates as described above, and thus the gate oxide film capacitance Cox (and the area WL) is small and the time constant TAU in Equation (2) is low, thereby rapidly performing AD conversion on the VSL voltage and achieving higher frame rate.

Additionally, in a case where the gate oxide film capacitance Cox is small, the variation SIGMAVth of the threshold voltage Vth in Equation (1) is large, but when the amount of light is large, the signal component of the VSL voltage is large, thereby relatively achieving higher S/N.

Here, the selection LUT of FIG. 19 is configured such that in a case where the amount of light is roughly divided into three ranges of large, middle, and small, the FET $111_1$ with the first film thickness Tox1 (small-film-thickness Tr), the FET $112_i$ with the second film thickness Tox2 (middle-film-thickness Tr), and the FET $113_i$ with the third film thickness Tox3 (large-film-thickness Tr) are selected as active transistors in a case where the amount of light is small, in a case where the amount of light is middle, and in a case where the amount of light is large, respectively, and the number of FETs selected as active transistors decreases as the amount of light increases for each range of large, middle, or small of the amount of light, but the selection LUT is not limited thereto.

That is, in the selection LUT of FIG. 19, in a case where the amount of light changes from small to middle, for example, the FETs selected as active transistors switch from one FET $111_1$ with the first film thickness Tox1 to three FETs $112_1$ to $112_3$ with the second film thickness Tox2. When the active transistors switch to a different number of FETs with a different gate oxide film thickness Tox in this way, the variation SIGMAVth of the threshold voltage Vth and the time constant TAU largely change at the time of the switching, and the image quality of an image obtained by the image sensor 2 can change with a feeling of strangeness.

Thus, the selection LUT can be configured such that the active transistors do not suddenly switch to a different number of FETs with a different gate oxide film thickness Tox.

That is, the selection LUT can be configured such that FETs with several gate oxide film thicknesses Tox are included in the FETs selected as active transistors so that the variation SIGMAVth of the threshold voltage Vth and the time constant TAU gently change when the FETs selected as active transistors switch (change).

A change in the total area WL of FETs selected as active transistors will be ignored below for simple description (it is assumed that a change in the variation SIGMAVth of the threshold voltage Vth or the time constant TAU due to a change in the area WL is much smaller than a change in the variation SIGMAVth of the threshold voltage Vth or the time constant TAU due to a change in the gate oxide film thickness Tox). In this case, the selection LUT can be configured such that when the amount of light is small, for example, three small-film-thickness Tr, three middle-film-thickness Tr, and three large-film-thickness Tr are selected as active transistors, and in the following, as the amount of light increases, three small-film-thickness Tr, three middle-film-thickness Tr, and two large-film-thickness Tr are selected as active transistors, three small-film-thickness Tr, three middle-film-thickness Tr, and one large-film-thickness Tr are selected as active transistors, three small-film-thickness Tr, three middle-film-thickness Tr, and zero large-film-thickness Tr are selected as active transistors, three small-film-thickness Tr, two middle-film-thickness Tr, and three large-film-thickness Tr are selected as active transistors,

. . .

three small-film-thickness Tr, zero middle-film-thickness Tr, and zero large-film-thickness Tr are selected as active transistors, two small-film-thickness Tr, three middle-film-thickness Tr, and three large-film-thickness Tr are selected as active transistors,

. . .

zero small-film-thickness Tr, one middle-film-thickness Tr, and zero large-film-thickness Tr is selected as active transistor, zero small-film-thickness Tr, zero middle-film-thickness Tr, and three large-film-thickness Tr are selected as active transistors, zero small-film-thickness Tr, zero middle-film-thickness Tr, and two large-film-thickness Tr are selected as active transistors, and finally, zero small-film-thickness Tr, zero middle-film-thickness Tr, and one large-film-thickness Tr is selected as active transistor.

<Control Processing>

Figure 24:
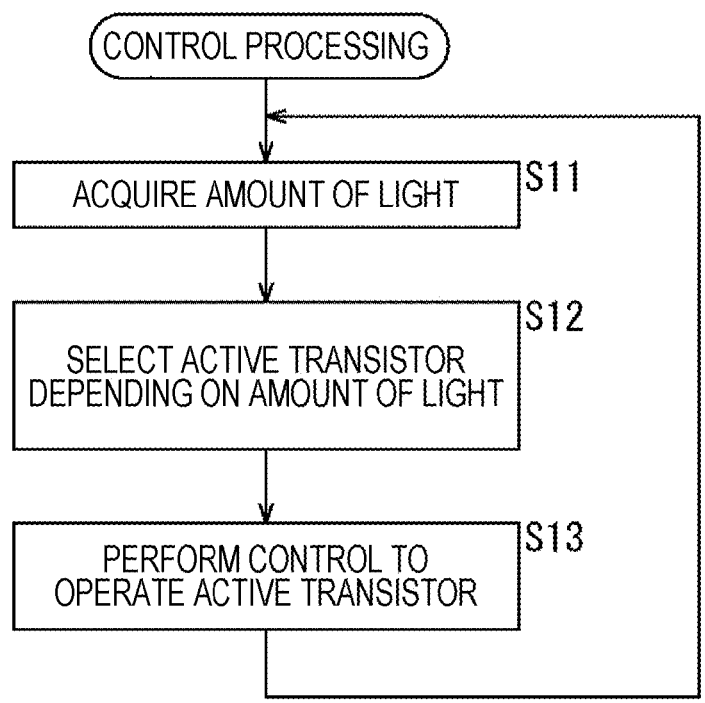
FIG. 24 is a flowchart for explaining an exemplary processing (control processing) performed by a control unit 310.

FIG. 24 is a flowchart for explaining an exemplary processing (control processing) performed by the control unit 310 of FIG. 15.

In step S11, the light amount acquisition unit 311 in the control unit 310 acquires the amount of light received by the pixel array 10 as the amount of light incident in the pixel array 10, and supplies it to the selection control unit 313, and the processing proceeds to step S12.

In step S12, the selection control unit 313 selects an active transistor from among the FETs $111_1$ to $111_3$, $112_1$ to $112_3$, and $113_1$ to $113_3$ depending on the amount of light from the light amount acquisition unit 311 with reference to the selection LUT stored in the LUT storage unit 312, and the processing proceeds to step S13.

In step S13, the selection control unit 313 controls the switches $121_1$ to $121_3$, $122_1$ to $122_3$, and $123_1$ to $123_3$ to operate the active transistor.

The processing then returns from step S13 to step S11, and the similar processing is subsequently repeated.

<Examples of Image Shooting by Image Sensor 2>

Figure 25:
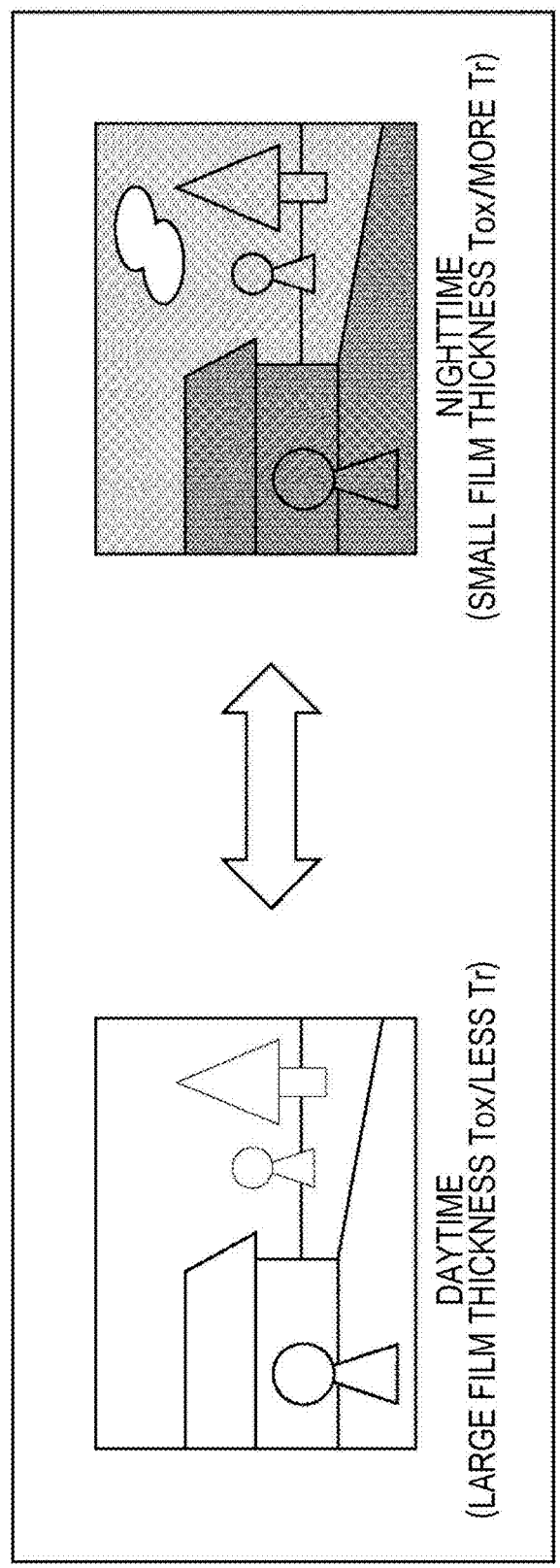
FIG. 25 is a diagram for explaining a first example of image shooting by the image sensor 2 having the comparators $61_n$.

FIG. 25 is a diagram for explaining a first example of image shooting by the image sensor 2 having comparators $61_n$ of FIG. 15.

That is, FIG. 25 illustrates exemplary image shooting by the image sensor 2 during daytime and nighttime.

A large amount of light is received by the pixel array 10 through daytime image shooting, and a small amount of light is received by the pixel array 10 through nighttime image shooting.

In this case, a small number of FETs with a large gate oxide film thickness Tox are selected as active transistors, for example, depending on a large amount of light through daytime shooting.

On the other hand, a large number of FETs with a small gate oxide film thickness Tox are selected as active transistors, for example, depending on a small amount of light through nighttime shooting.

The active transistors are selected and operated as described above, thereby achieving both higher S/N and higher frame rate through daytime and nighttime shooting.

Figure 26:
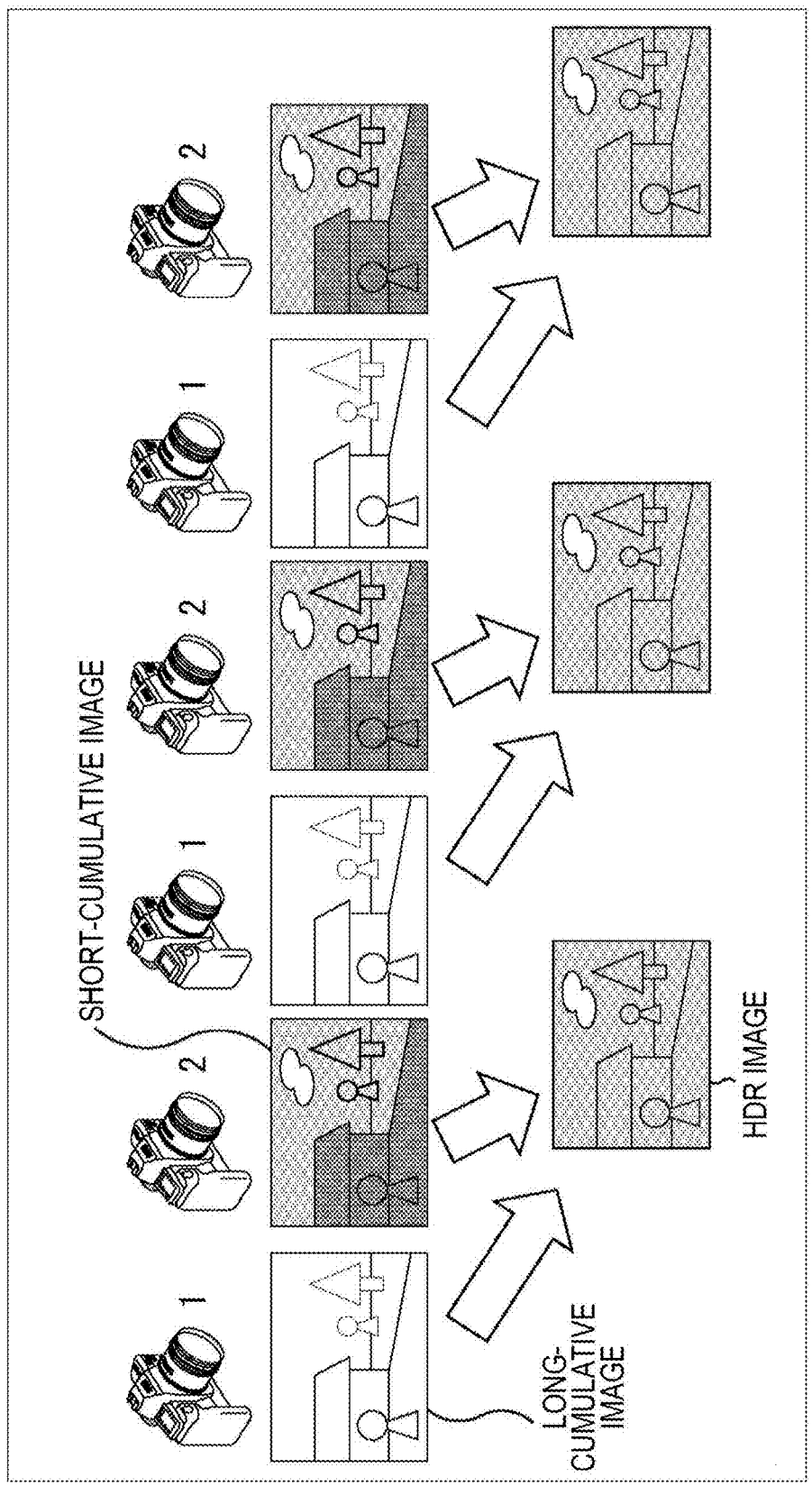
FIG. 26 is a diagram for explaining a second example of image shooting by the image sensor 2 having the comparators $61_n$.

FIG. 26 is a diagram for explaining a second example of image shooting by the image sensor 2 having comparators $61_n$ of FIG. 15.

That is, FIG. 26 illustrates an example in which images are shot in two exposure times by long-time exposure and short-time exposure to generate a high dynamic range (HDR) image from the images in the two exposure times.

In FIG. 26, shooting with long-time exposure and shooting with short-time exposure are alternately performed, and a long-cumulative image which is shot by long-time exposure and a short-cumulative image which is shot by short-time exposure are combined thereby to generate a HDR image.

A long-cumulative image is combined with a short-cumulative image by setting the pixel value of the short-cumulative image to be twice as large as a ratio between the exposure time of the long-cumulative image and the exposure time of the short-cumulative image.

When a HDR image is generated as described above, a large amount of light is received by the pixel array 10 while shooting a long-cumulative image, and a small amount of light is received by the pixel array 10 while shooting a short-cumulative image.

In this case, a small number of FETs with a large gate oxide film thickness Tox are selected as active transistors, for example, depending on a large amount of light when shooting a long-cumulative image.

On the other hand, a large number of FETs with a small gate oxide film thickness Tox are selected as active transistors, for example, depending on a small amount of light while shooting a short-cumulative image.

A long-cumulative image and a short-cumulative image are shot by selecting and operating the active transistors as described above, thereby achieving both higher S/N and higher frame rate of HDR image.

Figure 27:
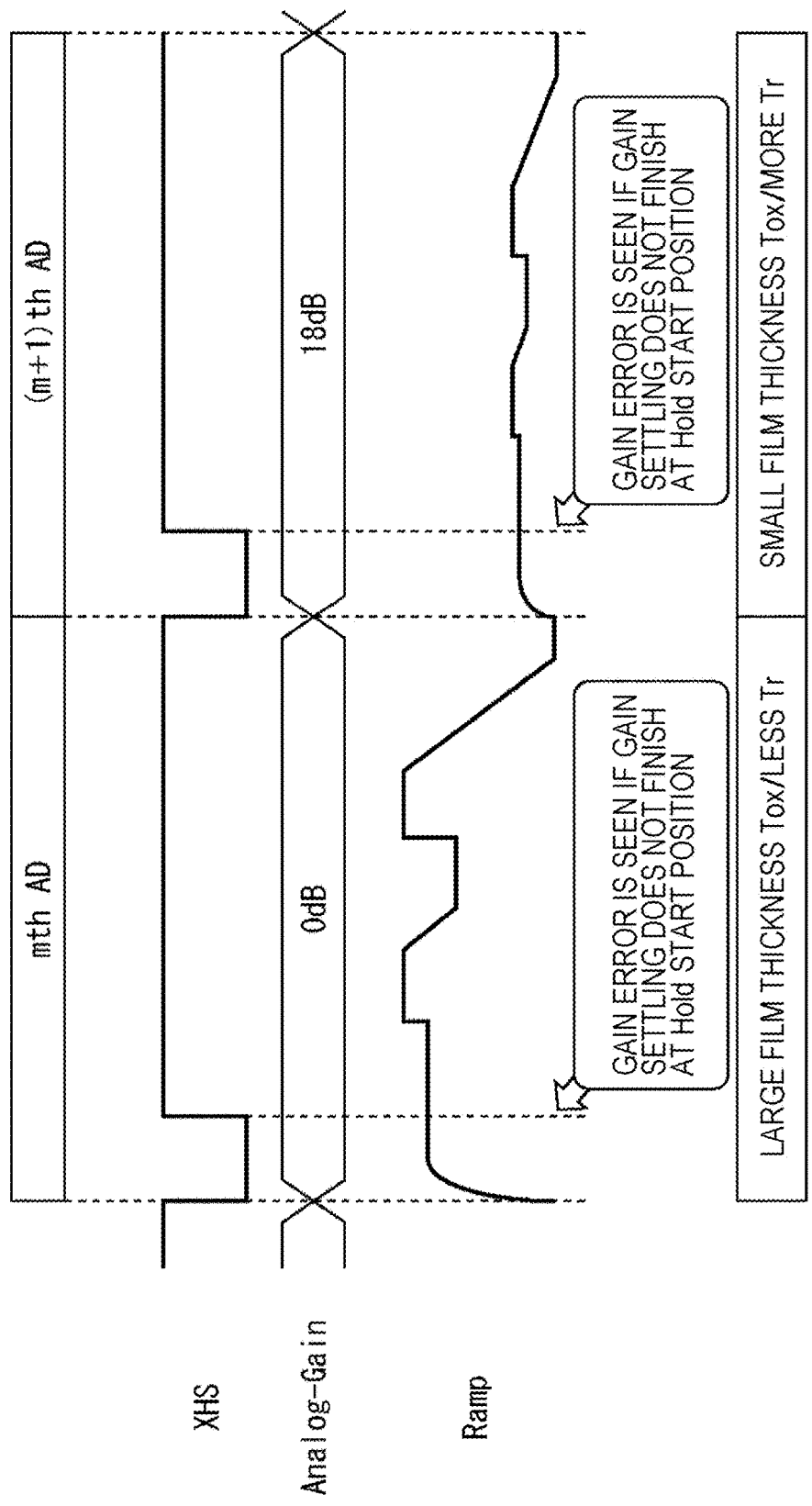
FIG. 27 is a diagram illustrating a third example of image shooting by the image sensor 2 having the comparators $61_n$.

FIG. 27 is a diagram for explaining a third example of image shooting by the image sensor 2 having comparators $61_n$ of FIG. 15.

As a HDR image shooting (generating) method in addition to the method described in FIG. 26, the pixel units $11_{m,n}$ in the image sensor 2 are divided into pixel units $11_{m,n}$ for performing long-time exposure (which will be also called long-cumulative pixel unit $11_{m,n}$) and pixel units $11_{m,n}$ for performing short-time exposure (which will be also called short-cumulative pixel unit $11_{m,n}$) and one-frame images are shot thereby to generate a one-frame HDR image from the one-frame images.

In this case, for example, a long-cumulative image is generated by use of one-frame pixel values of the long-cumulative pixel units $11_{m,n}$, a short-cumulative image is generated by use of one-frame pixel values of the short-cumulative pixel units $11_{m,n}$, and the long-cumulative image and the short-cumulative image are combined thereby to generate a HDR image.

In a case where one-frame images are shot by the long-cumulative pixel units $11_{m,n}$ and the short-cumulative pixel units $11_{m,n}$, analog gain of the image sensor 2 is dynamically changed when shooting the one-frame images.

That is, for example, in a case where the pixel units $11_{m,n}$ on the m-th line are the long-cumulative pixel units $11_{m,n}$ and the pixel units $11_{m+1,n}$ on the m+1-th line are the short-cumulative pixel units $11_{m+1,n}$, the analog gain of the image sensor 2 changes between AD conversion of (the VSL voltage as electric signal output by) the long-cumulative pixel units $11_{m,n}$ on the m-th line and AD conversion of the short-cumulative pixel units $11_{m+1,n}$ on the m+1-th line.

FIG. 27 illustrates exemplary relationships between analog gain (Analog-Gain) in AD conversion (mthAD) of the long-cumulative pixel units $11_{m,n}$ on the m-th line and AD conversion ((m+1)thAD) of the short-cumulative pixel units $11_{m+1,n}$ on the m+1-th line, and the reference signal (Ramp).

Additionally, FIG. 27 illustrates a horizontal synchronization signal (XHS) in addition to the analog gain (Analog-Gain) and the reference signal (Ramp).

In FIG. 27, the analog gain (Analog-Gain) during AD conversion (mthAD) of the long-cumulative pixel units $11_{m,n}$ is 0 dB. Further, the analog gain (Analog-Gain) during AD conversion ((m+1)thAD) of the short-cumulative pixel units $11_{m+1,n}$ is 18 dB.

Thus, the analog gain (Analog-Gain) during AD conversion (mthAD) of the long-cumulative pixel units $11_{m,n}$ is lower than the analog gain (Analog-Gain) during AD conversion ((m+1)thAD) of the short-cumulative pixel units $11_{m+1,n}$. Further, the analog gain (Analog-Gain) during AD conversion ((m+1)thAD) of the short-cumulative pixel units $11_{m+1,n}$ is higher than the analog gain (Analog-Gain) during AD conversion (mthAD) of the long-cumulative pixel units $11_{m,n}$.

A tilt of the slope of the reference signal (Ramp) is steep depending on the low analog gain during AD conversion (mthAD) of the long-cumulative pixel units $11_{m,n}$ with low analog gain. On the other hand, a tilt of the slope of the reference signal (Ramp) is gentle depending on the high analog gain during AD conversion ((m+1)thAD) of the short-cumulative pixel units $11_{m+1,n}$ with high analog gain.

That is, the change in the reference signal (Ramp) is large during AD conversion (mthAD) of the long-cumulative pixel units $11_{m,n}$, and the change in the reference signal (Ramp) is small during AD conversion ((m+1)thAD) of the short-cumulative pixel units $11_{m+1,n}$.

Therefore, it takes some time to stabilize the reference signal (Ramp) during AD conversion (mthAD) of the long-cumulative pixel units $11_{m,n}$, but it takes little time to stabilize the reference signal (Ramp) during AD conversion ((m+1)thAD) of the short-cumulative pixel units $11_{m+1,n}$.

On the other hand, the long-cumulative pixel units $11_{m,n}$ have a large signal component (Signal) and are not sensitive to noise, and the short-cumulative pixel units $11_{m+1,n}$ have a small signal component and are sensitive to noise (S/N easily deteriorates).

For the long-cumulative pixel units $11_{m,n}$ and the short-cumulative pixel units $11_{m+1,n}$ described above, the exposure time of the long-cumulative pixel units $11_{m,n}$ is long and the exposure time of the short-cumulative pixel units $11_{m+1,n}$ is short, and thus a large amount of light is received by the long-cumulative pixel units $11_{m,n}$ and a small amount of light is received by the short-cumulative pixel units $11_{+1,n}$.

Consequently, a small number of FETs with a large gate oxide film thickness Tox are selected as active transistors for the long-cumulative pixel units $11_{m,n}$, for example, depending on a large amount of light.

On the other hand, a large number of FETs with a small gate oxide film thickness Tox are selected as active transistors for the short-cumulative pixel units $11_{m+1,n}$, for example, depending on a small amount of light.

The active transistors are selected and operated as described above, AD conversion is performed on the long-cumulative pixel units $11_{m,n}$ and the short-cumulative pixel units $11_{m+1,n}$, thereby achieving both higher S/N and higher frame rate of HDR image.

That is, higher S/N can be achieved by reducing noises of the pixel values obtained from the short-cumulative pixel units $11_{m+1,n}$ sensitive to noise, and higher frame rate can be achieved by early stabilizing the reference signal (Ramp) which requires some time to stabilize during AD conversion (mthAD) of the long-cumulative pixel units $11_{m,n}$.

<Second Exemplary Configuration of Comparator $61_n$ in Image Sensor 2 to which Present Technology is Applied>

Figure 28:
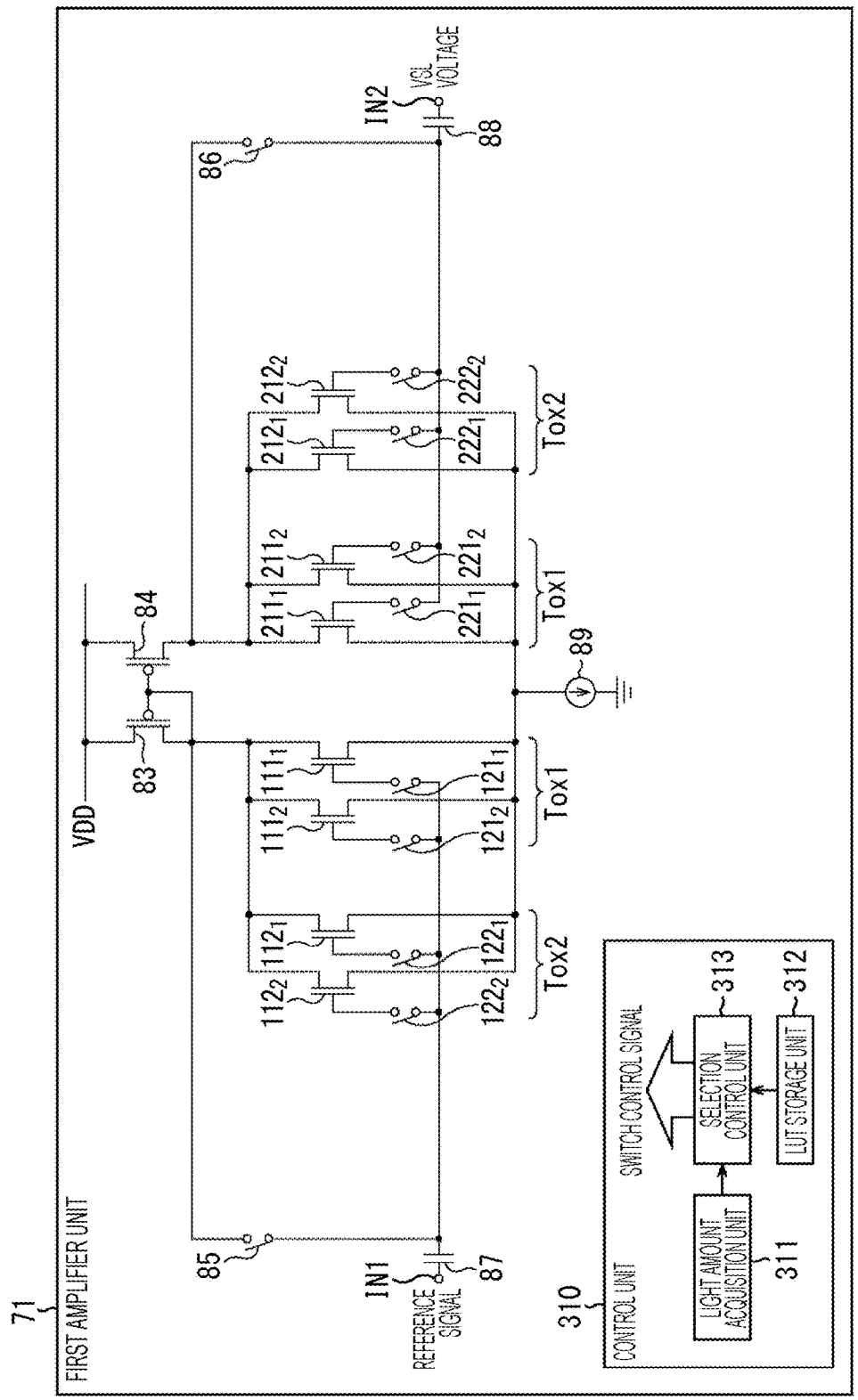
FIG. 28 is a diagram illustrating a second exemplary configuration of a comparator $61_n$ in the image sensor 2 to which the present technology is applied.

FIG. 28 is a diagram illustrating a second exemplary configuration of a comparator $61_n$ in the image sensor 2 to which the present technology is applied.

Additionally, the parts corresponding to those of FIG. 15 are denoted with the same reference numerals in FIG. 28, and the description thereof will be omitted below as needed.

The first amplifier unit 71 of FIG. 28 has the FETs 83 and 84, the switches 85 and 86, the capacitors 87 and 88, and the current source 89.

Further, the first amplifier unit 71 of FIG. 28 has the FETs $111_1$, $111_2$, $112_1$, and $112_2$ and the FETs $211_1$, $211_2$, $212_1$, and $212_2$ as the first transistors and the second transistors paired to configure differential pairs, respectively, and has the switches $121_1$, $121_2$, $122_1$, and $122_2$, the switches $221_1$, $221_2$, $222_1$, and $222_2$, and the control unit 310.

Thus, the first amplifier unit 71 of FIG. 28 is common with that of FIG. 15 in that the FET 83 and the current source 89 are provided.

Further, the first amplifier unit 71 of FIG. 28 is common with that of FIG. 15 in that the FETs $111_1$, $111_2$, $112_1$, and $112_2$ and the FETs $211_1$, $211_2$, $212_1$, and $212_2$ are provided as the first transistors and the second transistors paired to configure differential pairs, respectively, and the switches $121_1$, $121_2$, $122_1$, and $122_2$, the switches $221_1$, $221_2$, and $222_2$, and the control unit 310 are provided.

However, the first amplifier unit 71 of FIG. 28 is different from that of FIG. 15 in that the FETs $111_3$, $112_3$, $113_1$, $113_2$, and $113_3$ and the FETs $211_3$, $212_3$, $213_1$, $213_2$, and $213_3$ are not provided as the first transistors and the second transistors paired to configure differential pairs, respectively, and the switches $121_3$, $122_3$, $123_1$, $123_2$, and $123_3$ and the switches $221_3$, $222_3$, $223_1$, $223_2$, and 223 are not provided.

That is, the first amplifier unit 71 of FIG. 28 is different from that of FIG. 15 in that the FETs $111_i$, $112_i$, and $113_i$ (and the FETs $211_i$, $212_i$, and $213_i$) with three gate oxide film thicknesses Tox including the first film thickness Tox1, the second film thickness Tox2, and the third film thickness Tox3 are provided in FIG. 15, while the FETs $111_i$ and $112_i$ with two gate oxide film thicknesses Tox including the first film thickness Tox1 and the second film thickness Tox2 are provided in FIG. 28.

Further, the first amplifier unit 71 of FIG. 28 is different from that of FIG. 15 in that three FETs $111_1$ to $111_3$ (FETs $211_1$ to $211_3$) are provided as the first transistors (the second transistors) with the first film thickness Tox1 of the gate oxide film and three FETs $112_1$ to $112_3$ are provided as the first transistors with the second film thickness Tox2 of the gate oxide film in FIG. 15, while only two FETs $111_1$ and $111_2$ (FETs $211_1$ and $211_2$) are provided as the first transistors (the second transistors) with the first film thickness Tox1 of the gate oxide film and only two FETs $112_1$ and $112_2$ are provided as the first transistors with the second film thickness Tox2 of the gate oxide film in FIG. 28.

As described above, the first amplifier unit 71 of FIG. 28 is different from that of FIG. 15 in the number of gate oxide film thicknesses Tox of FETs as the first transistors and the number of FETs with each gate oxide film thickness Tox.

In FIG. 28, the control unit 310 selects an active transistor from among the FETs $111_1$, $111_2$, $112_1$, and $112_2$ (the FETs $211_1$, $211_2$, $212_1$, and $212_2$) as the first transistors (the second transistors) depending on the amount of light incident in the pixel array 10 and controls the active transistor to operate (turns on/off the switches $121_i$ and $122_i$ (the switches $221_i$ and $222_i$)) similarly as in FIG. 15.

The number of gate oxide film thicknesses Tox of FETs as the first transistors or the number of FETs with each gate oxide film thickness Tox is smaller in FIG. 28 than in FIG. 15, and thus the control of the variation SIGMAVth of the threshold voltage Vth in Equation (1), the time constant TAU in Equation (2), and the like, which is performed by selecting and operating an active transistor, is somewhat coarser than in FIG. 15 but both higher S/N and higher frame rate can be achieved similarly as in FIG. 15.

<Third Exemplary Configuration of Comparator $61_n$ in Image Sensor 2 to which Present Technology is Applied>

Figure 29:
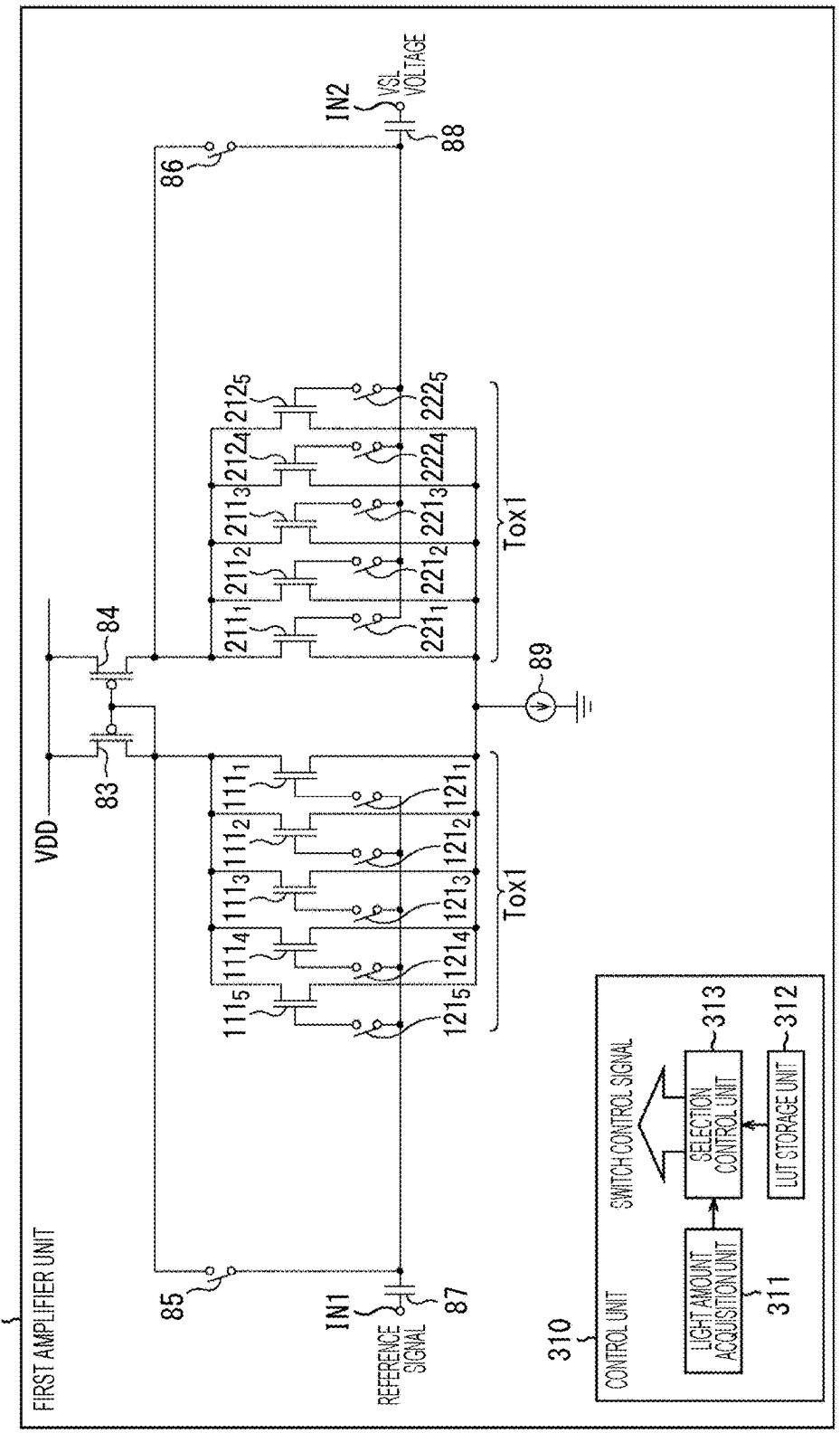
FIG. 29 is a diagram illustrating a third exemplary configuration of a comparator $61_n$ in the image sensor 2 to which the present technology is applied.

FIG. 29 is a diagram illustrating a third exemplary configuration of a comparator $61_n$ in the image sensor 2 to which the present technology is applied.

Additionally, the parts corresponding to those of FIG. 15 are denoted with the same reference numerals in FIG. 29, and the description thereof will be omitted below as needed.

The first amplifier unit 71 of FIG. 29 has the FETs 83 and 84, the switches 85 and 86, the capacitors 87 and 88, and the current source 89.

Further, the first amplifier unit 71 of FIG. 29 has the FETs $111_1$, $111_2$, $111_3$, $111_4$, and $111_5$ and the FETs $211_1$, $211_2$, $211_3$, $211_4$, and $211_5$ as the first transistors and the second transistors paired to configure differential pairs, respectively, and has the switches $121_1$, $121_2$, $121_3$, $121_4$, and $121_5$, the switches $221_1$, $221_2$, $221_3$, $221_4$, and $221_5$, and the control unit 310.

Therefore, the first amplifier unit 71 of FIG. 29 is common with that of FIG. 15 in that the FET 83 to the current source 89 are provided.

However, the first amplifier unit 71 of FIG. 29 is different from that of FIG. 15 in that the FETs $111_1$ to $111_5$ and the FETs $211_1$ to $211_5$ are provided as the first transistors and the second transistors paired to configure differential pairs, respectively, instead of the FETs $111_1$ to $111_3$, $112_1$ to $112_3$, and $113_1$ to $113_3$ and the FETs $211_1$ to $211_3$, $212_1$ to $212_3$, and $213_1$ to $213_3$.

Further, the first amplifier unit 71 of FIG. 29 is different from that of FIG. 15 in that the switches $121_1$ to $121_5$ and the switches $221_1$ to $221_5$ are provided in association with the FETs $111_1$ to $111_5$ and the FETs $211_1$ to $211_5$ as described above instead of the switches $121_1$ to $121_3$, $122_1$ to $122_3$, and $123_1$ to $123_3$ and the switches $221_1$ to $221_3$, $222_1$ to $222_3$, and $223_1$ to $223_3$.

The gate oxide film thicknesses Tox of the FETs $111_1$ to $111_5$ (the FETs $211_1$ to $211_5$) are the same as the first film thickness Tox1, for example.

In FIG. 29, the control unit 310 selects an active transistor from among the FETs $111_1$ to $111_5$ (the FETs $211_1$ to $211_5$) as the first transistors (the second transistors) depending on the amount of light incident in the pixel array 10, and controls the active transistor to operate (turns on/off the switch $121_i$ (the switch $221_i$)) similarly as in FIG. 15.

Only one gate oxide film thickness Tox of the FETs as the first transistors is employed in FIG. 29, and thus the variation SIGMAVth of the threshold voltage Vth in Equation (1), the time constant TAU in Equation (2), and the like do not change due to FETs with different gate oxide film thicknesses Tox selected as active transistors unlike FIG. 15.

However, in FIG. 29, an active transistor is selected from among the FETs $111_1$ to $111_5$ with the first film thickness Tox1 of the gate oxide film as the first transistors, and thus the substantial area WL of the first transistor (and the gate oxide film capacitance Cox) changes, thereby adaptively controlling the variation SIGMAVth of the threshold voltage Vth in Equation (1), the time constant TAU in Equation (2), and the like.

That is, as the amount of light is larger, a smaller number of FETs are selected as active transistors, and thus as the amount of light is smaller, the variation SIGMAVth of the threshold voltage Vth in Equation (1) can be controlled to be smaller, and as the amount of light is larger, the time constant TAU in Equation (2) can be controlled to be lower. Therefore, both higher S/N and higher frame rate can be achieved similarly as in FIG. 15.

<Fourth Exemplary Configuration of Comparator $61_n$ in Image Sensor 2 to which Present Technology is Applied>

Figure 30:
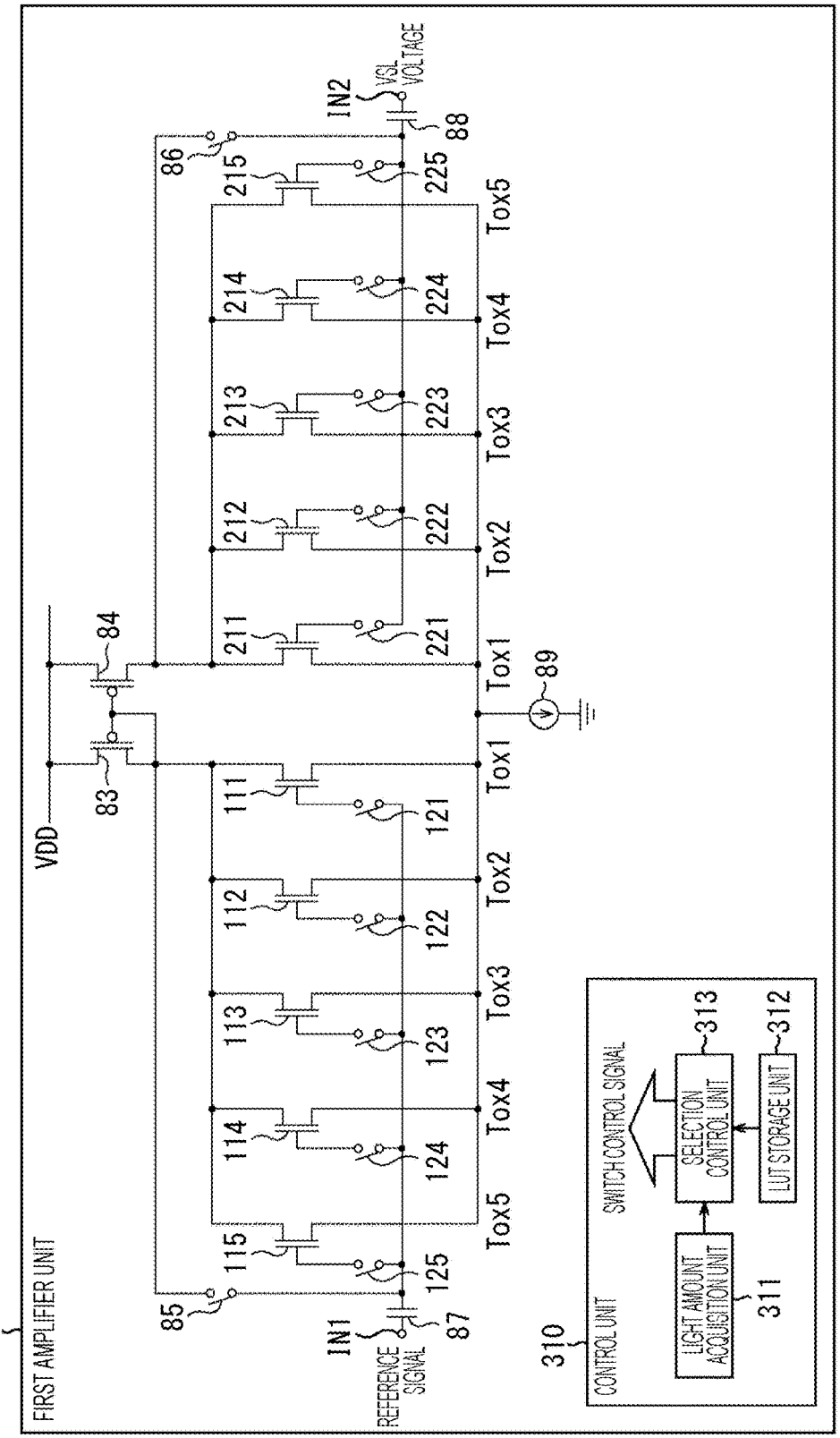
FIG. 30 is a diagram illustrating a fourth exemplary configuration of a comparator $61_n$ in the image sensor 2 to which the present technology is applied.

FIG. 30 is a diagram illustrating a fourth exemplary configuration of a comparator $61_n$ in the image sensor 2 to which the present technology is applied.

Additionally, the parts corresponding to those of FIG. 15 are denoted with the same reference numerals in FIG. 30, and the description thereof will be omitted below as needed.

The first amplifier unit 71 of FIG. 30 has the FETs 83 and 84, the switches 85 and 86, the capacitors 87 and 88, and the current source 89.

Further, the first amplifier unit 71 of FIG. 30 has a plurality of FETs 111, 112, 113, 114, and 115 and a plurality of FETs 211, 212, 213, 214, and 215 as the first transistors and the second transistors paired to configure differential pairs, respectively, and has a plurality of switches 121, 122, 123, 124, and 125, a plurality of switches 221, 222, 223, 224, and 225, and the control unit 310.

Thus, the first amplifier unit 71 of FIG. 30 is common with that of FIG. 15 in that the FET 83 to the current source 89 are provided.

However, the first amplifier unit 71 of FIG. 30 is different from that of FIG. 15 in that the FETs 111 to 115 and the FETs 211 to 215 are provided as the first transistors and the second transistors paired to configure differential pairs, respectively, instead of the FETs $111_1$ to $111_3$, $112_1$ to $112_3$, and $113_1$ to $113_3$ and the FETs $211_1$ to $211_3$, $212_1$ to $212_3$, and $213_1$ to $213_3$.

Further, the first amplifier unit 71 of FIG. 30 is different from that of FIG. 15 in that the switches 121 to 125 and the switches 221 to 225 are provided in association with the FETs 111 to 115 and the FETs 211 to 215 as described above instead of the switches $121_1$ to $121_3$, $122_1$ to $122_3$, and $123_1$ to $123_3$ and the switches $221_1$ to $221_3$, $222_1$ to $222_3$, and $223_1$ to $223_3$.

The gate oxide film thicknesses Tox of the FETs 111 to 115 (the FETs 211 to 215) are mutually different.

That is, the gate oxide film thickness Tox of the FET 111 is the first film thickness Tox1, the gate oxide film thickness Tox of the FET 112 is the second film thickness Tox2, the gate oxide film thickness Tox of the FET 113 is the third film thickness Tox3, the gate oxide film thickness Tox of the FET 114 is a fourth film thickness Tox4 (>Tox3), and the gate oxide film thickness Tox of the FET 115 is a fifth film thickness Tox5 (>Tox4).

In FIG. 30, the control unit 310 selects an active transistor from among the FETs 111 to 115 (the FETs 211 to 215) as the first transistors (the second transistors) depending on the amount of light incident in the pixel array 10, and controls the active transistor to operate (turns on/off the switches 121 to 125 (the switches 221 to 225)) similarly as in FIG. 15.

In FIG. 30, the FETs 111 to 115 with the first film thickness Tox1 to the fifth film thickness Tox5 of the gate oxide film, respectively, are provided as the first transistors, and an active transistor is selected from among the FETs 111 to 115. Thereby, the gate oxide film capacitance Cox of the first transistors changes, and the substantial area WL changes as needed, and the variation SIGMAVth of the threshold voltage Vth in Equation (1), the time constant TAU in Equation (2), and the like are adaptively controlled.

That is, in FIG. 30, an active transistor is selected from among the FETs 111 to 115 with the first film thickness Tox1 to the fifth film thickness Tox5 of the gate oxide film, respectively, such that as the mount of light is smaller, the area WL is larger (and the gate oxide film thickness Tox is smaller) and the variation SIGMAVth of the threshold voltage Vth is smaller, and as the amount of light is larger, the gate oxide film capacitance Cox is smaller and the time constant TAU is lower. Thereby, both higher S/N and higher frame rate can be achieved similarly as in FIG. 15.

Additionally, the transistors as the first transistors and the second transistors paired to configure differential pairs can include FETs with different gate oxide film capacitance Cox due to different gate oxide film thicknesses Tox, and can include FETs with different gate oxide film capacitance Cox due to different area WL (at least one of the channel width W and the channel length L). Further, the transistors as the first transistors and the second transistors can employ a plurality of FETs with the same gate oxide film thickness Tox and the same area WL.

Further, column parallel AD for performing AD conversion on the pixel units $11_{m,n}$ in one row in parallel (at the same time) is performed according to the present embodiment, but the present technology can be applied also when area AD is performed, for example, in addition to column parallel AD.

That is, the present technology can be applied to an image sensor in which the pixel array 10 is divided into rectangular areas, an ADC is provided for each area, and the ADC is in charge of AD conversion of the pixel units $11_{m,n}$ in its area, and the like, for example.

<Exemplary Use of Image Sensor>

Figure 31:
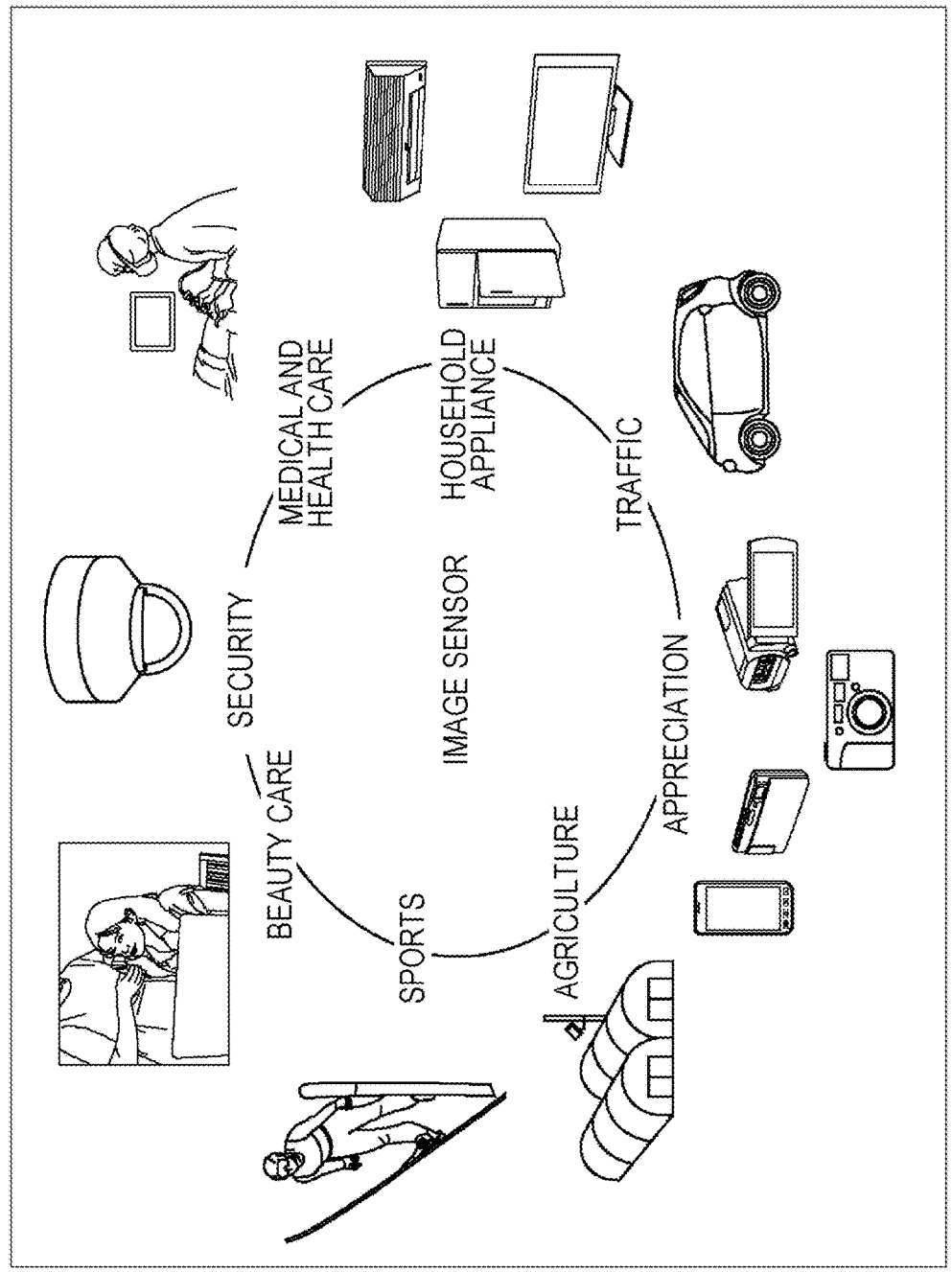
FIG. 31 is a diagram illustrating exemplary use of the image sensor 2.

FIG. 31 is a diagram illustrating exemplary use of the image sensor 2.

The image sensor 2 (and the camera unit of FIG. 1 having the image sensor 2) can be used in various cases for sensing visible ray, infrared ray, ultraviolet ray, X ray, and the like as described below.

Devices for shooting images to be appreciated, such as digital camera and cell phone with camera function Traffic devices such as vehicle-mounted sensor for shooting in front of, behind, around, and inside an automobile for safe driving such as automatic stop, recognition of driver's state, and the like, monitoring camera for monitoring travelling vehicles or roads, and distance measurement sensor for measuring inter-vehicle distance Devices for household appliances such as TV, refrigerator, and air conditioner for shooting user's gesture and operating device according to the gesture Medical or healthcare devices such as endoscope, electronic microscope, and device for performing angiography by received infrared ray Security devices such as monitoring camera for security and ID authentication camera Beauty care devices such as skin measurement device for shooting the skin and microscope for shooting the skin of scalp Sports devices such as action camera and wearable camera for sports Agricultural devices such as camera for monitoring field and crop <Description of Computer to which Present Technology is Applied>

Then, a series of processings by the control unit 310 can be performed in hardware or in software. In a case where the processings are performed in software, a program configuring the software is installed in a microcomputer or the like.

Figure 32:
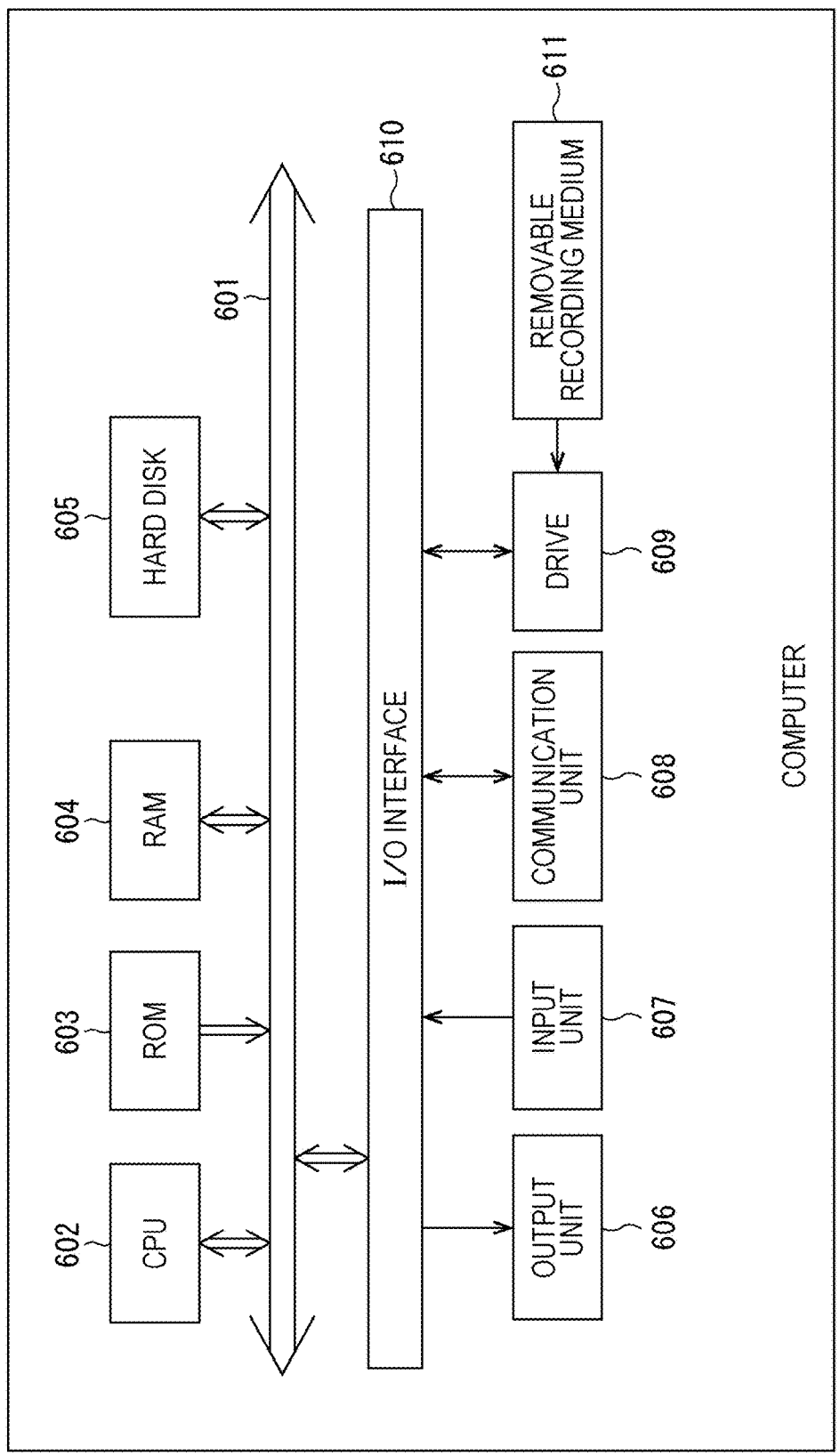
FIG. 32 is a block diagram illustrating an exemplary configuration of one embodiment of a computer to which the present technology is applied.

FIG. 32 is a block diagram illustrating an exemplary configuration of one embodiment of a computer into which the program for performing the processings is installed.

The program can be previously recorded in a hard disk 605 or a ROM 603 as recording medium incorporated in the computer.

Alternatively, the program can be stored (recorded) in are movable recording medium 611. There movable recording medium 611 can be provided as package software. Here, the removable recording medium 611 may be flexible disc, compact disc read only memory (CD-ROM), magneto optical (MO) disc, digital versatile disc (DVD), magnetic disc, semiconductor memory, and the like, for example.

Additionally, the program can be installed from the removable recording medium 611 described above into the computer, and can be downloaded in the computer and installed in the incorporated hard disk 605 via a communication network or broadcast network. That is, the program can be wirelessly transferred from a download site to the computer via a satellite for digital satellite broadcast, or can be transferred to the computer via a network such as local area network (LAN) or the Internet in a wired manner.

The computer incorporates a central processing unit (CPU) 602, and the CPU 602 is connected with an Input/output interface 610 via a bus 601.

When a user operates an input unit 607 to input an instruction via the Input/output interface 610, the CPU 602 executes the program stored in the read only memory (ROM) 603 in response to the instruction. Alternatively, the CPU 602 loads and executes the program stored in the hard disk 605 into a random access memory (RAM) 604.

Thereby, the CPU 602 performs the processings in the flowchart or the processings in the configuration of the block diagram. The CPU 602 then outputs the processing result from an output unit 606 via the Input/output interface 610 as needed, for example, or transmits it from a communication unit 608 to be recorded in the hard disk 605.

Additionally, the input unit 607 is configured of a keyboard, mouse, microphone, or the like. Further, the output unit 606 is configured of a liquid crystal display (LCD), speaker, or the like.

Here, in the specification, the processings performed by the computer according to the program do not necessarily need to be performed in time series in the order described in the flowchart. That is, the processings performed by the computer according to the program include the processings performed in parallel or independently (such as parallel processings and object-based processings).

Further, the program can be processed by one computer (processor) or may be distributed and processed in a plurality of computers. Further, the program can be transferred to and executed in a distant computer.

Additionally, embodiments of the present technology are not limited to the above embodiments, and can be variously changed without departing from the scope of the present technology.

Further, the effects described in the specification are merely exemplary and are not restrictive, and other effects may be obtained.

Additionally, the present technology can employ the following configurations.

<1>

An image sensor including:

an AD converter having a comparator in which differential pairs having a plurality of transistors as first transistors and second transistors paired to configure the differential pairs are provided at an input stage, for performing analog to digital (AD) conversion on an electric signal by comparing a level-changing reference signal with the electric signal output by a shooting unit for performing photoelectric conversion and outputting the electric signal; and a control unit for performing control such that a transistor to be operated is selected as active transistor from among the transistors depending on the amount of light incident in the shooting unit, and the active transistor is operated.

<2>

The image sensor according to <1>, in which the control unit selects the active transistor such that as the amount of light is smaller, a variation of a threshold voltage of the first and second transistors is smaller, and as the amount of light is larger, a time constant of the first and second transistors is lower.

<3>

The image sensor according to <1> or <2>, in which the control unit selects a smaller number of transistors as the active transistors as the amount of light is larger.

<4>

The image sensor according to any of <1> to <3>, in which the transistors include transistors with different gate oxide film thicknesses.

<5>

The image sensor according to <4>, in which the control unit selects, as the active transistor, a transistor with a larger oxide film thickness as the amount of light is larger.

<6>

The image sensor according to <4> or <5>, in which the transistors include two or more transistors with a predetermined oxide film thickness.

<7>

An electronic device including:

an optical system for focusing light; and an image sensor for receiving a light and shooting an image, in which the image sensor includes:

an AD converter having a comparator in which differential pairs having a plurality of transistors as first transistors and second transistors paired to configure the differential pairs are provided at an input stage, for performing analog to digital (AD) conversion on an electric signal by comparing a level-changing reference signal with the electric signal output by a shooting unit for performing photoelectric conversion and outputting the electric signal; and a control unit for performing control such that a transistor to be operated is selected as active transistor from among the transistors depending on the amount of light incident in the shooting unit, and the active transistor is operated.

<8>

A control device for performing control such that a transistor to be operated is selected as active transistor from among the transistors depending on the amount of light incident in a shooting unit and the active transistor is operated, for an image sensor including an AD converter having a comparator in which differential pairs having a plurality of transistors as first transistors and second transistors paired to configure the differential pairs are provided at an input stage, for performing analog to digital (AD) conversion on an electric signal by comparing a level-changing reference signal with the electric signal output by the shooting unit for performing photoelectric conversion and outputting the electric signal.

<9>

A control method including performing control such that a transistor to be operated is selected as active transistor from among the transistors depending on the amount of light incident in a shooting unit and the active transistor is operated, for an image sensor including an AD converter having a comparator in which differential pairs having a plurality of transistors as first transistors and second transistors paired to configure the differential pairs are provided at an input stage, for performing analog to digital (AD) conversion on an electric signal by comparing a level-changing reference signal with the electric signal output by the shooting unit for performing photoelectric conversion and outputting the electric signal.

<10>

A program for causing a computer to function as a control device for performing control such that a transistor to be operated is selected as active transistor from among the transistors depending on the amount of light incident in a shooting unit and the active transistor is operated, for an image sensor including an AD converter having a comparator in which differential pairs having a plurality of transistors as first transistors and second transistors paired to configure the differential pairs are provided at an input stage, for performing analog to digital (AD) conversion on an electric signal by comparing a level-changing reference signal with the electric signal output by the shooting unit for performing photoelectric conversion and outputting the electric signal.

REFERENCE SIGNS LIST

1: Optical system
2: Image sensor
3: Memory
4: Signal processing unit
5: Output unit
6: Control unit
10: Pixel array
$11_{1,1}$ to $11_{M,N}$: Pixel unit
20: Control unit
21: Pixel drive unit
22: Column parallel AD converter
$31_1$ to $31_N$: ADC
32: Auto-zero control unit
32A: Auto-zero signal line
33: Reference signal output unit
33A: Reference signal line
34: Clock output unit
34A: Clock signal line
$41_1$ to $41_M$: Pixel control line
$42_1$ to $42_N$: VSL $43_1$ to $43_N$: Current source
51: PD
52: Transfer Tr
53: FD
54: Reset Tr
55: Amplification Tr
56: Selection Tr
$61_1$ to $61_N$: Comparator
$62_1$ to $62_N$: Counter
71: First amplifier unit
72: Second amplifier unit
81 to 84: FET
85, 86: Switch
87, 88: Capacitor
89: Current source
91, 92: FET
93: Capacitor
111, $111_1$ to $111_5$, 112, $112_1$ to $112_3$, 113, $113_1$ to $113_3$, 114, 115: FET
221, $221_1$ to $221_5$, 222, $222_1$ to $222_3$, 223, $223_1$ to $223_3$, 224, 225: Switch
310: Control unit
311: Light amount acquisition unit
312: LUT storage unit
313: Selection control unit
411 to 413: FET
431 to 433: Area
601: Bus
602: CPU
603: ROM
604: RAM
605: Hard disk
606: Output unit
607: Input unit
608: Communication unit
609: Drive
610: Input/output interface
611: Removable recording medium

The invention claimed is:

1. An imaging device comprising:
    a pixel array including a pixel;
    a signal line coupled to the pixel;
    a reference signal generator; and
    a comparator for coupling to the signal line and the reference
    signal generator, including:
        a first transistor, a gate of the first transistor coupled to the signal line via first switch circuitry;
        a second transistor, a gate of the second transistor coupled to the signal line via the first switch circuitry;
    a third transistor, a gate of the third transistor coupled to the reference signal generator via second switch circuitry; and
    a fourth transistor, a gate of the fourth transistor coupled to the reference signal generator via the second switch circuitry and wherein a first thickness of a gate oxide film of the first transistor is different from a second thickness of a gate oxide film of the second transistor,
wherein the first transistor is formed in a first area of a P well, and wherein the second transistor is formed in a second area of the P well.

2. The imaging device according to claim 1, wherein the first switch circuitry comprises a first switch circuit configured to couple the signal line to the first transistor.

3. The imaging device according to claim 2, wherein the first switch circuitry comprises a second switch circuit configured to couple the signal line to the second transistor.

4. The imaging device according to claim 1, wherein the second switch circuitry comprises a first switch circuit configured to couple the reference signal generator to the third transistor.

5. The imaging device according to claim 4, wherein the second switch circuitry comprises a second switch circuit configured to couple the reference signal generator to the fourth transistor.

6. The imaging device according to claim 1, wherein the first switch circuitry is configured to switch based on an amount of incident light.

7. The imaging device according to claim 1, wherein the second switch circuitry is configured to switch based on an amount of incident light.

8. The imaging device according to claim 1, wherein a third thickness of a gate oxide film of the third transistor is different from a fourth thickness of a gate oxide film of the fourth transistor.

9. The imaging device according to claim 8, further comprising a fifth transistor, a gate of the fifth transistor coupled to the signal line via the first switch circuitry.

10. The imaging device according to claim 9, wherein the fifth transistor is formed in a third area of the P well.

11. The imaging device according to claim 9, wherein the first switch circuitry comprises a first switch circuit configured to couple the signal line to the first transistor, a second switch circuit configured to couple the signal line to the second transistor, and a third switch circuit configured to couple the signal line to the fifth transistor.

12. The imaging device according to claim 11, wherein a fifth thickness of a gate oxide film of the fifth transistor is different from the first thickness of the gate oxide film of the first transistor and the second thickness of the gate oxide film of the second transistor.

13. The imaging device according to claim 12, wherein the first circuit further comprises a sixth transistor, a gate of the sixth transistor coupled to the reference signal generator via the second switch circuitry.

14. The imaging device according to claim 13, wherein the second switch circuitry comprises a fourth switch circuit configured to couple the reference signal generator to the third transistor, a fifth switch circuit configured to couple the reference signal generator to the fourth transistor, and a sixth switch circuit configured to couple the reference signal generator to the sixth transistor.

15. The imaging device according to claim 14, wherein a sixth thickness of a gate oxide film of the sixth transistor is different from the third thickness of the gate oxide film of the third transistor and the fourth thickness of the gate oxide film of the fourth transistor.

16. The imaging device according to claim 1, further comprising a seventh transistor, wherein a gate of the seventh transistor is coupled to the signal line via the first switch circuitry, and wherein a seventh thickness of a gate oxide film of the seventh transistor is the same as the first thickness of the gate oxide film of the first transistor or the second thickness of the gate oxide film of the second transistor.

17. The imaging device according to claim 16, wherein the seventh transistor is formed in the first area of the P well.

18. The imaging device according to claim 16, wherein a source of the first transistor is shared by a source of the seventh transistor.

19. The imaging device according to claim 8, further comprising an eighth transistor, wherein a gate of the eighth transistor is coupled to the reference signal generator via the second switch circuitry, and wherein an eighth thickness of a gate oxide film of the eighth transistor is the same as the third thickness of the gate oxide film of the third transistor or the fourth thickness of the gate oxide film of the fourth transistor.

20. The imaging device according to claim 1, further comprising a control unit configured to select at least one transistor coupled to the signal line and at least one transistor coupled to the reference signal generator as active transistors based on an amount of incident light.

21. The imaging device according to claim 20, wherein a number of transistors selected as active transistors by the control unit decreases as the amount of incident light increases.

22. An electronic device, comprising the imaging device according to claim 1.

23. An imaging device comprising:
a pixel array including a pixel;
a signal line coupled to the pixel;
a reference signal generator; and
a comparator for coupling to the signal line and the reference signal generator, including:
a first transistor, a gate of the first transistor coupled to the signal line via first switch circuitry;
a second transistor, a gate of the second transistor coupled to the signal line via the first switch circuitry;
a third transistor, a gate of the third transistor coupled to the reference signal generator via second switch circuitry;
a fourth transistor, a gate of the fourth transistor coupled to the reference signal generator via the second switch circuitry; and
a fifth transistor, a gate of the fifth transistor coupled to the signal line via the first switch circuitry, wherein the first transistor is formed in a first area of a P well, and wherein the second transistor is formed in a second area of the P well.

24. The imaging device according to claim 23, wherein the first switch circuitry comprises a first switch circuit configured to couple the signal line to the first transistor.

25. The imaging device according to claim 24, wherein the first switch circuitry comprises a second switch circuit configured to couple the signal line to the second transistor.

26. The imaging device according to claim 23, wherein the second switch circuitry comprises a first switch circuit configured to couple the reference signal generator to the third transistor.

27. The imaging device according to claim 26, wherein the second switch circuitry comprises a second switch circuit configured to couple the reference signal generator to the fourth transistor.

28. The imaging device according to claim 23, wherein the first switch circuitry is configured to switch based on an amount of incident light.

29. The imaging device according to claim 23, wherein the second switch circuitry is configured to switch based on an amount of incident light.

30. The imaging device according to claim 23, wherein a first thickness of a gate oxide film of the first transistor is different from a second thickness of a gate oxide film of the second transistor.

31. The imaging device according to claim 30, wherein a third thickness of a gate oxide film of the third transistor is different from a fourth thickness of a gate oxide film of the fourth transistor.

32. The imaging device according to claim 23, wherein the first switch circuitry comprises a first switch circuit configured to couple the signal line to the first transistor, a second switch circuit configured to couple the signal line to the second transistor, and a third switch circuit configured to couple the signal line to the fifth transistor.

33. The imaging device according to claim 32, wherein a fifth thickness of a gate oxide film of the fifth transistor is different from the first thickness of the gate oxide film of the first transistor and the second thickness of the gate oxide film of the second transistor.

34. The imaging device according to claim 33, further comprising a sixth transistor, a gate of the sixth transistor coupled to the reference signal generator via the second switch circuitry.

35. The imaging device according to claim 34, wherein the second switch circuitry comprises a fourth switch circuit configured to couple the reference signal generator to the third transistor, a fifth switch circuit configured to couple the reference signal generator to the fourth transistor, and a sixth switch circuit configured to couple the reference signal generator to the sixth transistor.

36. The imaging device according to claim 35, wherein a sixth thickness of a gate oxide film of the sixth transistor is different from the third thickness of the gate oxide film of the third transistor and the fourth thickness of the gate oxide film of the fourth transistor.

37. The imaging device according to claim 30, further comprising a seventh transistor, wherein a gate of the seventh transistor is coupled to the signal line via the first switch circuitry, and wherein a seventh thickness of a gate oxide film of the seventh transistor is the same as the first thickness of the gate oxide film of the first transistor or the second thickness of the gate oxide film of the second transistor.

38. The imaging device according to claim 31, further comprising an eighth transistor, wherein a gate of the eighth transistor is coupled to the reference signal generator via the second switch circuitry, and wherein an eighth thickness of a gate oxide film of the eighth transistor is the same as the third thickness of the gate oxide film of the third transistor or the fourth thickness of the gate oxide film of the fourth transistor.

39. The imaging device according to claim 23, further comprising a control unit configured to select at least one transistor coupled to the signal line and at least one transistor coupled to the reference signal generator as active transistors based on an amount of incident light.

40. The imaging device according to claim 39, wherein a number of transistors selected as active transistors by the control unit decreases as the amount of incident light increases.

41. An electronic device, comprising the imaging device according to claim 23.

* * * * *